US010734374B2

(12) United States Patent
Okagaki et al.

(10) Patent No.: US 10,734,374 B2
(45) Date of Patent: Aug. 4, 2020

(54) SEMICONDUCTOR DEVICE

(71) Applicant: Renesas Electronics Corporation, Tokyo (JP)

(72) Inventors: Takeshi Okagaki, Tokyo (JP); Koji Shibutani, Tokyo (JP); Makoto Yabuuchi, Tokyo (JP); Nobuhiro Tsuda, Tokyo (JP)

(73) Assignee: Renesas Electronics Corporation, Koutou-ku, Tokyo (JP)

( * ) Notice: Subject to any disclaimer, the term of this patent is extended or adjusted under 35 U.S.C. 154(b) by 0 days.

(21) Appl. No.: 16/544,101

(22) Filed: Aug. 19, 2019

(65) Prior Publication Data

US 2019/0378831 A1 Dec. 12, 2019

Related U.S. Application Data

(63) Continuation of application No. 16/055,728, filed on Aug. 6, 2018, now Pat. No. 10,490,545, which is a (Continued)

(30) Foreign Application Priority Data

Aug. 18, 2014 (JP) .................................. 2014-166157
Mar. 30, 2015 (JP) .................................. 2015-067882

(51) Int. Cl.
*H01L 27/02* (2006.01)
*H01L 27/092* (2006.01)
(Continued)

(52) U.S. Cl.
CPC ........ *H01L 27/0207* (2013.01); *G06F 30/394* (2020.01); *H01L 27/0924* (2013.01); *H01L 29/41791* (2013.01)

(58) Field of Classification Search
CPC ............... G06F 30/394; H01L 27/0207; H01L 27/0924; H01L 29/41791
See application file for complete search history.

(56) References Cited

U.S. PATENT DOCUMENTS 6,785,877 B1 8/2004 Kozai
2007/0045736 A1 3/2007 Yagishita
(Continued)

FOREIGN PATENT DOCUMENTS

CN 1290964 A 4/2001
EP 1065721 A2 1/2001
(Continued)

OTHER PUBLICATIONS

Communication dated Nov. 11, 2019, From the European patent Office in application No. 15180978.7.
(Continued)

*Primary Examiner* — Matthew C Landau
*Assistant Examiner* — Dmitriy Yemelyanov
(74) *Attorney, Agent, or Firm* — Sughrue Mion, PLLC

(57) ABSTRACT

An area of a semiconductor device having a FINFET can be reduced. The drain regions of an n-channel FINFET and a p-channel FINFET are extracted by two second local interconnects from a second Y gird between a gate electrode and a dummy gate adjacent thereto, to a third Y grid adjacent to the second Y gird. These second local interconnects are connected by a first local interconnect extending in the X direction in the third Y grid. According to such a cell layout, although the number of grids is increased by one because of the arrangement of the first local interconnect, the length in the X direction can be reduced. As a result, the cell area of the unit cell can be reduced while a space between the first and second local interconnects is secured.

15 Claims, 55 Drawing Sheets

Related U.S. Application Data continuation of application No. 15/719,830, filed on Sep. 29, 2017, now Pat. No. 10,068,891, which is a continuation of application No. 14/826,730, filed on Aug. 14, 2015, now Pat. No. 9,812,435.

(51) Int. Cl.
*G06F 30/394* (2020.01)
*H01L 29/417* (2006.01)

(56) References Cited

U.S. PATENT DOCUMENTS

| | | |
|---|---|---|
| 2009/0134472 A1 | 5/2009 | Inaba |
| 2010/0037191 A1 | 2/2010 | Kosuge |
| 2010/0044755 A1 | 2/2010 | Tsuda et al. |
| 2013/0026572 A1 | 1/2013 | Kawa et al. |
| 2013/0207193 A1 | 8/2013 | Haneda et al. |
| 2013/0207199 A1 | 8/2013 | Becker et al. |
| 2013/0292777 A1 | 11/2013 | Liaw |
| 2013/0334613 A1 | 12/2013 | Moroz |
| 2014/0054722 A1 | 2/2014 | Kawa et al. |
| 2014/0153322 A1 | 6/2014 | Liaw |
| 2014/0367741 A1* | 12/2014 | Yang .................. H01L 27/0207 257/190 |
| 2015/0137262 A1* | 5/2015 | Baek .................. H01L 27/0207 257/401 |

FOREIGN PATENT DOCUMENTS

| | | |
|---|---|---|
| JP | 2001-15602 A | 1/2001 |
| WO | 2006100795 A1 | 9/2006 |
| WO | 2013106799 A1 | 7/2013 |

OTHER PUBLICATIONS

Communication dated Sep. 24, 2019, from the Japanese Patent Office in application No. 2018-228101.
Communication dated Mar. 10, 2020, from the State Intellectual Property Office of the P.R.C. in application No. 201510505825.3.

\* cited by examiner

SEMICONDUCTOR DEVICE

CROSS-REFERENCE TO RELATED APPLICATION

This application is a Continuation of U.S. application Ser. No. 16/055,728, filed Aug. 6, 2018, which is a Continuation of U.S. application Ser. No. 15/719,830, filed Sep. 29, 2017, now U.S. Pat. No. 10,068,891, which is a Continuation of U.S. application Ser. No. 14/826,730, filed Aug. 14, 2015, now U.S. Pat. No. 9,812,435, which claims priority from Japanese Patent Applications No. 2014-166157 filed on Aug. 18, 2014, and No. 2015-067882 filed on Mar. 30, 2015, the contents of which are hereby incorporated by reference into this application.

TECHNICAL FIELD OF THE INVENTION

The present invention relates to a semiconductor device. More particularly, the present invention relates to a technique effectively applied to a semiconductor device having an FINFET.

BACKGROUND

In an LSI (Large Scale Integration) using silicon in recent years, a dimension, particularly a gate length of a gate electrode of a MISFET (Metal Insulator Semiconductor Field Effect Transistor) which is a component of the LSI has been steadily reduced. While this reduction in the dimension of the MISFET has been advanced along the scaling rule, various problems have appeared as a generation of a device has been advanced, and it is difficult to achieve both of suppression of a short channel effect of the MISFET and securement of a high current drive power. Therefore, research and development of devices with a new structure that replaces the conventional planar-type MISFET have actively advanced.

A FINFET is one of the above-described devices with a new structure, and is a MISFET with a three-dimensional structure different from the planar-type MISFET.

For example, U.S. Patent No. 2014/0054722 (Patent Document 1) described below discloses a planar layout of a circuit element configured by using the FINFET.

SUMMARY

The inventors have engaged in research and development of a semiconductor device having the FINEFT, and have studied strongly on an improvement in the characteristics of the semiconductor device. During the course of the studies, the inventors have found that the semiconductor device having the FINEFT has a margin for the further improvement.

The other object and novel characteristics of the present invention will be apparent from the description of the present specification and the accompanying drawings.

The typical ones of the inventions disclosed in the present application will be briefly described as follows.

A semiconductor device according to one embodiment disclosed in the present application includes: a rectangular parallelepiped first fin extending in a first direction; a rectangular parallelepiped second fin arranged to be separated from the first fin and extending in the first direction; and a gate electrode arranged on the first and second fins through a gate insulating film and extending in a second direction crossing the first direction. And, the semiconductor device also includes a first local wiring connecting a first drain region formed in the first fin and a second drain region formed in the second fin. The first local wiring is made of a conductive film buried in an interlayer insulating film covering the gate electrode.

According to a semiconductor device disclosed in the present application and described below in a typical embodiment, the characteristics of the semiconductor device can be improved. And, an area of the semiconductor device can be reduced.

BRIEF DESCRIPTIONS OF THE DRAWINGS

DETAILED DESCRIPTION

Figure 1:
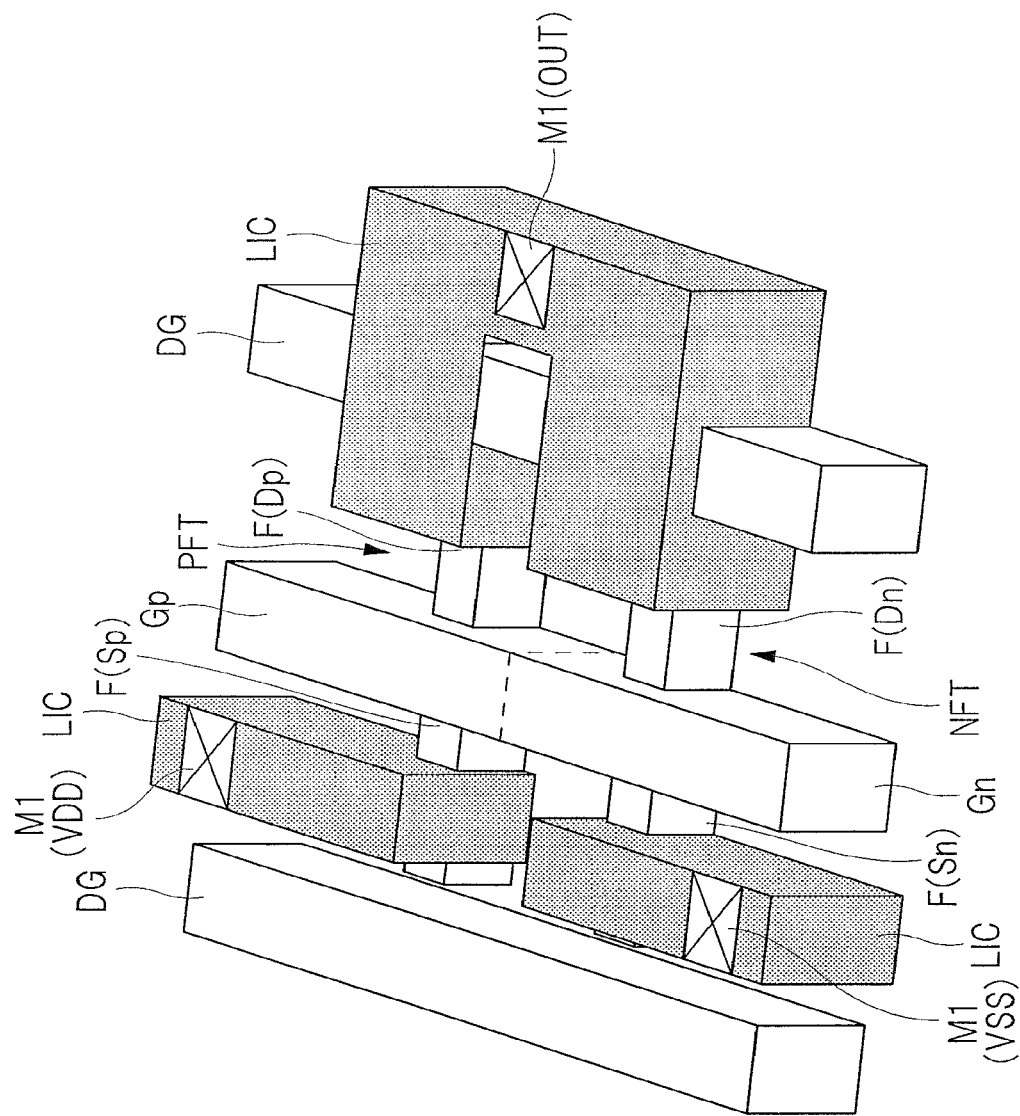
FIG. 1 is a perspective view schematically showing a configuration of a semiconductor device according to a first embodiment.

In the embodiments described below, the invention will be described in a plurality of sections or embodiments when required as a matter of convenience. However, these sections or embodiments are not irrelevant to each other unless otherwise stated, and the one relates to the entire or a part of the other as a modification example, details, or a supplementary explanation thereof. Also, in the embodiments described below, when referring to the number of elements (including number of pieces, values, amount, range, and the like), the number of the elements is not limited to a specific number unless otherwise stated or except the case where the number is apparently limited to a specific number in principle. The number larger or smaller than the specified number is also applicable.

Further, in the embodiments described below, it goes without saying that the components (including element steps) are not always indispensable unless otherwise stated or except the case where the components are apparently indispensable in principle.

Similarly, in the embodiments described below, when the shape of the components, positional relation thereof, and the like are mentioned, the substantially approximate and similar shapes and the like are included therein unless otherwise stated or except the case where it is conceivable that they are apparently excluded in principle. The same goes for the numerical value and others described above (including number of pieces, values, amount, range, and the like).

Hereinafter, embodiments of the present invention will be described in detail with reference to the accompanying drawings. Note that, in all the drawings for describing the embodiments, members having the same function are denoted by the same or related reference numerals, and the repeated descriptions thereof will be omitted. When a plurality of similar members (portions) are present, a symbol is added to a reference numeral of a collective term to indicate an individual or specific portion in some cases. In the following embodiments, in principle, the same or similar parts will not be described repeatedly particularly unless it is required.

Also, in some drawings used in the embodiments, hatching is omitted even in a cross-sectional view so as to make the drawings easy to see. Also, hatching is used even in a plan view so as to make the drawings easy to see.

In cross-sectional views and plan views, a size of each portion does not correspond to that of an actual device, and a specific portion is shown relatively largely so as to make the drawings easy to see in some cases. Even when a plan view corresponds to a cross-sectional view, each portion is shown with being changed in a size.

First Embodiment

Figure 2:
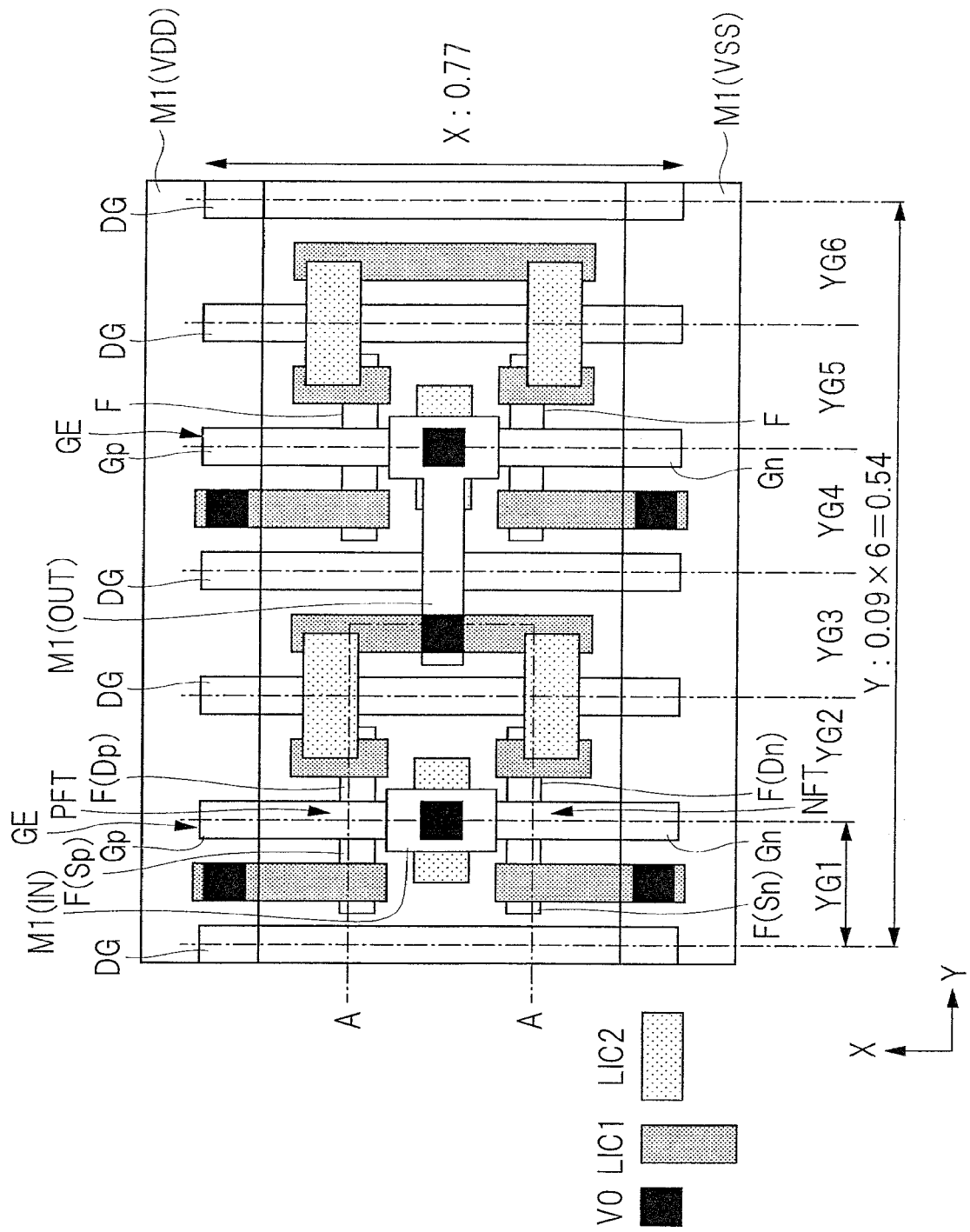
FIG. 2 is a plan view showing the configuration of the semiconductor device according to the first embodiment.
Figure 3:
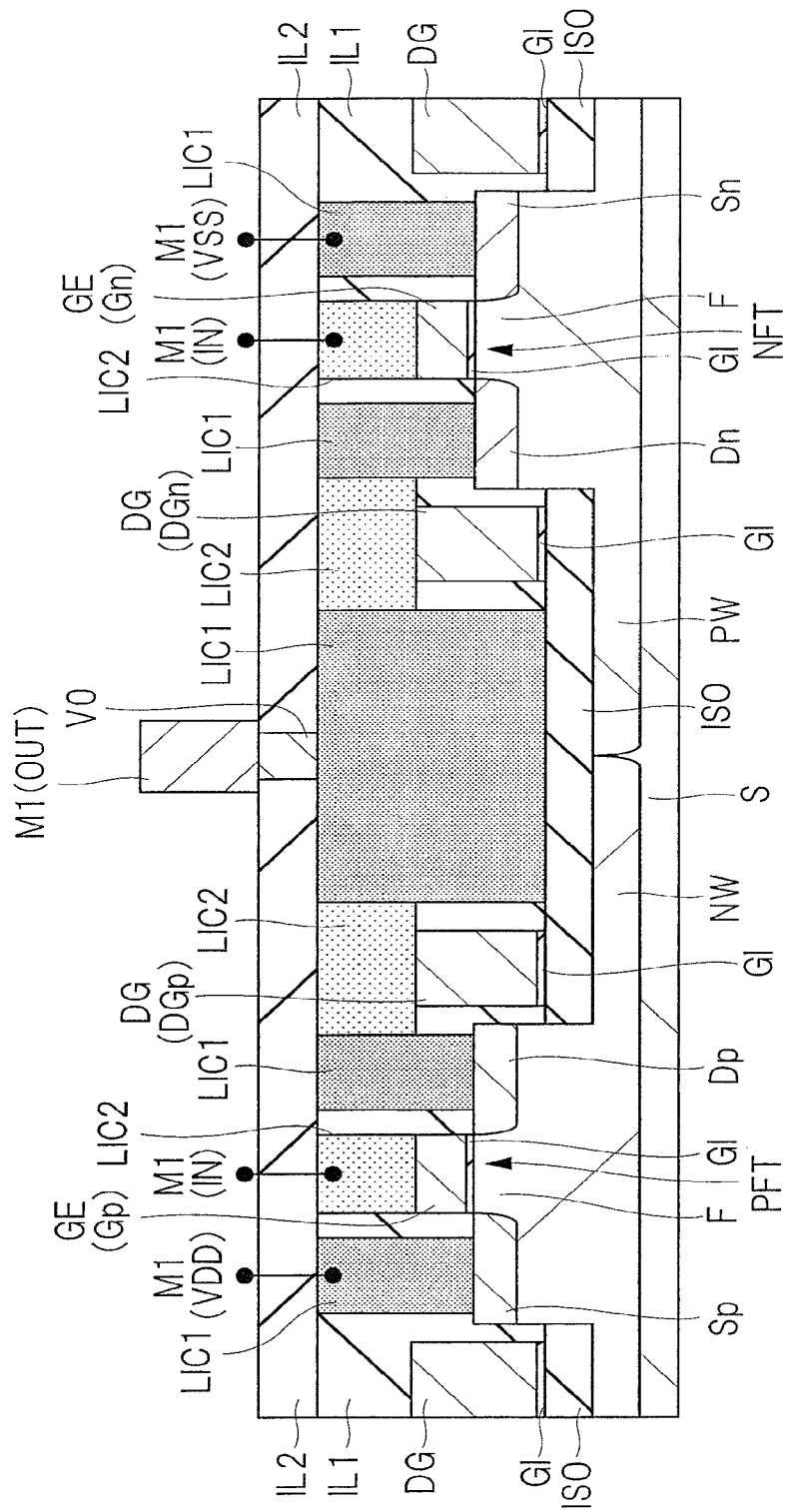
FIG. 3 is a cross-sectional view showing the configuration of the semiconductor device according to the first embodiment.
Figure 4:
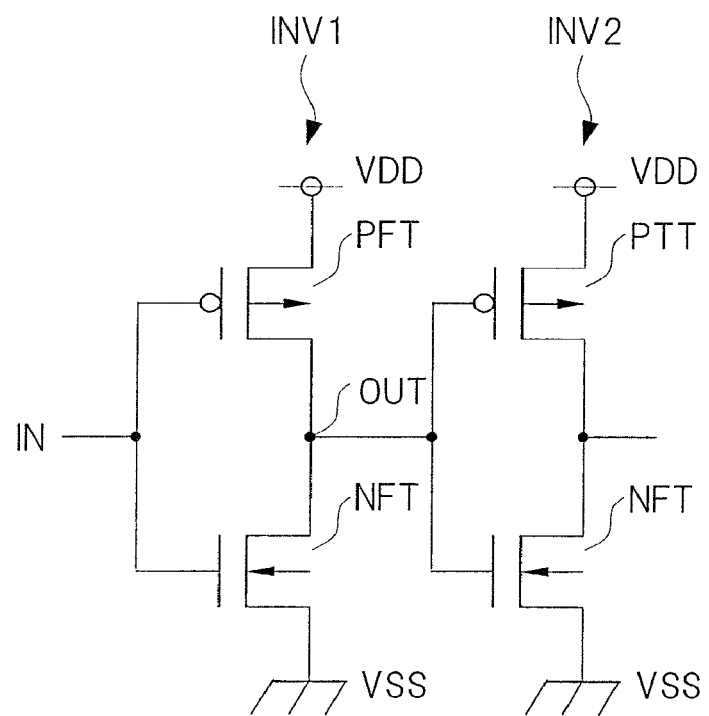
FIG. 4 is a circuit diagram showing the configuration of the semiconductor device according to the first embodiment.

A semiconductor device according to the present embodiment will be described in detail below with reference to drawings. The semiconductor device according to the present embodiment includes a FINFET serving as a semiconductor element. FIG. 1 is a perspective view schematically showing a configuration of the semiconductor device according to the present embodiment. FIG. 2 is a plan view showing the configuration of the semiconductor device according to the present embodiment. FIG. 3 is a cross-sectional view showing the configuration of the semiconductor device according to the present embodiment. The cross-sectional view of FIG. 3 corresponds to, for example, a cross-sectional part taken along a line A-A of the plan view of FIG. 2. FIG. 4 is a circuit diagram showing the configuration of the semiconductor device according to the present embodiment.

The characteristic configuration of the semiconductor device of the present embodiment will be described with reference to FIG. 1.

As shown in FIG. 1, the semiconductor device of the present embodiment includes a FINFET formed on a main surface of a fin F formed above a semiconductor substrate (S). Here, an n-channel FINFET (NFT) and a p-channel FINFET (PFT) are formed, and these FINFETs (NFT, PFT) make up an inverter (INV1).

The n-channel FINFET (NFT) has a gate electrode Gn arranged above a rectangular parallelepiped fin F through a gate insulating film (not shown in FIG. 1), and a source region (source diffusion layer) Sn and a drain region (drain diffusion layer) Dn that are formed in the fin on both sides of the gate electrode Gn. The p-channel FINFET (PFT) has a gate electrode Gp arranged above a rectangular parallelepiped fin F through the gate insulating film (not shown in FIG. 1), and a source region (source diffusion layer) Sp and a drain region (drain diffusion layer) Dp that are formed in the fin on both sides of the gate electrode Gp. A gate electrode (GE) is made up by the gate electrode Gp and the gate electrode Gn. In other words, a half of the linear gate electrode GE is the gate electrode Gp while the rest of the same is the gate electrode Gn. The central part of this gate electrode GE, i.e., a connection portion between the gate electrode Gp and the gate electrode Gn is connected to an input portion (IN) of an inverter INV1.

Here, in the present embodiment, the drain region Dp of the p-channel FINFET (PFT) and the drain region Dn of the n-channel FINFET (NFT) are connected to each other by a local interconnect LIC (see FIG. 1). In the present specification, the local interconnect LIC (local wiring, LIC1 or LIC2) is a wiring formed in an interlayer insulating film IL1, which will be described later. More specifically, the local interconnect LIC is a wiring made of a conductive film buried in a trench (C1 or C2) in the interlayer insulating film IL1, which will be described later. This interlayer insulating film IL1 described here is a multilayer insulting film covering the gate electrode GE. The local interconnect LIC (local wiring, LIC1 or LIC2) is located on a lower layer than a wiring M1 on a first layer.

The local interconnect LIC connecting the drain region Dp and the drain region Dn described above becomes an output portion (OUT) of the inverter (INV1), which will be described later. In other words, the local interconnect LIC is connected to the output portion (OUT) of the inverter (INV1), which will be described later. As described later, the local interconnect LIC is arranged so as to cross a P/N boundary (see FIG. 7). Below the local interconnect LIC, a dummy gate DG is arranged. In other words, the local interconnect LIC is arranged above the dummy gate DG.

The source region Sp of the p-channel FINFET (PFT) is connected to a source potential VDD through the local interconnect LIC. The source region Sn of the n-channel FINFET (NFT) is connected to a ground potential (reference potential) VSS through the local interconnect LIC. A dummy gate DG is arranged outside (left side in FIG. 1) the local interconnect LIC connected to the source potential VDD or ground potential VSS.

In this manner, according to the semiconductor device of the present embodiment, the drain regions Dp and Dn are connected through the local interconnect LIC having a substantially-formed U shape, so that the formation area (cell area) of the semiconductor device can be reduced. And, an integration degree of the semiconductor element (FINFET) can be increased. Details will be described later.

Next, the configuration of the semiconductor device of the present embodiment will be described in the further detail with reference to FIGS. 2 to 4.

The plan view of FIG. 2 shows FINFETs (PFT, NFT) making up an inverter INV2 in addition to the p-channel FINFET (PFT) and n-channel FINFET (NFT) making up the inverter INV1. That is, as shown in FIG. 4, the inverter INV2 is connected at a rear stage of the inverter INV1. The inverter INV1 has the p-channel FINFET (PFT) and the n-channel FINFET (NFT) that are connected in series between the source potential VDD and the ground potential VSS. A connection point between these FINFETs becomes the output portion (OUT), and the gate electrodes thereof are connected to the input portion (IN). The inverter INV2 at the rear stage has the same configuration, and the output portion (OUT) of the inverter INV1 is connected to an input portion (OUT) of the inverter INV2.

The present embodiment will be described so as to regard a region for forming the inverters INV1 and INV2 as a unit cell. While the cross-sectional view of FIG. 3 shows cross sections of the p-channel FINFET (PFT) and the n-channel FINFET (NFT) that make up the inverter INV1, the FINFETs (PFT, NFT) making up the inverter INV2 have the same configuration.

First, a planar shape (shape in a plan view from above, cell layout) of each component of the semiconductor device of the present embodiment will be described with reference to FIG. 2.

As shown in FIG. 2, the planar shape of each fin F is a linear shape having a certain width (length in the X direction) (a rectangular shape with long sides extending in the Y direction). In FIG. 2, four fins F formed in two rows×two columns are arranged in the X and Y directions at a certain interval (pitch). The two left fins F in FIG. 2 are the fins F making up the inverter INV1. And, the two right fins F therein are the fins F making up the inverter INV2 (see FIGS. 5 and 7).

As shown in FIG. 2, the planar shape of each gate electrode GE is a linear shape having a certain width (length in the Y direction) (a rectangular shape with long sides extending in the X direction). As described above, the gate electrode GE extends in a direction of crossing the fins F. Here, in addition to the gates GE extending in the direction of crossing the fins F, the dummy gates DG are also provided. Each dummy gate DG has the same configuration as that of the gate electrode GE. That is, the dummy gate DG also has a linear shape having a certain width (length in the Y direction) (a rectangular shape with long sides extending in the X direction).

Figure 9:
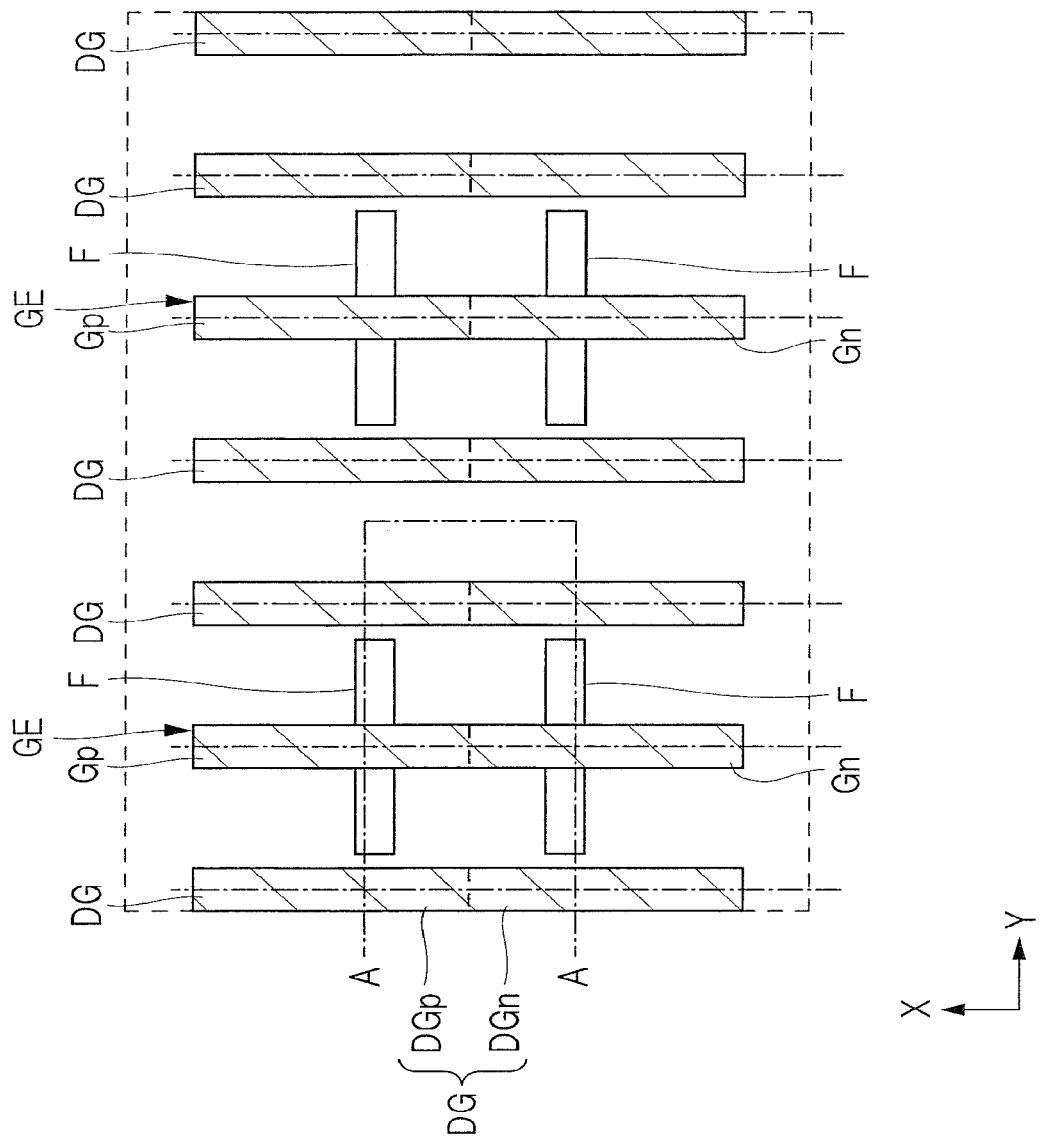
FIG. 9 is a plan view showing the manufacturing process for the semiconductor device according to the first embodiment, continued from FIG. 7.

In FIG. 2, seven of the gate electrodes GE and dummy gates DG are arranged at certain intervals (intervals in the Y direction, minimum pitches in the Y direction, grid) (see FIG. 9). In this manner, a pattern regularity is ensured by arranging the dummy gate DG between the gate electrodes GE, so that variation in the manufacturing or others can be reduced.

Here, a region (Y grid) between the gate electrode GE and the dummy gate DG is denoted as "YG". In FIG. 2, for example, Y girds YG1 to YG6 are arranged sequentially from left to right.

The left gate electrode GE (Gn, Gp) of the gate electrodes GE (Gn, Gp) extending in the direction of crossing the fins F makes up the inverter INV1, while the right gate electrode GE (Gn, Gp) thereof makes up the inverter INV2. As described later, note that the gate electrode GE is made of a conductive film extending integrally in the X direction and is shown as the gate electrode Gp in a region for forming the p-channel FINFET (PFT) because a p-type impurity is introduced in this region. Also, this is denoted as the gate electrode Gn in a region for forming the n-channel FINFET (NFT) because an n-type impurity is introduced in this region. By these gate electrodes Gp and Gn, the gate electrode GE is made up.

Here, the above-described interval in the Y direction (width in the Y direction of the Y grid) is a reference for determining the length of the unit cell in the Y direction. For example, when the interval in the Y direction is 0.09 µm, the length of the unit cell in the Y direction is determined to be 0.09×6=0.54 µm. Here, when the length thereof in the X direction is 0.77 µm, the cell area of the unit cell of FIG. 2 is 0.4158 µm².

The source region Sp and the drain region Dp are arranged in the fins F on both sides of the gate electrode GE (Gp). Also, the source region Sn and the drain region Dn are arranged in the fin F on both sides of the gate electrode GE (Gn). Note that the fin F and the gate electrode GE overlap with each other through a gate insulating film (GI) (see FIG. 3). More specifically, the gate insulating film (GI) is arranged on a side surface and a front surface of the fin F in a region where the fin F and the gate electrode GE overlap with each other.

As shown in FIG. 2, the planar shape of each local interconnect (LIC1, LIC2) is a rectangular parallelepiped shape with long sides extending in the X direction or a rectangular parallelepiped shape with long sides extending in the Y direction. Here, the rectangular one (part, portion) with long sides extending in the X direction is denoted as "LIC1", while the rectangular one (part, portion) with long sides extending in the Y direction is denoted as "LIC2". As described later, the local interconnect (LIC1, LIC2) is formed by burying a conductive film in the trench (C1, C2) formed in the interlayer insulating film (IL1). When the trench is formed, a processed photoresist film is used as a mask. When the photoresist film is processed (exposed to light), a rectangular pattern with long sides extending in the X direction and a rectangular pattern with long sides extending in the Y direction are transferred separately from each other. By such processing, even a fine pattern can be formed with high accuracy.

The drain regions (Dp and Dn) of the p-channel FINFET (PFT) and n-channel FINFET (NFT) making up the inverter INV1 are connected to each other through the local interconnects (LIC1, LIC2).

The drain region (Dp) of the p-channel FINFET (PFT) is extracted by the local interconnect LIC1. This local interconnect LIC1 is connected to a local interconnect LIC1 connected to the output portion (OUT) through the local interconnect LIC2 crossing the dummy gate DG. The drain region (Dn) of the n-channel FINFET (NFT) is extracted by the local interconnect LIC1. This local interconnect LIC1 is connected to a local interconnect LIC1 connected to the output portion (OUT) through the local interconnect LIC2 crossing the dummy gate DG. Hence, in FIG. 2, the drain regions (Dp, Dn) are connected through five local interconnects (LIC1, LIC2). These five local interconnects (LIC1, LIC2) form a substantially-formed U shape.

Note that the drain regions (Dp, Dn) may be connected through three local interconnects (LIC1, LIC2). That is, the drain regions (Dp, Dn) may be connected directly by the local interconnects LIC2 extending in the Y direction, and be connected to the local interconnect LIC1 connected to the output portion (OUT) therebetween.

As shown in FIG. 2, the source region Sp of the p-channel FINFET (PFT) making up the inverter INV1 is connected to the local interconnect LIC1. This local interconnect LIC1 is connected to a wiring M1 (VDD) on which a source potential (VDD) is applied through a via V0 described later. Also, the source region Sn of the n-channel FINFET (NFT) is connected to the local interconnect LIC1. This local interconnect LIC1 is connected to a wiring M1 (VSS) connected to the ground potential (VSS) through a via V0 described later (also see FIG. 3).

As shown in FIG. 2, the local interconnect LIC2 is arranged on the boundary between the gate electrode Gp and the gate electrode Gn. This local interconnect LIC2 is connected to a wiring M1 (IN) serving as an input portion (IN) through a via V0 described later (see FIG. 3).

Note that the FINFETs (PFT, NFT) making up the inverter INV2 are arranged in the right region of the unit cell shown in FIG. 2. The inverter INV2 has the same configuration as that of the inverter INV1, and therefore, the local interconnects (LIC1, LIC2) having the same shape as those of the local interconnects (LIC1, LIC2) connected to the inverter INV1. As described above, the output portion of the inverter INV1 is connected to the input portion of the inverter INV2, and the output portion and the input portion are connected to each other by the wiring M1 through via V0.

The above-described wiring M1 (VDD) of the wirings M1 extends in the Y direction at an end of the region for forming the p-channel FINFET (PFT) (upper side in FIG. 2), while the wiring M1 (VSS) extends in the Y direction at an end of the region for forming the n-channel FINFET (NFT) (lower side in FIG. 2). Note that the present embodiment has been described while exemplifying the inverter INV2 as a circuit connected at the rear stage. However, another logical circuit may be connected.

[Description of Manufacturing Method]

Next, a method of manufacturing the semiconductor device of the present embodiment will then be described with reference to FIGS. 5 to 20, and the configuration of the semiconductor device will be descried more clearly. FIGS. 5 to 20 are a cross-sectional view or a plan view showing manufacturing processes for the semiconductor device of the present embodiment. Note that a rectangular region encircled with a broken line in a plan view represents a region for forming the unit cell. The following processes are one example of the manufacturing processes for the semiconductor device of the present embodiment, and the semiconductor device of the present embodiment may be manufactured by different manufacturing processes.

Figure 5:
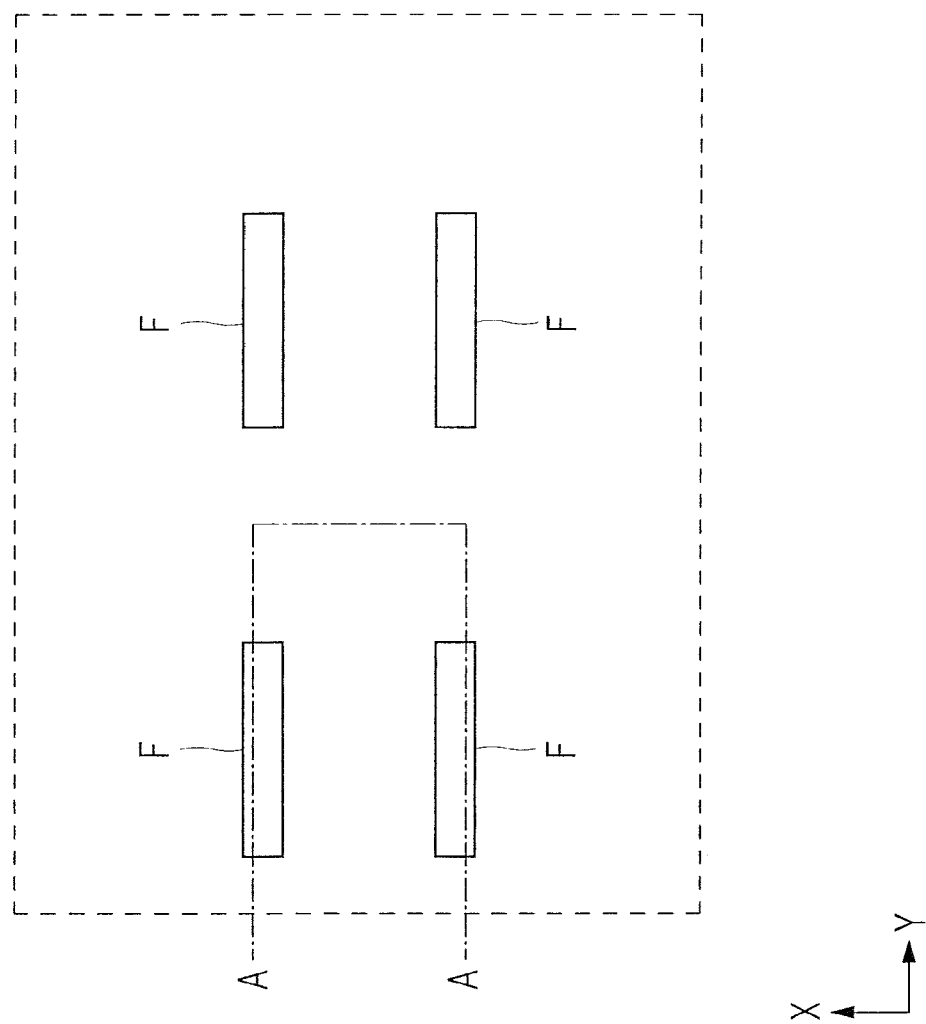
FIG. 5 is a plan view showing a manufacturing process for the semiconductor device according to the first embodiment.
Figure 6:
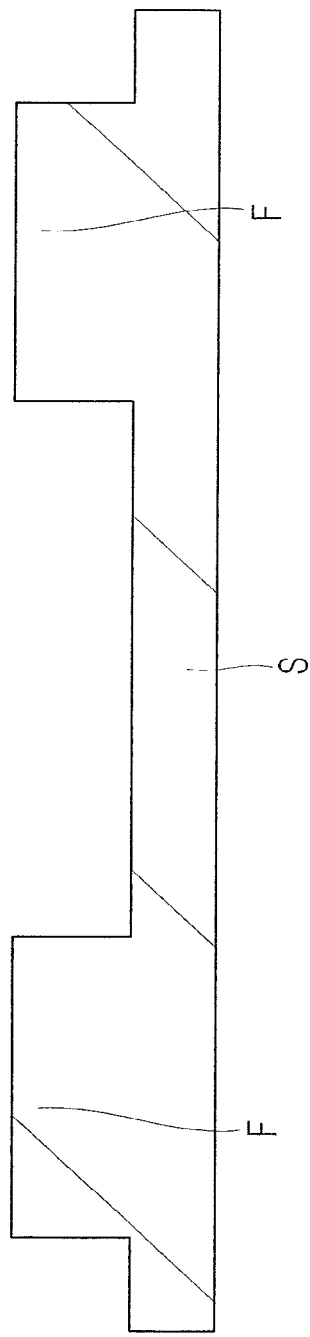
FIG. 6 is a cross-sectional view showing the manufacturing process for the semiconductor device according to the first embodiment.

As shown in FIGS. 5 and 6, the semiconductor substrate S is prepared, and the fin (protrusion) F is formed thereon. The semiconductor substrate S is, for example, a silicon substrate. For example, a photoresist film (not shown) is formed on the semiconductor substrate S, and is exposed to light, so that a plurality of linear patterns formed of the photoresist film a linear shape (each pattern having a rectangular shape with long sides in the Y direction) are formed. Subsequently, the semiconductor substrate S is etched while using the photoresist film patterns as a mask, so that a plurality of fins (convex portions) are formed. The plurality of fins F are each formed into a linear shape having a certain width, and are arranged into a two rows×two columns with certain intervals (pitches). A portion between these fins F becomes a trench (concave portion). In this manner, a processing for forming a lower layer material into a desired shape by performing the etching while using a photoresist film processed into a desired shape by the exposure and the development or a hard-mask film as a mask is called patterning.

Figure 7:
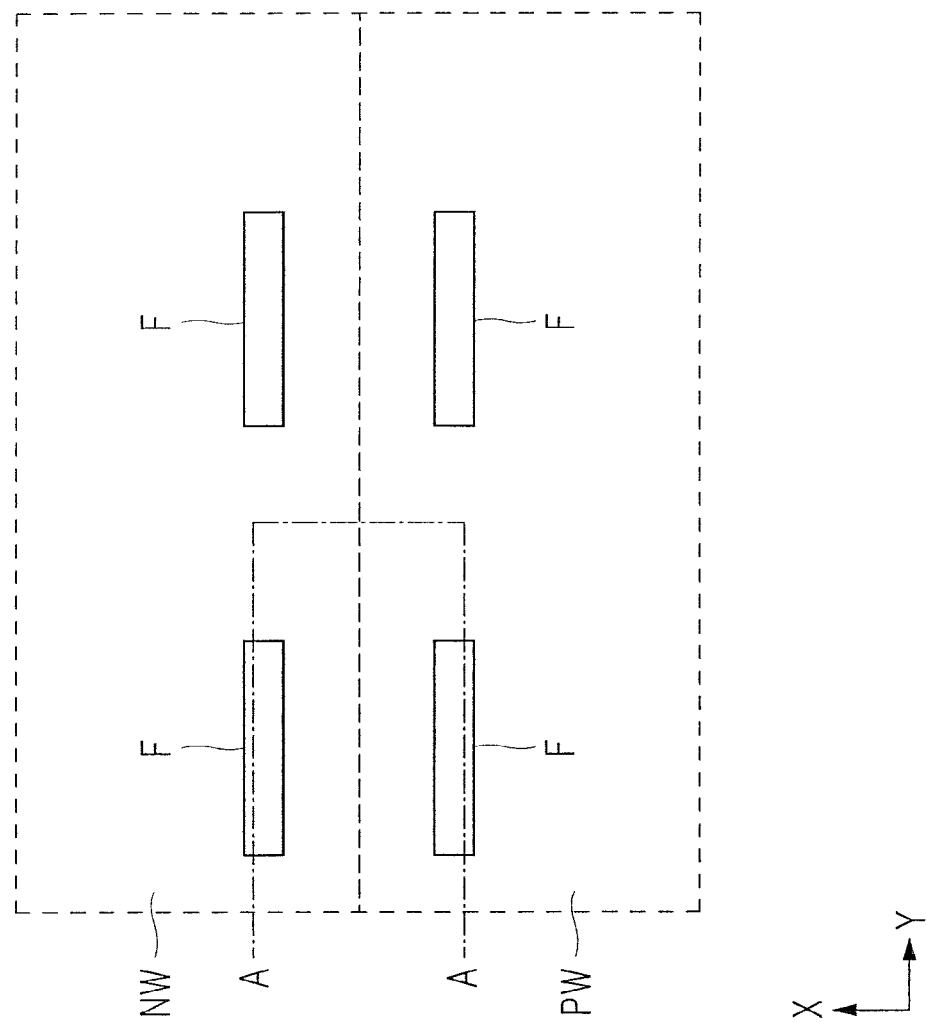
FIG. 7 is a plan view showing a manufacturing process for the semiconductor device according to the first embodiment, depicting the manufacturing process to follow the manufacturing process, continued from FIG. 5.
Figure 8:
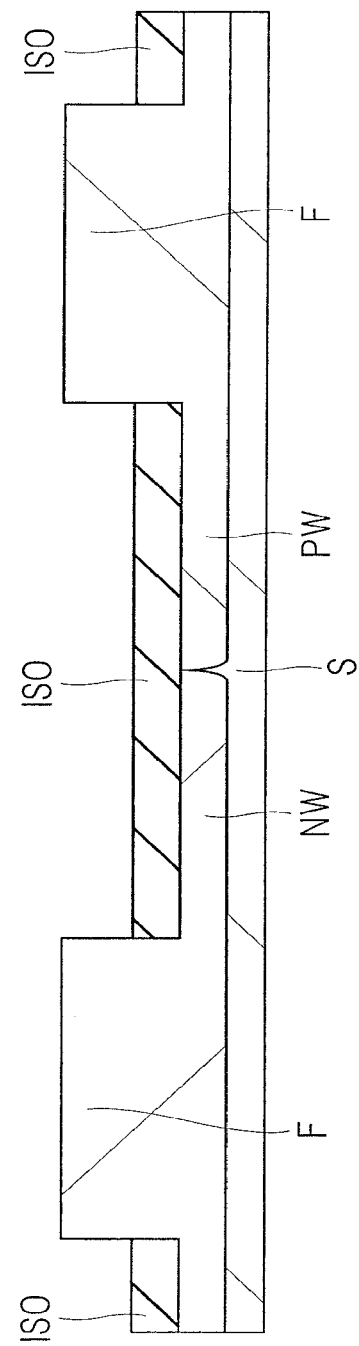
FIG. 8 is a cross-sectional view showing the manufacturing process for the semiconductor device according to the first embodiment, continued from FIG. 6.

Subsequently, as shown in FIGS. 7 and 8, a lower part of each trench (concave portion) formed between these fins F is filled with an insulating film to form an element isolation film ISO. For example, a silicon oxide film is deposited on the semiconductor substrate S as an insulating film by a CVD (Chemical Vapor Deposition) method etc., and is etched back to form the element isolation film ISO.

Subsequently, an n-type well NW is formed in the region for forming the p-channel FINFET (PFT) of the semiconductor substrate S, and a p-type well PW is formed in the region for forming the n-channel FINFET (NFT) of the semiconductor substrate S.

The region for forming the n-channel FINFET (PFT) of the semiconductor substrate S is covered with a photoresist film, and n-type impurity ions are implanted into the region for forming the p-channel FINFET (PFT) (e.g., the upper half region in FIG. 7) to form the n-type well NW. Then, the above-described photoresist film is removed, the region for forming the p-channel FINFET (PFT) of the semiconductor substrate S is covered with a photoresist film, and p-type impurity ions are implanted into the region for forming the n-channel FINFET (NFT) (e.g., the lower half region in FIG. 7) to form the p-type well PW.

Figure 10:
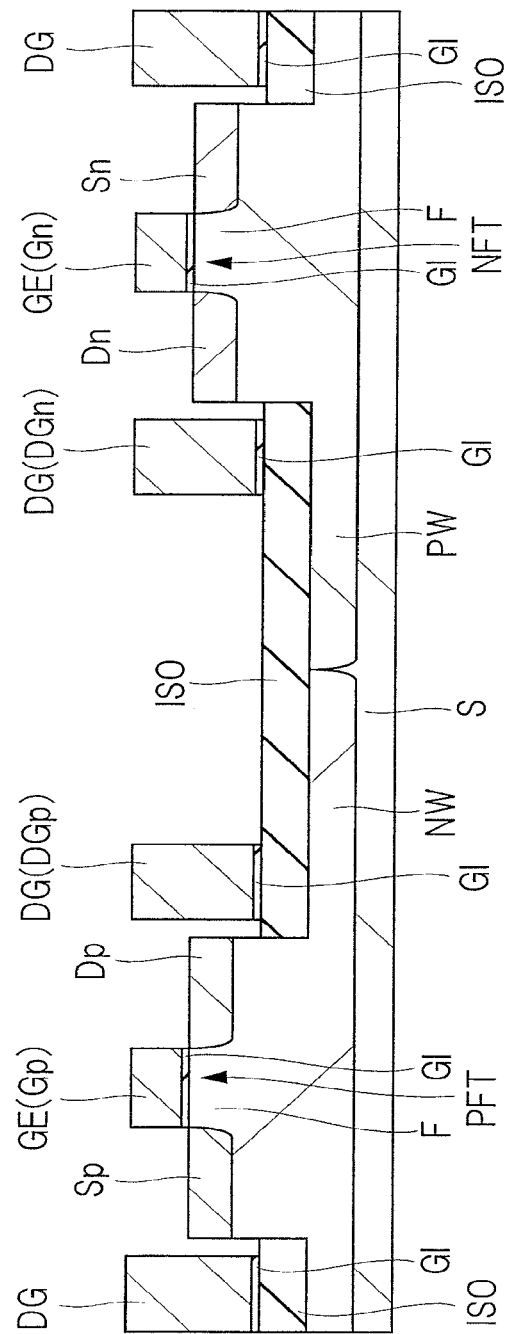
FIG. 10 is a cross-sectional view showing the manufacturing process for the semiconductor device according to the first embodiment, continued from FIG. 8.

Subsequently, as shown in FIGS. 9 and 10, the gate electrodes GE and the dummy gates DG are formed. The gate insulating film GI is formed first on the surfaces of the fins F. For example, a silicon oxide film is formed on the surfaces of the fins F by an oxidation method. Further, a high dielectric constant film is deposited on this silicon oxide film by CVD. In this manner, the gate insulating film GI made of a lamination film of the silicon oxide film and the high dielectric constant film can be formed. Subsequently, the gate electrode GE is formed above the fins F through the gate insulating film GI. In other words, the gate electrode GE is formed so as to be across a plurality of the fins F. The dummy gate DG is formed on the element isolation film ISO.

For example, on the gate insulating film GI and element isolation film ISO, a polysilicon film is formed as a gate electrode material by the CVD method etc. Subsequently, the surface of the polysilicon film is flattened by a CMP (Chemical Mechanical Polishing) method etc. Subsequently, the polysilicon film is patterned to form the gate electrodes GE and dummy gates DG. Here, in the unit cell forming region, seven of the gate electrodes GE and dummy gates DG are arranged at certain intervals (intervals in the Y direction, a grid). In this patterning process, the gate insulating film GI exposed from both sides of the gate electrode GE may be removed.

Subsequently, p-type impurity ions are implanted into the gate electrodes GE and dummy gates DG located in the region for forming the p-channel FINFET (PFT) (e.g., the upper half region in FIG. 2). As a result, the p-type gate electrodes Gp are formed. Subsequently, N-type impurity ions are then implanted into the gate electrodes GE and dummy gates DG located in the region for forming the n-channel FINFET (NFT) (e.g., the lower half region in FIG. 2). As a result, the n-type gate electrodes Gn are formed. Note that the impurity ions are implanted also into the dummy gates DG, and therefore, p-type dummy gates DGp and n-type dummy gates DGn are formed. So-called "polymetal structure" may be adopted as the structure of the gate electrode. At this time, different metal materials may be used in the region for forming the p-channel FINFET (PFT) and the region for forming the n-channel FINFET (NFT), respectively.

Figure 11:
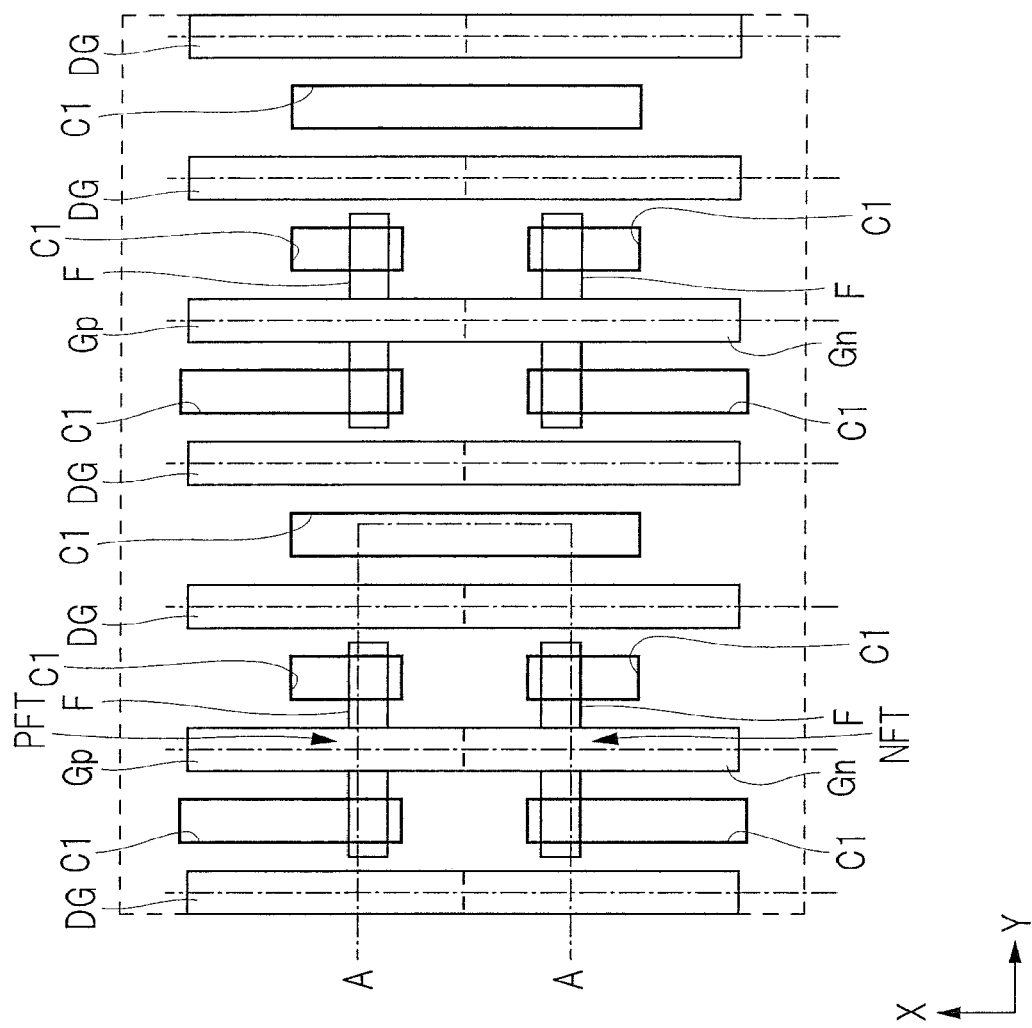
FIG. 11 is a plan view showing the manufacturing process for the semiconductor device according to the first embodiment, continued from FIG. 9.
Figure 12:
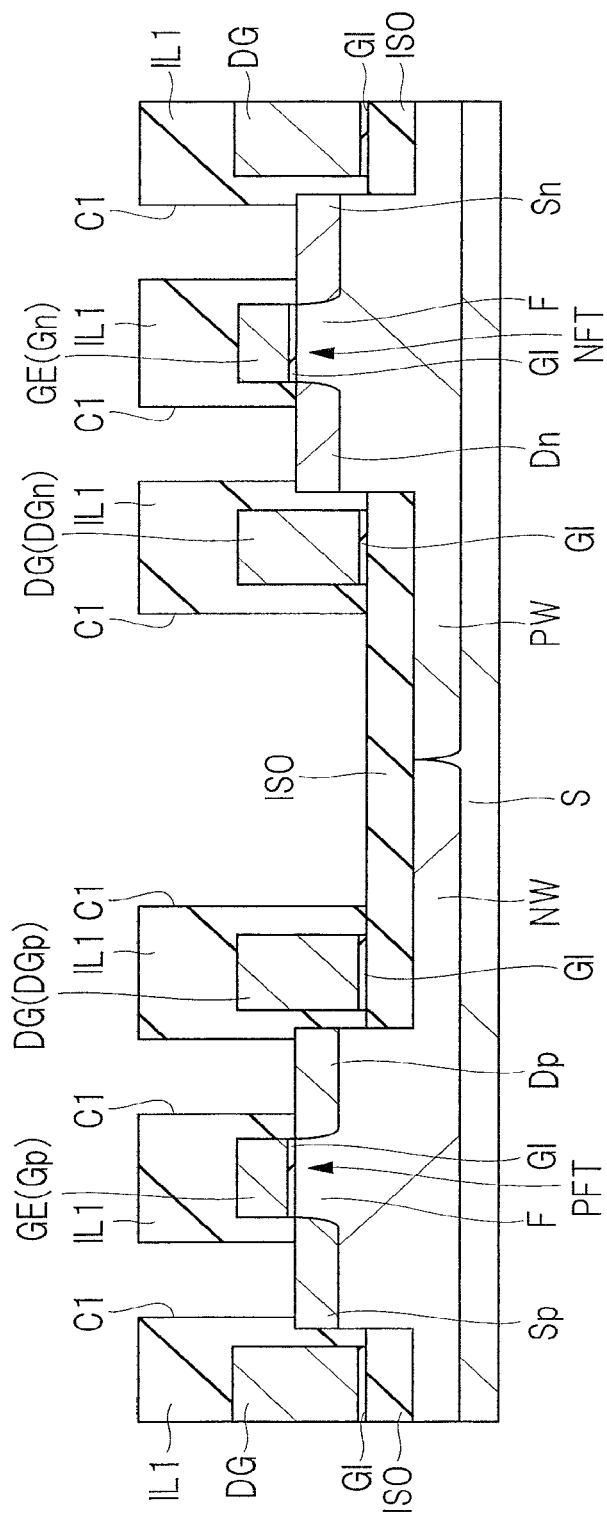
FIG. 12 is a cross-sectional view showing the manufacturing process for the semiconductor device according to the first embodiment, continued from FIG. 10.

Subsequently, as shown in FIGS. 11 and 12, the interlayer insulating film IL1 is formed so as to form trenches C1. For example, a silicon oxide film is deposited on the semiconductor substrate S by the CVD method, etc., and a surface thereof is flattened by the CMP method, etc., to form the interlayer insulating film IL1 covering the gate electrodes GE and the dummy gates DG. Subsequently, a photoresist film having openings in a region for forming the local interconnects LIC1 is formed on the interlayer insulating film IL1, and the interlayer insulating film IL1 is etched while using this photoresist film as a mask, to form the trenches (local interconnect trenches) C1.

Figure 13:
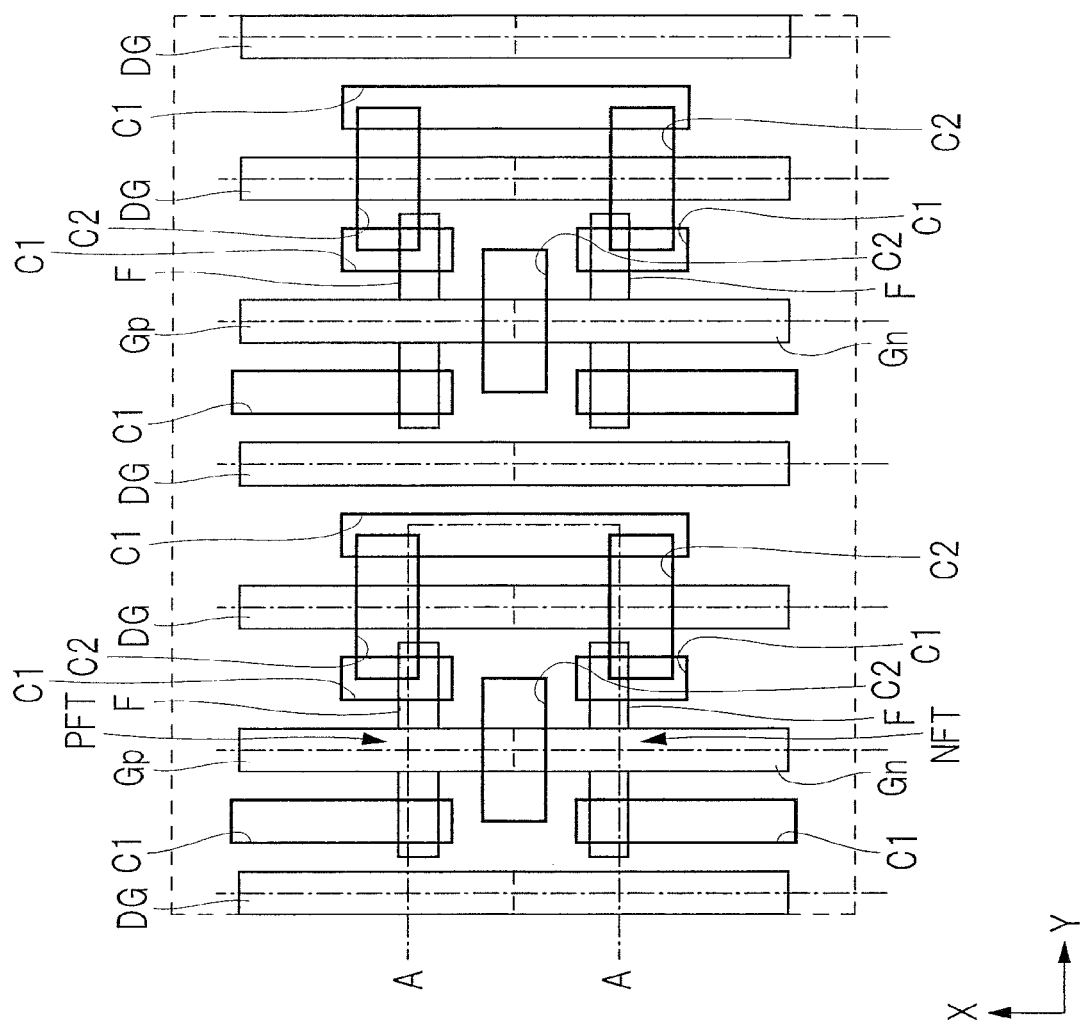
FIG. 13 is a plan view showing the manufacturing process for the semiconductor device according to the first embodiment, continued from FIG. 11.
Figure 14:
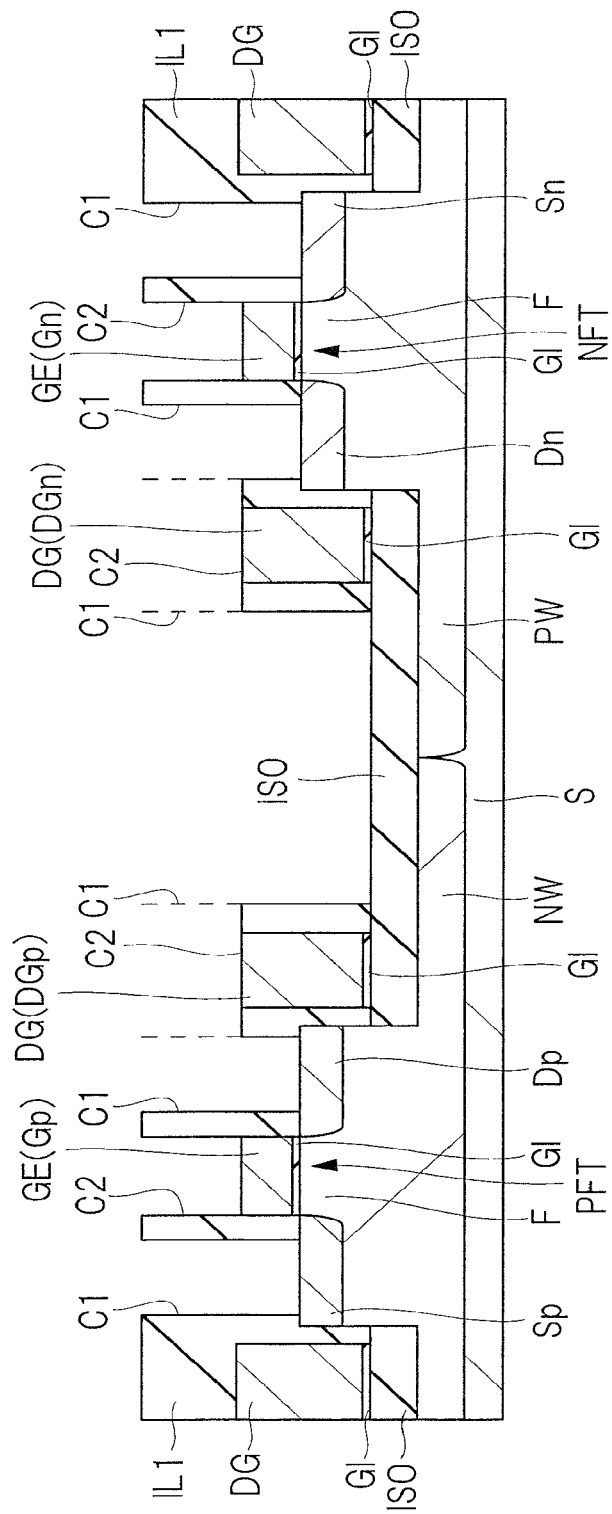
FIG. 14 is a cross-sectional view showing the manufacturing process for the semiconductor device according to the first embodiment, continued from FIG. 12.

Subsequently, as shown in FIGS. 13 and 14, trenches C2 are formed in the interlayer insulating film IL1. For example, a photoresist film having openings in a region for forming the local interconnects LIC2 is formed on the interlayer insulating film IL1, and the interlayer insulating film IL1 is etched while using this photoresist film as a mask, to form the trenches (local interconnect trenches) C2.

In the photoresist film, note that the region for forming the local interconnects LIC1 is exposed to light and the region for forming the local interconnects LIC2 is exposed to light, and then, they are developed, to form a photoresist film having openings in the region for forming the local interconnects LIC1 and the region for forming local interconnects LIC2. In this case, the trenches C1 and C2 can be formed by the etching process once while using such a photoresist film as a mask.

In this manner, when the photoresist film is processed (exposed to light), a rectangular pattern with long sides in the X direction that correspond to the trench C1 and a rectangular pattern with long sides in the Y direction that correspond to the trench C2 are separately exposed to light (transferred), so that even fine patterns can be exposed to light with high accuracy.

Figure 15:
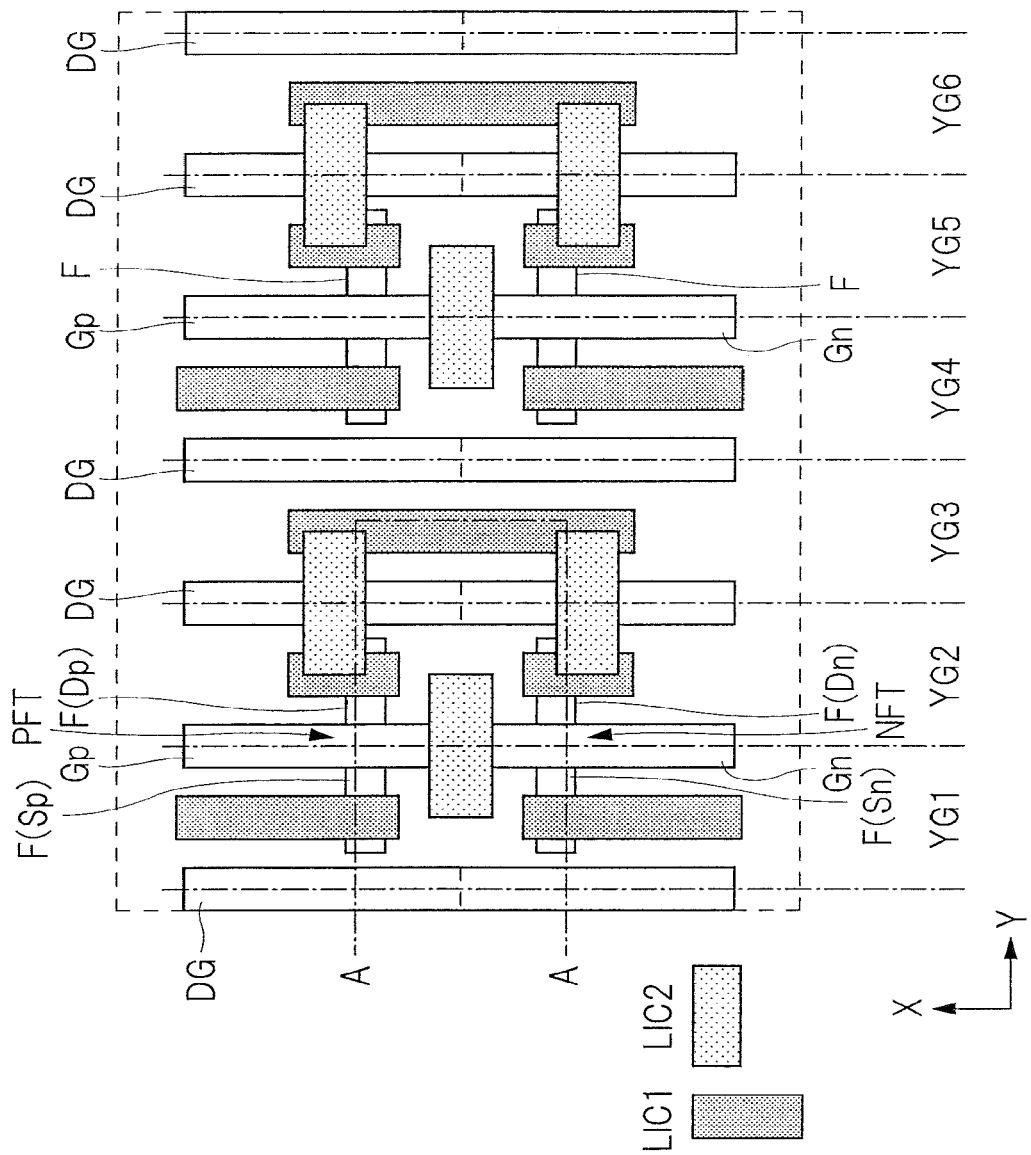
FIG. 15 is a plan view showing the manufacturing process for the semiconductor device according to the first embodiment, continued from FIG. 13.
Figure 16:
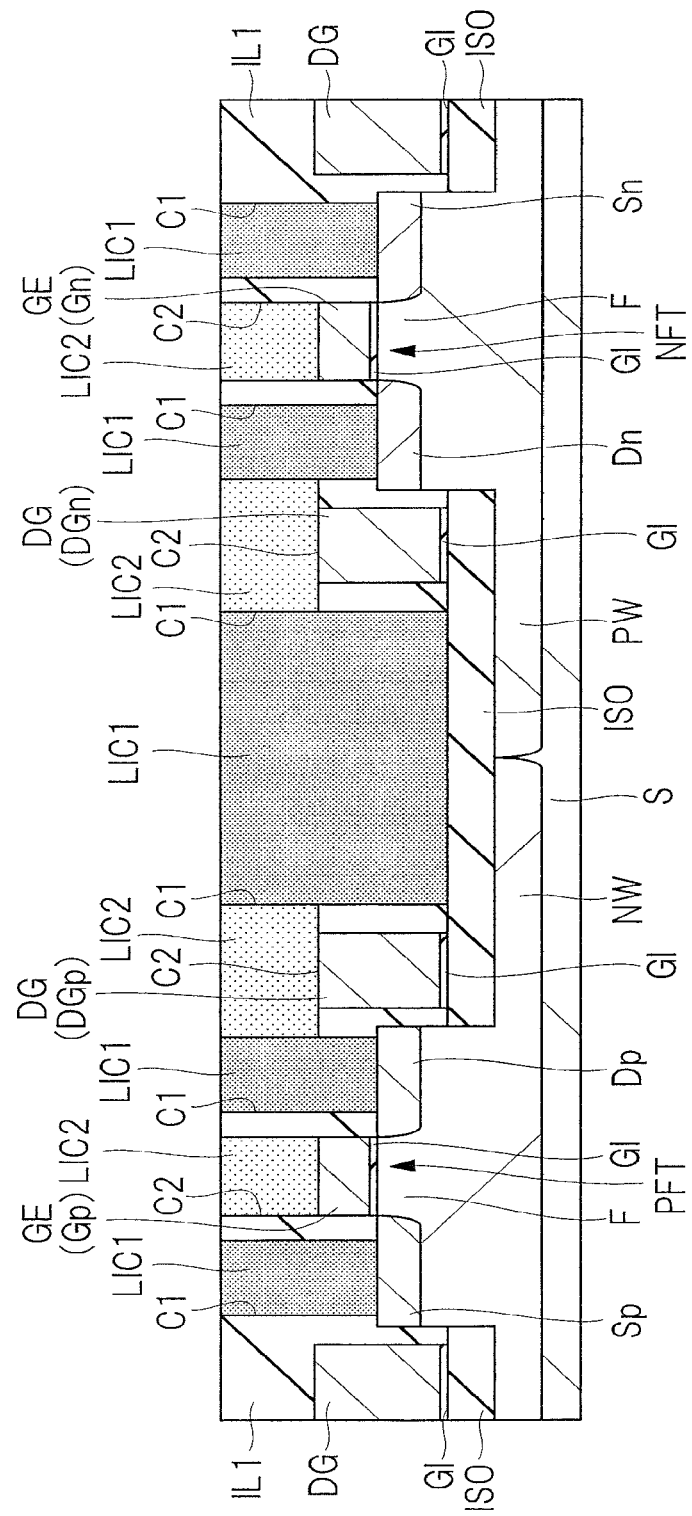
FIG. 16 is a cross-sectional view showing the manufacturing process for the semiconductor device according to the first embodiment, continued from FIG. 14.

Subsequently, as shown in FIGS. 15 and 16, the trenches C1 and C2 formed in the interlayer insulating film IL1 are filled with a conductive film to form the local interconnects LIC1 and LIC2. For example, the conductive film is deposited on the interlayer insulating film IL1 including the trenches C1 and C2 by a sputtering method. Subsequently, the conductive film portion outside the trenches C1 and C2 is removed by an etching back method, the CMP method, etc.

By these local interconnects LIC1 and LIC2, the drain regions (Dp, Dn) are electrically connected. The local interconnects LIC1 and LIC2 connecting the drain regions (Dp, Dn) are made of an integrally formed conductive film. The local interconnects LIC1 and LIC2 connecting the drain regions (Dp, Dn) are formed on the dummy gate DG. In other words, each of two local interconnects LIC2 among the local interconnects LIC1 and LIC2 connecting the drain regions (Dp, Dn) crosses the dummy gate DG, and is connected to a local interconnect LIC1 (see FIGS. 15 and 16). This local interconnect LIC1 is arranged so as to extend in the X direction and across above the boundary between the p-type well PW and the n-type well NW (see FIG. 7).

In this manner, the drain regions (Dp, Dn) are extracted by two local interconnects LIC2, respectively, from the Y grid YG2 between the gate electrode GE and the adjacent dummy gate DG to the adjacent Y grid YG3, and these local interconnects LIC2 are connected by the local interconnect LIC1 extending in the X direction in the Y grid YG3. In this manner, the drain regions (Dp, Dn) are connected by the local interconnects, and are extracted to the Y grid YG3 adjacent to the Y grid YG2 between the gate electrode GE and the dummy gate adjacent thereto, so that the unit cell area can be reduced.

In FIG. 15, the drain regions (Dp, Dn) are connected respectively by local interconnects LIC1 extending in the X direction. However, these local interconnects LIC1 may be omitted so that the drain regions (Dp, Dn) are connected directly by the local interconnects LIC2 extending in the Y direction, respectively.

The local interconnect LIC1 is formed also on the source region Sp and on the source region Sn, and the local interconnect LIC2 is formed also on the gate electrode GE (i.e., on the boundary between the gate electrodes Gp and Gn).

Figure 17:
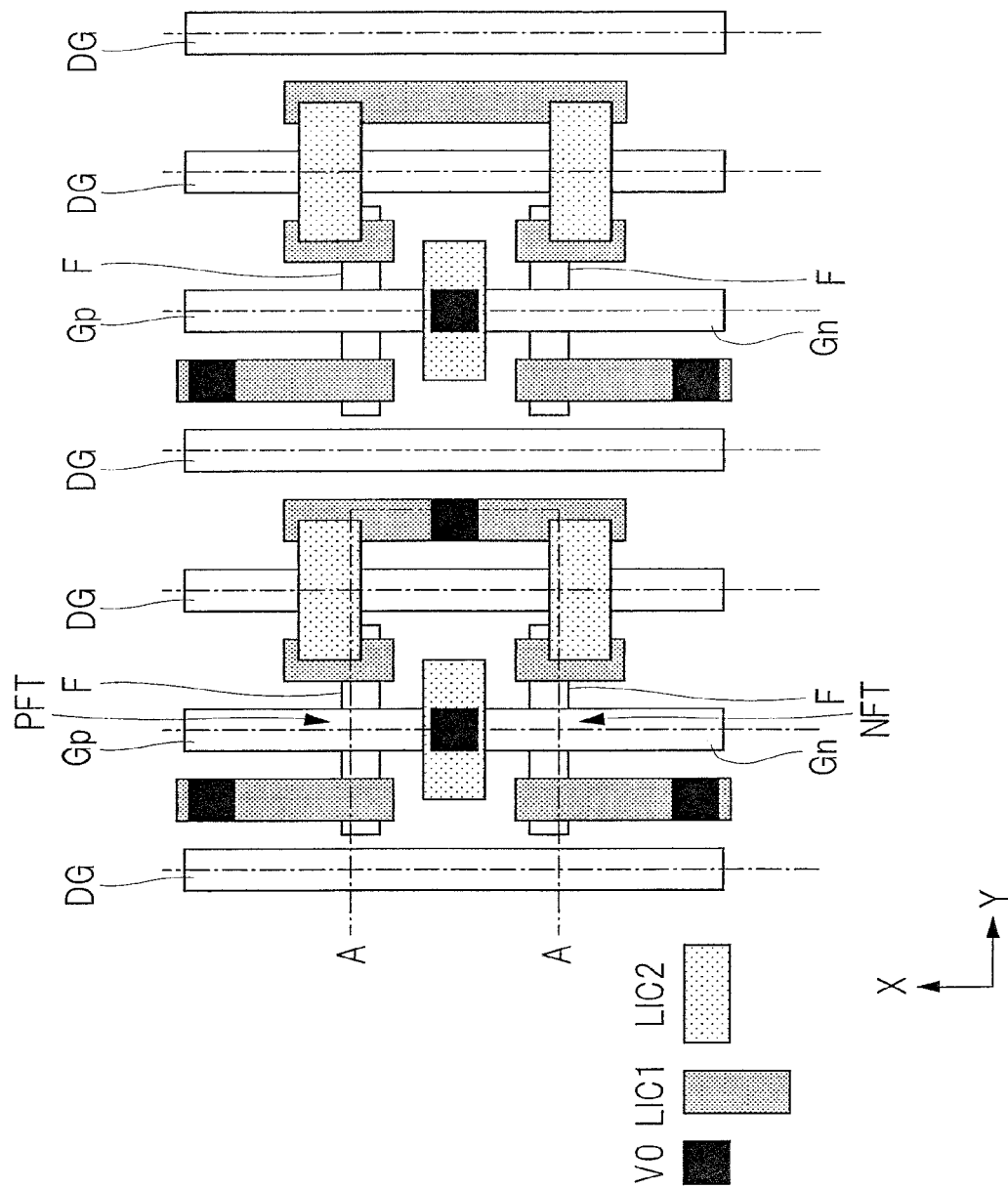
FIG. 17 is a plan view showing the manufacturing process for the semiconductor device according to the first embodiment, continued from FIG. 15.
Figure 18:
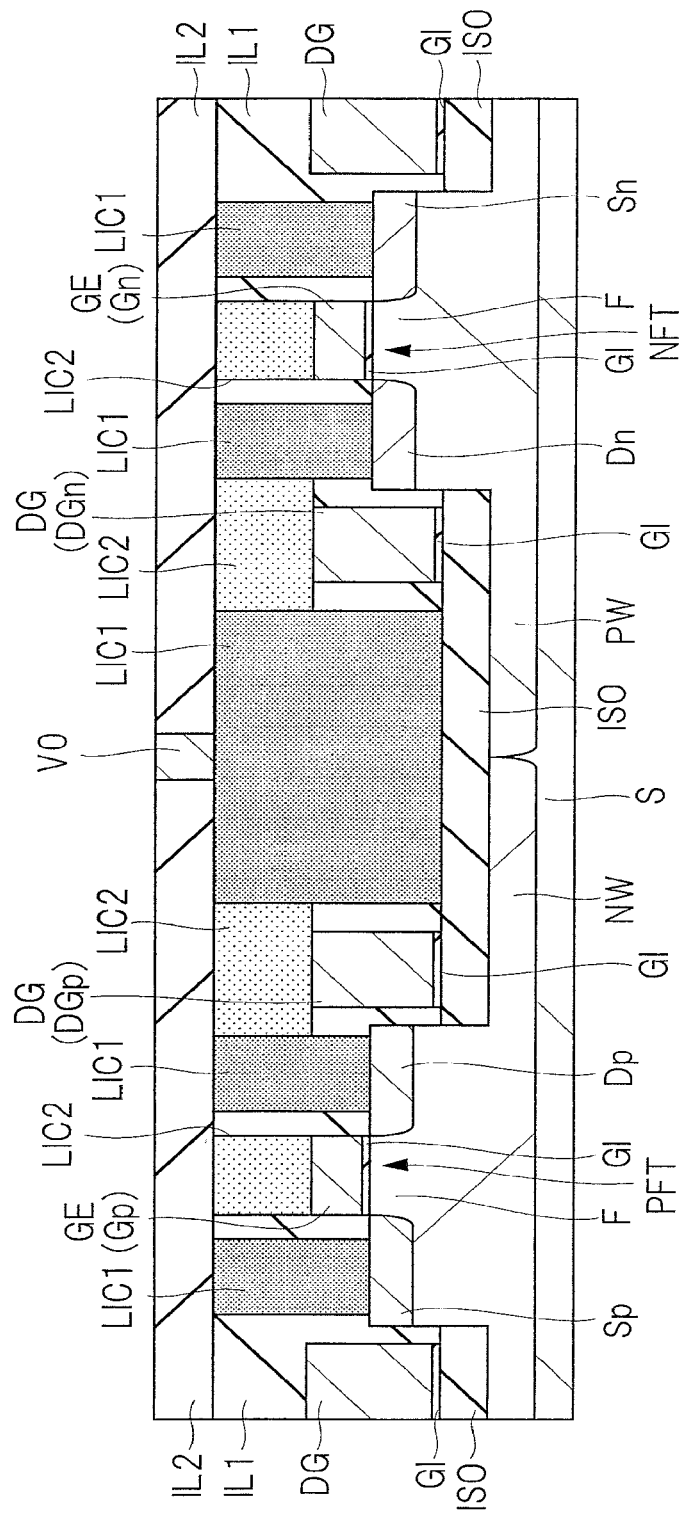
FIG. 18 is a cross-sectional view showing the manufacturing process for the semiconductor device according to the first embodiment, continued from FIG. 16.

Subsequently, as shown in FIGS. 17 and 18, an interlayer insulating film IL2 is formed, and a via (connecting portion) V0 is formed in the interlayer insulting film IL2. For example, a silicon oxide film is deposited on the semiconductor substrate S by the CVD method, etc., and a surface thereof is flattened by the CMP method, etc., to form the interlayer insulating film IL2 on the local interconnects LIC1 and LIC2. Subsequently, the interlayer insulating film IL2 on the local interconnects LIC1 and LIC2 is etched to form a via hole. Subsequently, the via V0 is formed by filling the via hole formed in the interlayer insulating film IL2 with a conductive film. For example, the conductive film is deposited on the interlayer insulating film IL2 including the via hole by a sputtering method, etc. Subsequently, a conductive film outside the via hole is removed by an etching back method, a CMP method, etc.

Figure 19:
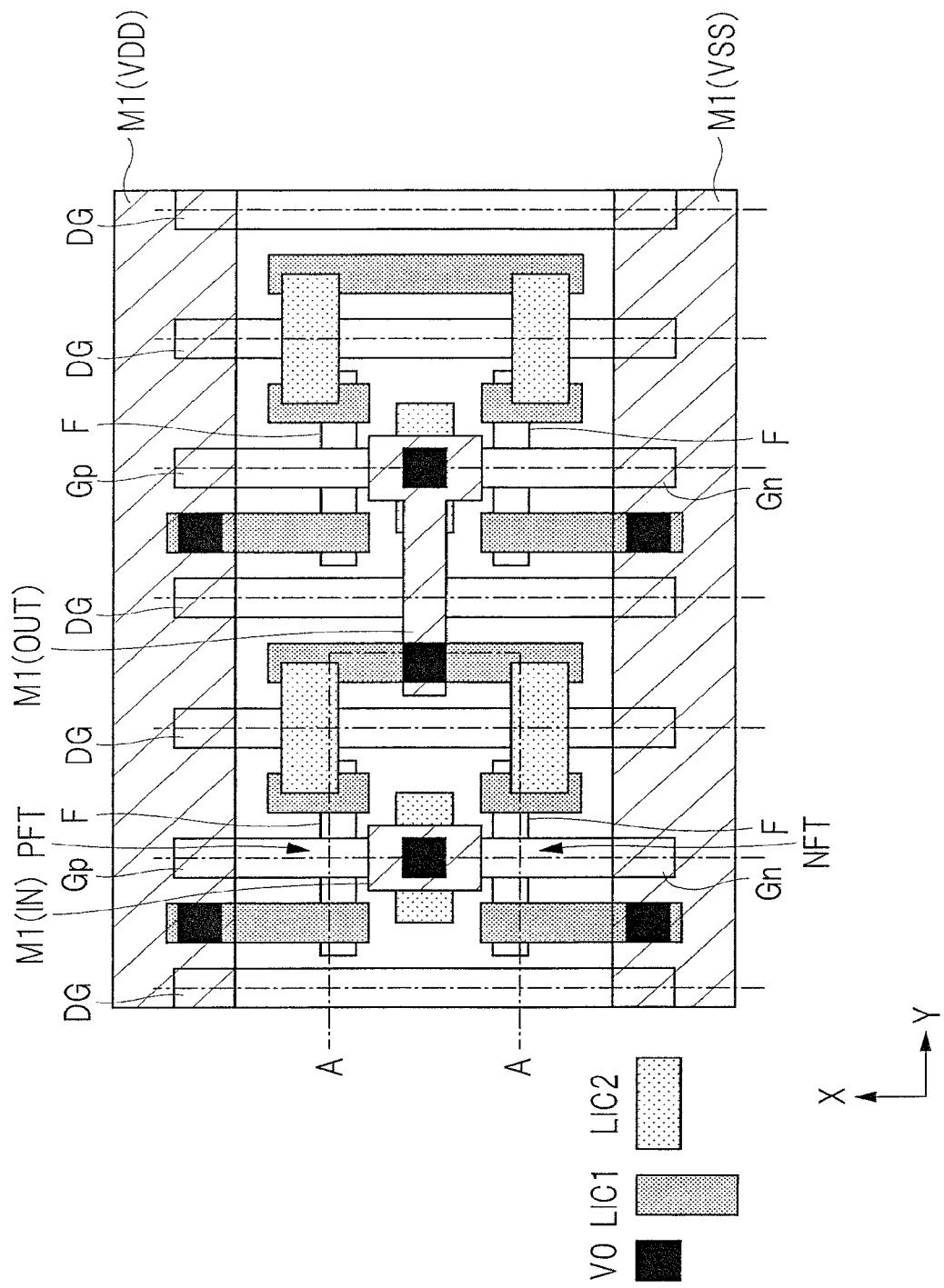
FIG. 19 is a plan view showing the manufacturing process for the semiconductor device according to the first embodiment, continued from FIG. 17.
Figure 20:
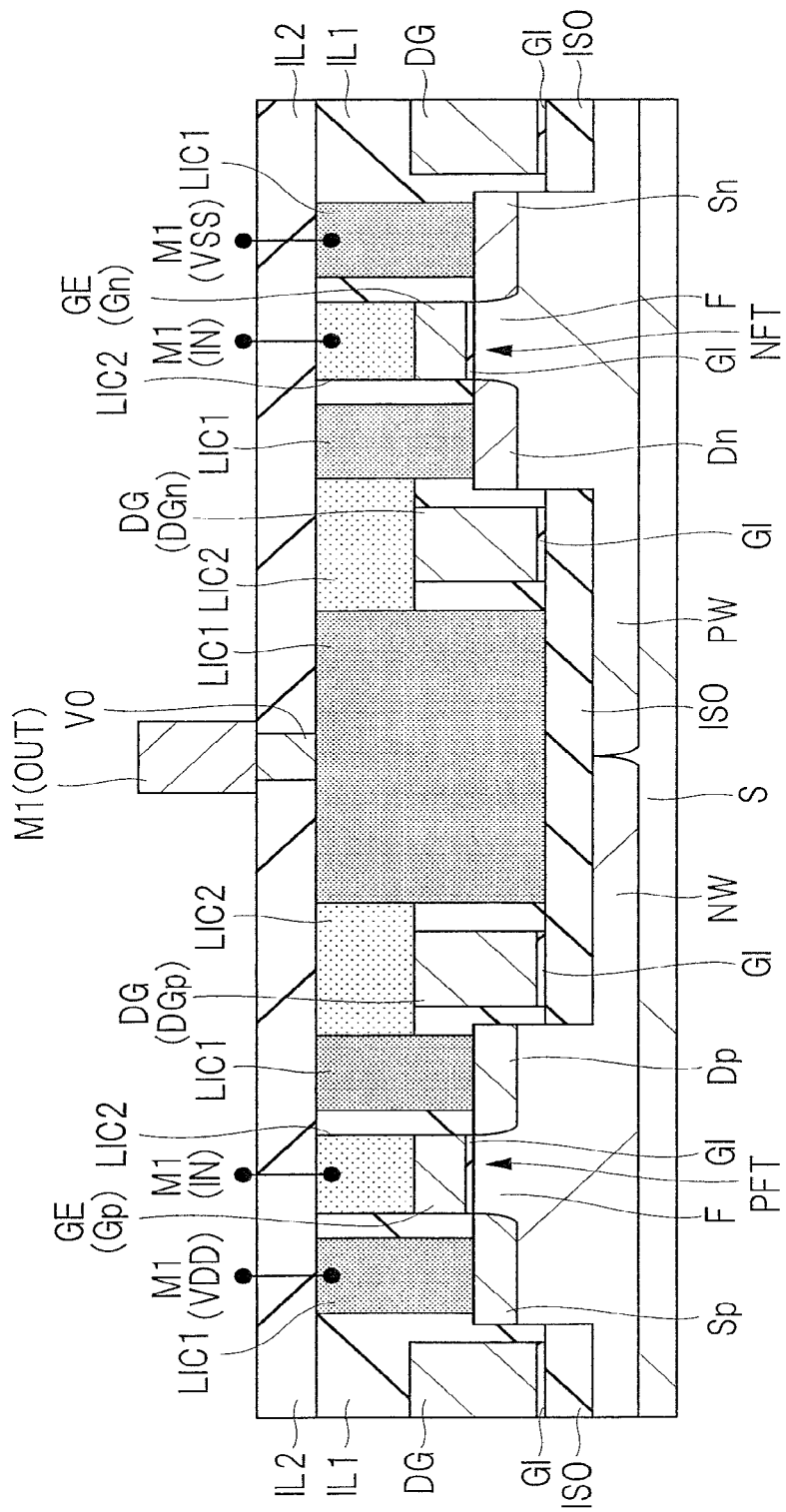
FIG. 20 is a cross-sectional view showing the manufacturing process for the semiconductor device according to the first embodiment, continued from FIG. 18.

Subsequently, as shown in FIGS. 19 and 20, the wiring M1 is formed on the interlayer insulating film IL2. For example, a conductive film is deposited on the interlayer insulating film IL2 by a sputtering method, etc., and is patterned to form the wiring M1. After this, a multilayer wiring may be formed by repeating processes of forming an interlayer insulating film, a connecting portion (plug), and a wiring. The wiring may be formed by patterning a conductive film or by using the so-called damascene method. In the damascene method, a wiring trench is formed in an insulating film, and a conductive film is buried in the wiring trench, to form the wiring.

By the above-described processes, the semiconductor device of the present embodiment can be manufactured.

Figure 21:
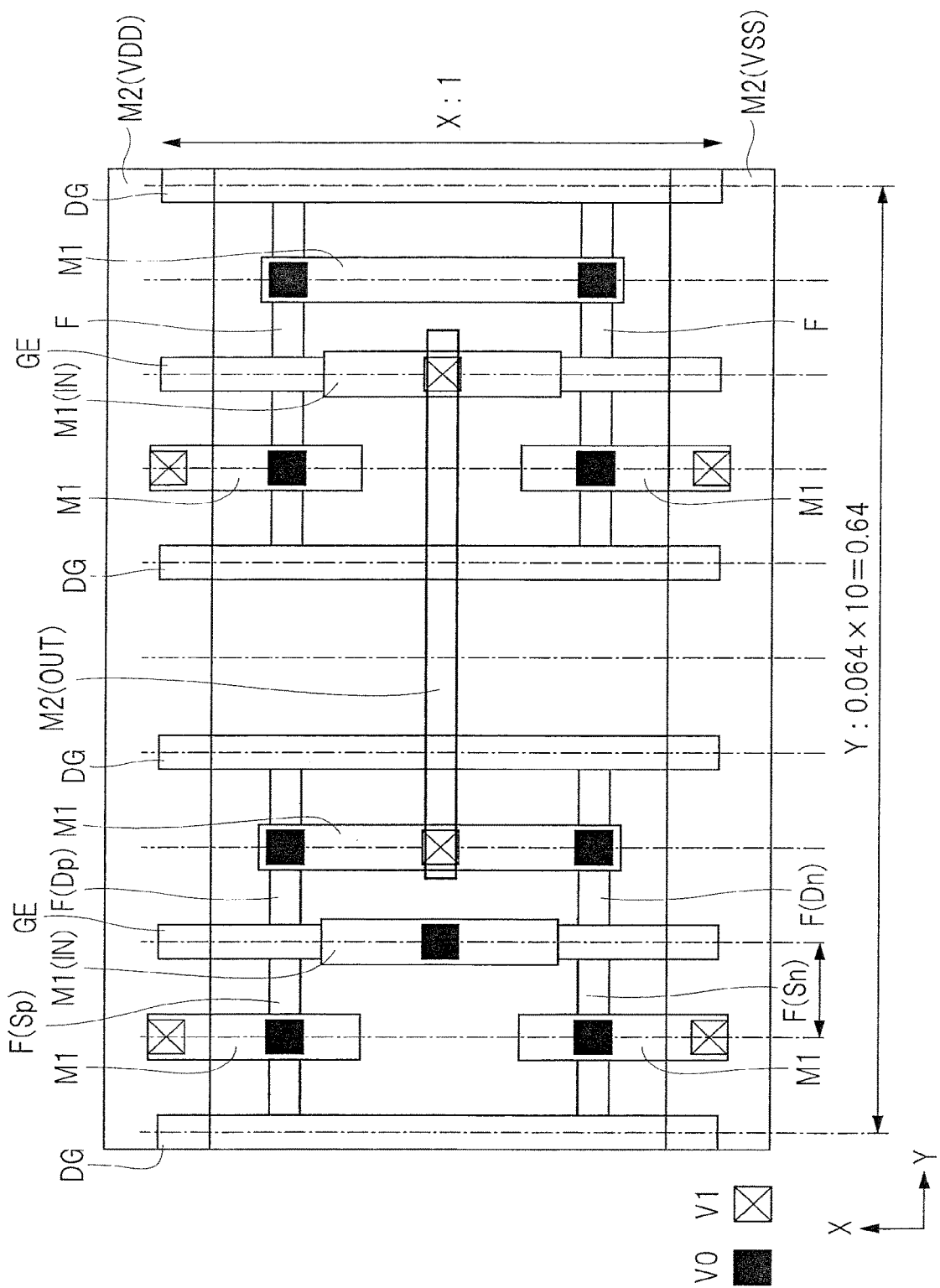
FIG. 21 is a plan view showing a configuration of a semiconductor device of a first comparison example.
Figure 22:
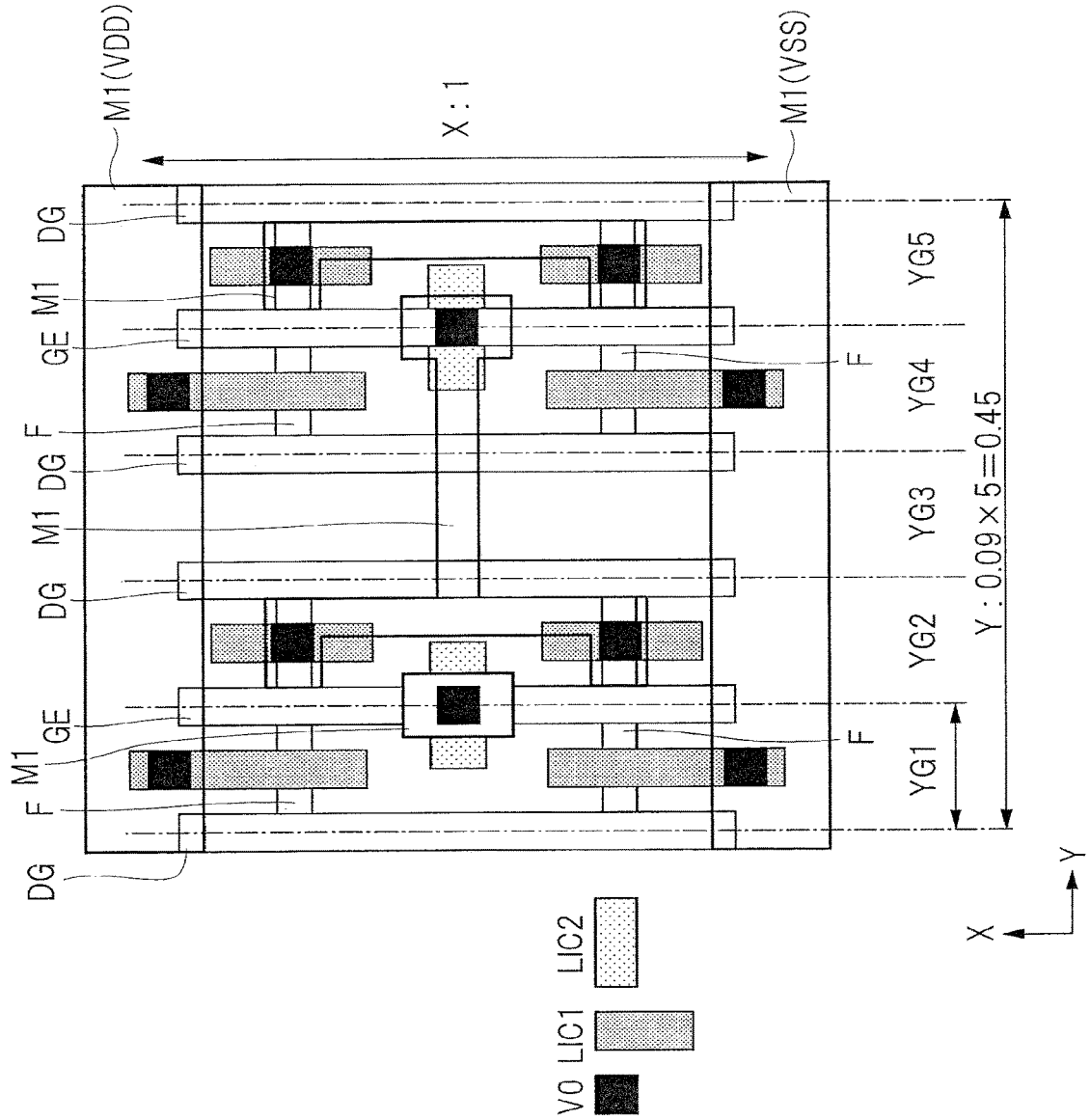
FIG. 22 is a plan view showing a configuration of a semiconductor device of a second comparison example.
Figure 23:
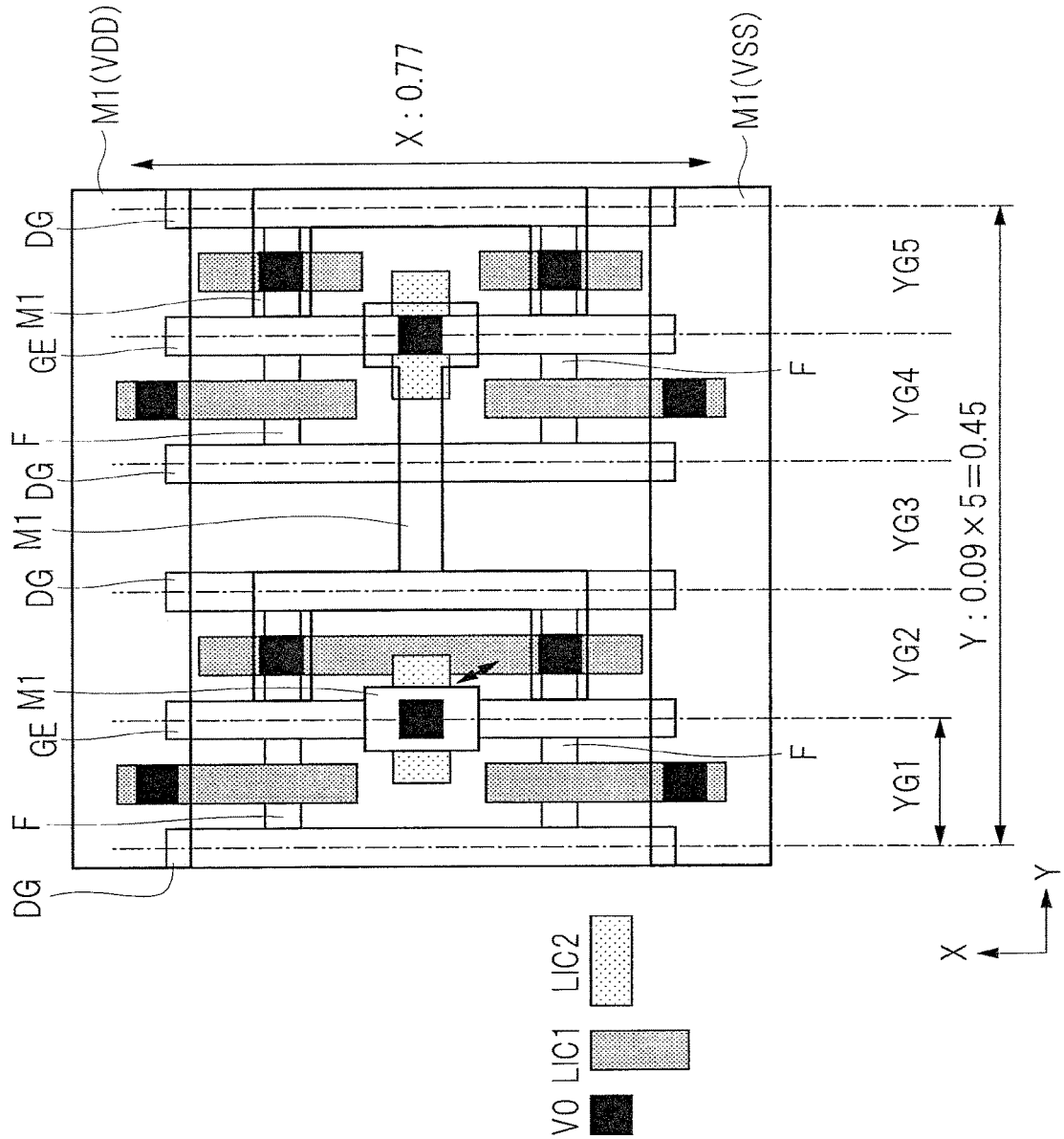
FIG. 23 is a plan view showing a configuration of a semiconductor device of a third comparison example.

According to a cell layout of the semiconductor device of the present embodiment, a forming area (cell area) can be reduced. Particularly, a layout restriction of design rules for a semiconductor device having an FINFET is strict, and therefore, such devised layout topology as described in the present embodiment is essential in order to achieve a standard cell with a small area. The effectiveness of the cell layout of the semiconductor device of the present embodiment will be described below with reference to first to third comparison examples. FIGS. 21 to 23 are plan views showing configurations of semiconductor devices of first to third comparison examples, respectively. In FIGS. 21 to 23, the components corresponding to those in FIG. 2, etc., are denoted by the same reference symbols, and are omitted in detailed description.

In a cell layout of the first comparison example shown in FIG. 21, the drain regions (Dp, Dn) are connected through a wiring M1. A wiring M1 is formed also on the source region Sp and on the source region Sn, and a wiring M1 (IN) is formed also on the gate electrode GE. The output portion of the inverter at the front stage (the left inverter in FIG. 21) and the input portion of the inverter at the rear stage (the right inverter in FIG. 21) are connected through a via V1 and a wiring M2 (OUT). In such a layout, the interval in the Y direction is determined to be 0.064 based on the minimum wiring pitch. The length of the unit cell in the Y direction is determined to be 0.064×10=0.64 μm, the length thereof in the X direction determined to be 1 μm, and the cell area of the unit cell of FIG. 21 is 0.64 μm².

Accordingly, as described in the second comparison example shown in FIG. 22, such a layout that the length in the Y direction is shortened by providing the local interconnects LIC1 and LIC2 to the Y grids YG1, YG2, YG4, and YG5 is considered. In such a layout, the interval in the Y direction is determined to be 0.09, the length of the unit cell in the Y direction is determined to be 0.09×5=0.45 μm, and the length thereof in the X direction is determined to be 1 μm, so that the area of the unit cell of FIG. 22 is 0.45 μm².

And, when such a layout that the length thereof in the X direction is shortened to be 0.77 μm as described in the third comparison example shown in FIG. 23 is considered, the area of the unit cell can be reduced, however, the distance between the local interconnect LIC1 and the local interconnect LIC2 is also reduced or they are adversely connected to each other (see an arrow part in FIG. 23).

On the other hand, as described above with reference to FIG. 2 in the present embodiment, the drain regions (Dp, Dn) are extracted from the Y grid YG2 between the gate electrode GE and the dummy gate DG adjacent thereto, to the Y grid YG3 adjacent to the Y grid G2, by two local interconnects LIC2, respectively. And, these local interconnects LIC2 are connected by the local interconnect LIC1 extending in the X direction in the Y grid YG3. Therefore, although the number of grids is increased by one, the length thereof in the X direction is reduced to be, for example, 0.77 μm.

As a result, the area of the unit cell can be reduced while a space between the local interconnects LIC1 and LIC2 are secured. Specifically, the cell area can be reduced (to be 0.4158 μm$^2$) smaller than the cell area (0.64 μm$^2$) of the first comparison example and the cell area (0.45 μm$^2$) of the second comparison example. In other words, the cell area can be reduced to be about 35% of the first comparison example (0.64 μm$^2$) and about 7.5% of the cell area of the second comparison example (0.45 μm$^2$).

In this manner, according to the cell layout of the semiconductor device of the present embodiment, the forming area (cell area) of the semiconductor device can be reduced. And, high integration of the semiconductor element can be achieved.

Second Embodiment

According to the first embodiment, the fin F is arranged so as to cross the gate electrode GE only. However, the fin F may be extended to a portion below each of the dummy gates DG located on both sides of the gate electrode GE.

Figure 24:
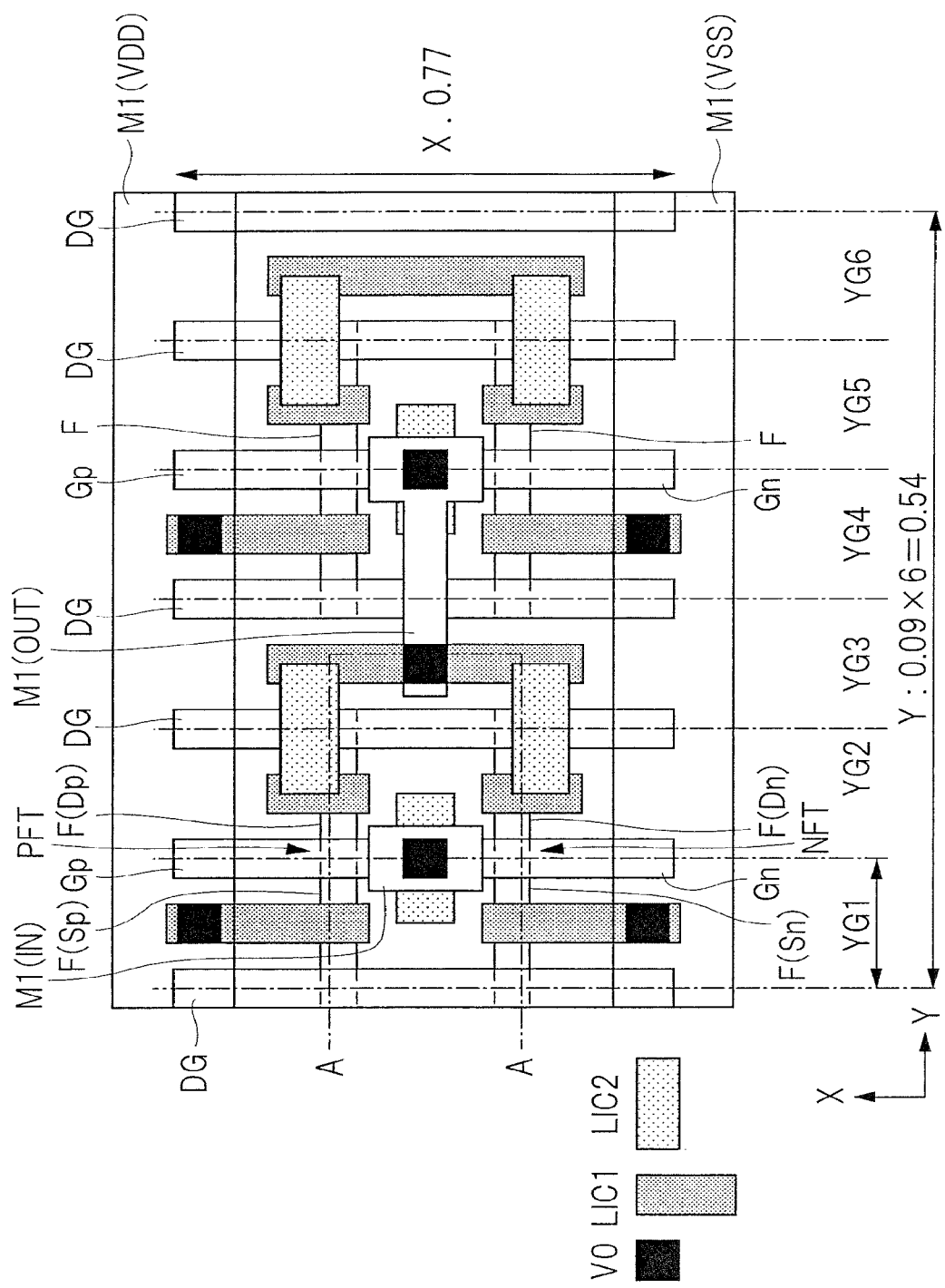
FIG. 24 is a plan view showing a configuration of a semiconductor device of a second embodiment.
Figure 25:
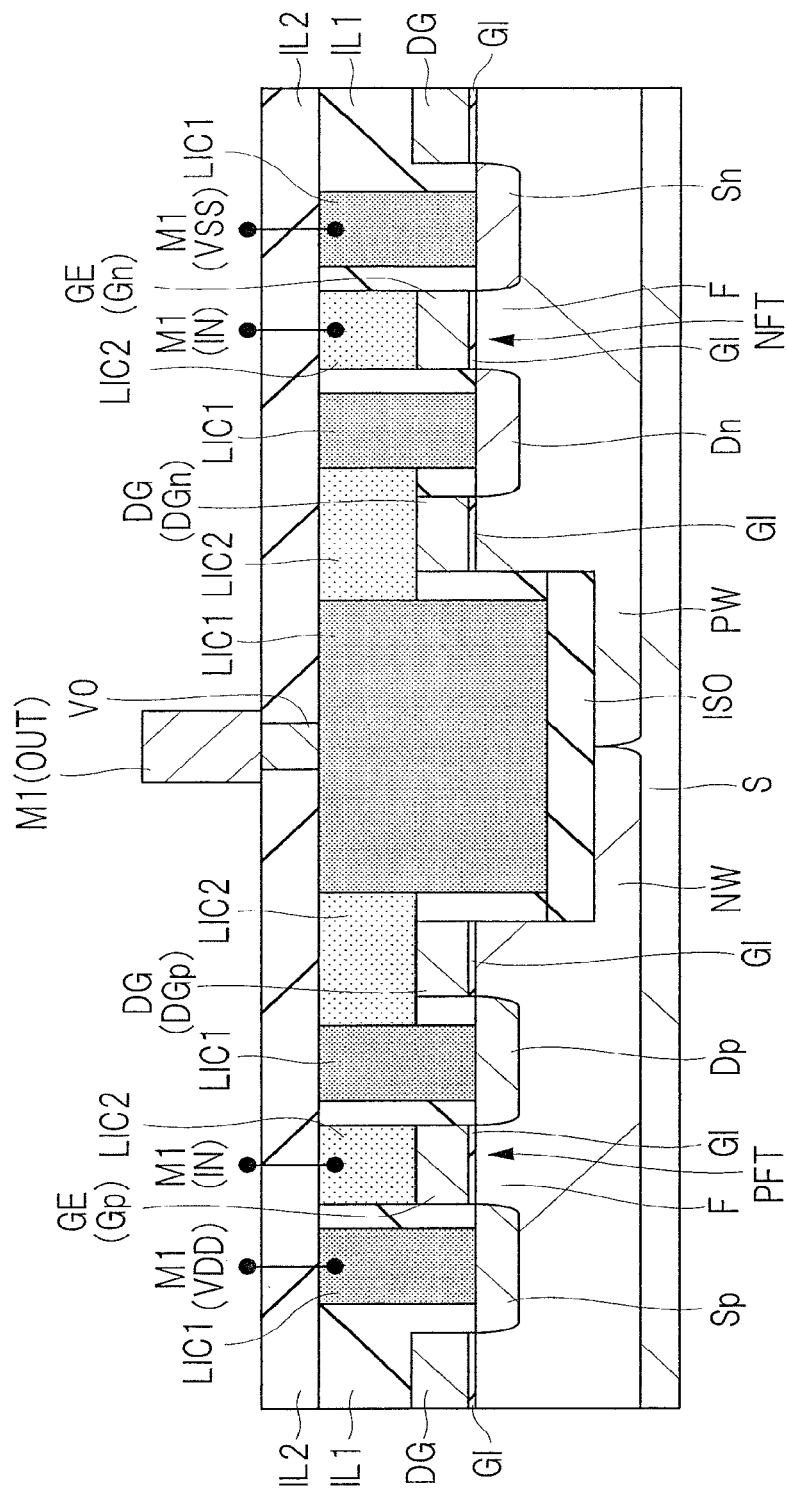
FIG. 25 is a cross-sectional view showing a configuration of a semiconductor device of the second embodiment.

FIG. 24 is a plan view of a configuration showing a configuration of a semiconductor device according to the present embodiment. FIG. 25 is a cross-sectional view showing the configuration of the semiconductor device according to the present embodiment. The cross-sectional view of FIG. 25 corresponds to, for example, a cross section taken along a line A-A of the plan view of FIG. 24. Note that a circuit diagram showing the configuration of the semiconductor device according to the present embodiment is the same as the circuit diagram of the first embodiment (FIG. 4).

Figure 26:
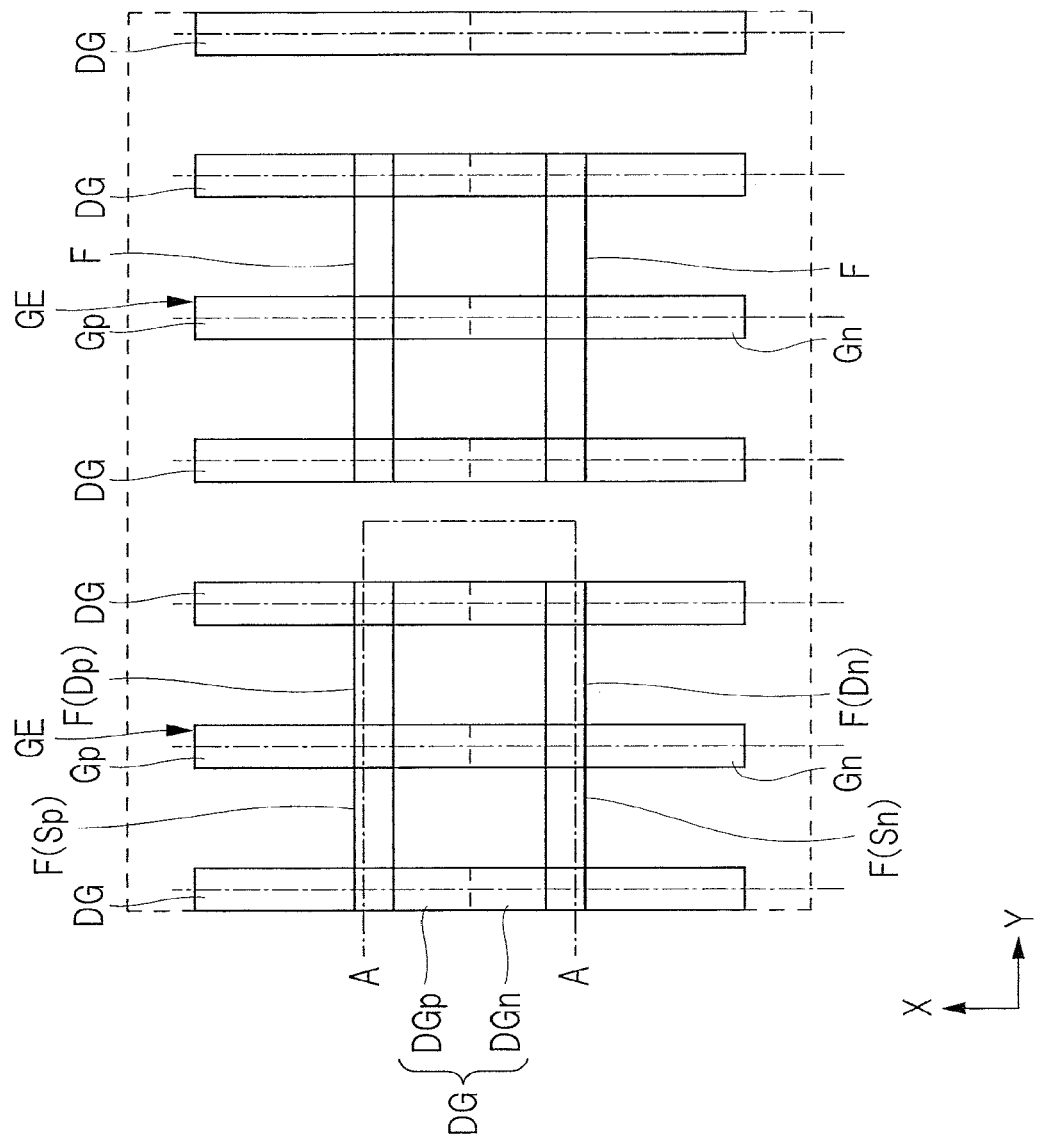
FIG. 26 is a plan view showing a positional relation among a fin, a gate electrode, and a dummy gate according to the second embodiment.

The semiconductor device of the present embodiment has the same configuration as the semiconductor device of the first embodiment except for the configuration of the fin F, and therefore, detailed description of the semiconductor device will be omitted except for the configuration of the fin F. FIG. 26 is a plan view showing the positional relation between the fin F, the gate electrode GE, and the dummy gate DG.

The semiconductor device of the present embodiment includes the FINFETs formed on the main surfaces of the fins F as similar to the semiconductor device of the first embodiment. Here, the n-channel FINFET (NFT) and the p-channel FINFET (PFT) are formed, and these FINFETs (NFT, PFT) make up the inverter INV1 (see FIGS. 24 and 4).

As shown in FIGS. 24 and 26, the planar shape of each fin F is a linear shape having a certain width (length in the X direction) (a rectangular shape with long sides extending in the Y direction). In FIGS. 24 and 26, two by two, i.e., four fins F arranged in two rows×two columns are arranged at a certain interval (pitch). Two left fins F shown in FIG. 2 are the fins F making up the inverter INV1. And, two right fins F are the fins F making up the inverter INV2. In the present embodiment, the fins F extend to places below the dummy gates DG. Note that the dummy gates DG are arranged on the fins F through the gate insulating film GI. However, no fin F is formed on one side of the dummy gate DG (right side in FIG. 26), and therefore, an ON state is not generated, and there is no problem on circuit operations.

As shown in FIGS. 24 and 26, the planar shape of each gate electrode GE is a linear shape having a certain width (length in the Y direction) (a rectangular shape with long sides extending in the X direction). In this manner, the gate electrode GE extends in a direction of crossing the fins F. Here, in addition to the gate electrode GE extending in the direction of crossing the fin F, the dummy gate DG is also provided. Each dummy gate DG has the same configuration with the gate electrode GE. That is, the dummy gate DG also has a linear shape having a certain width (length in the Y direction) (a rectangular shape with long sides extending in the X direction). In FIGS. 24 and 26, seven of the gate electrodes GE and dummy gates DG are arranged at a certain interval (interval in the Y direction). The left gate electrode GE of the gate electrodes GE extending in the direction of crossing the fins F makes up the inverter INV1, while the right gate electrode GE thereof makes up the inverter INV2. Note that the gate electrode GE is made of a conductive film extending integrally in the X direction as similar to the first embodiment. However, in the region for forming the p-channel FINFET (PET), the gate electrode GE is shown as the gate electrode Gp because a p-type impurity is introduced into this region. Also, in the region for forming the n-channel FINFET (NET), the gate electrode GE is shown as the gate electrode Gn because an n-type impurity is injected into this region. The gate electrode GE is made up by these gate electrodes Gp and Gn.

Here, the above-described interval in the Y direction is the reference for determining the length of the unit cell in the Y direction. For example, when the above-described interval in the Y direction is 0.09 μm, the length of the unit cell in the Y direction is determined to be 0.09×6=0.54 μm. Here, when the length thereof in the X direction is 0.77 μm, the cell area of the unit cell of FIG. 24 is calculated at 0.4158 μm$^2$ as similar to the cell area of the first embodiment.

And, as similar to the first embodiment, the source region Sp and the drain region Dp are arranged in the fin F on both sides of the gate electrode GE (Gp), and the local interconnect (LIC1, LIC2) is arranged on the gate electrode GE (Gp), source region Sp, and drain region Dp. The shape (layout) of the local interconnect (LIC1, LIC2) is the same as the shape (layout) of the case of the first embodiment (FIG. 2).

In this manner, also in the present embodiment, as similar to the case of the first embodiment (FIG. 2), the drain regions (Dp, Dn) are extracted from the Y grid YG2 between the gate electrode GE and the dummy gate DG adjacent thereto, to the Y grid YG3 adjacent to the Y grid G2, by two local interconnects LIC2, respectively. And, these local interconnects LIC2 are connected by the local interconnect LIC1 extending in the X direction in the Y grid YG3 (see FIGS. 24 and 25). In this manner, according to the cell layout of the present embodiment, although the number of grids is increased by one to be larger than that of the second comparison example (FIG. 22), the length in the X direction can be shortened to be, for example, 0.77 μm. As a result, the cell area of the unit cell can be reduced while a space between the local interconnects LIC1 and LIC2 is secured.

In this manner, according to the cell layout of the semiconductor device of the present embodiment, the forming area (cell area) of the semiconductor device can be reduced. And, high integration of the semiconductor element can be achieved.

By the long extension of the fins F in the Y direction, the mobility of carriers is improved because of the strain effect. An ON current can be increased. In this manner, by the long extension of the fins F in the Y direction, the characteristics of the FINFET can be improved. In order to obtain such a strain effect, a layer (e.g., SiGe layer) having a different lattice constant from that of Si or others may be formed on the source region and the drain region. Also in such a case, by the long extension of the fins F in the Y direction, the mobility of carriers can be improved without moderating the strain effect.

Note that the semiconductor device of the present embodiment can be formed by the same processes as those of the first embodiment.

Third Embodiment

In the first embodiment, the fins F are arranged so as to cross the gate electrode GE only. However, in the unit cell forming region, the fins F may be arranged so as to continuously extend in the Y direction without being cut (see FIG. 28). In this case, the fin F passes through a portion below the dummy gate DG located on both sides of the gate electrode GE, and extends to the Y grid adjacent to the dummy gate DG.

Figure 27:
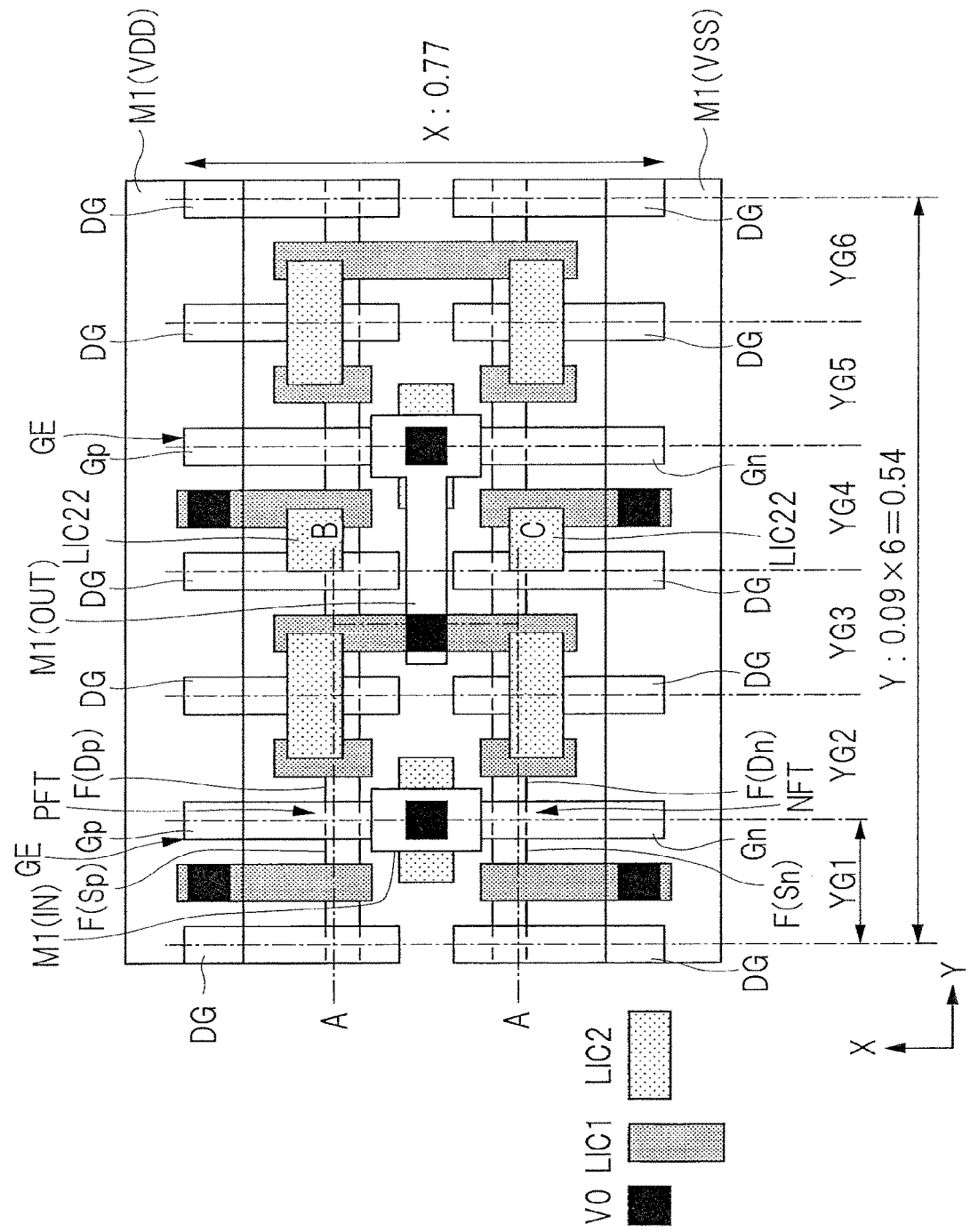
FIG. 27 is a plan view showing a configuration of a semiconductor device according to a third embodiment.
Figure 28:
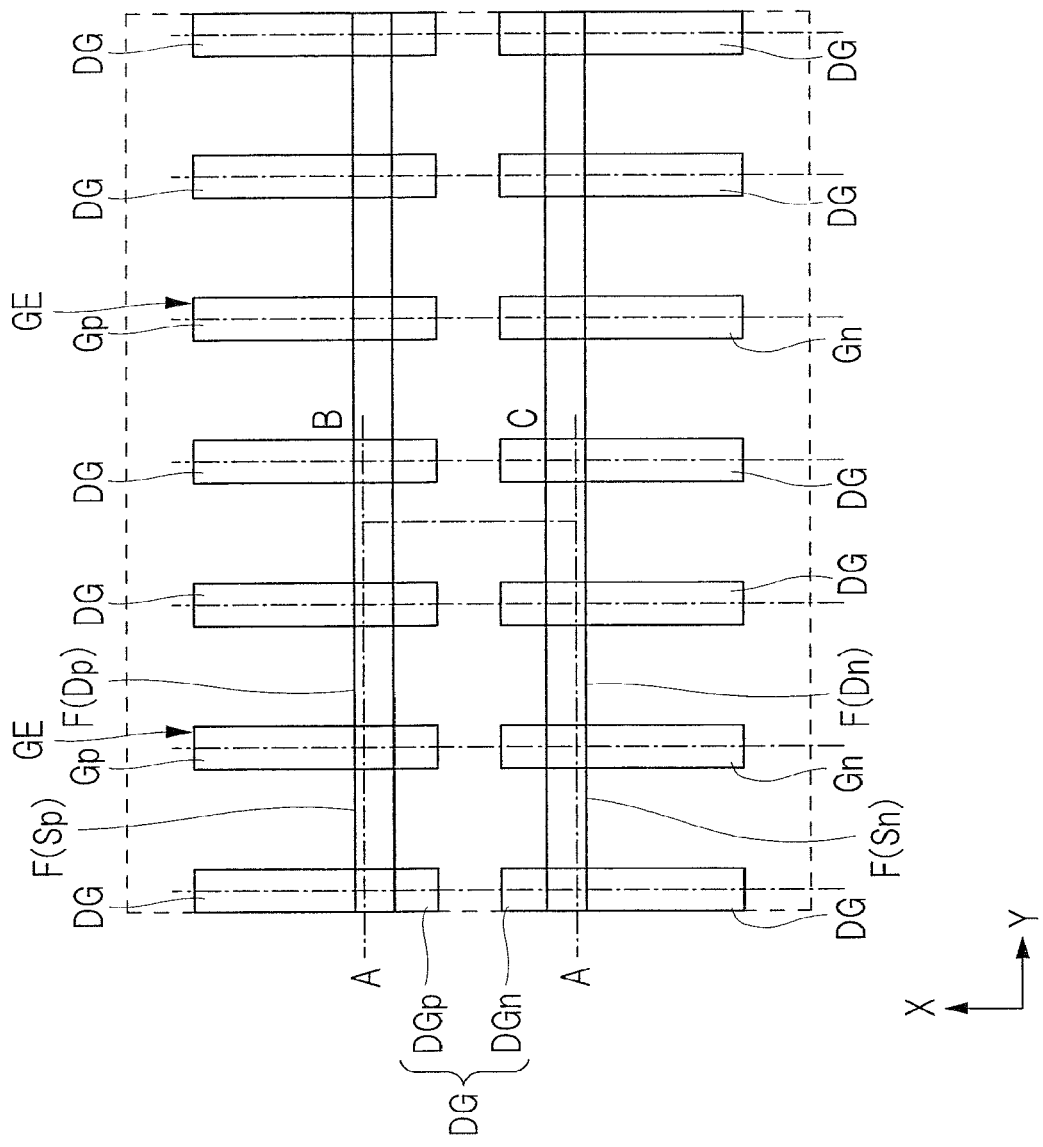
FIG. 28 is a plan view showing a positional relation among a fin, a gate electrode, and a dummy gate according to the third embodiment.
Figure 29:
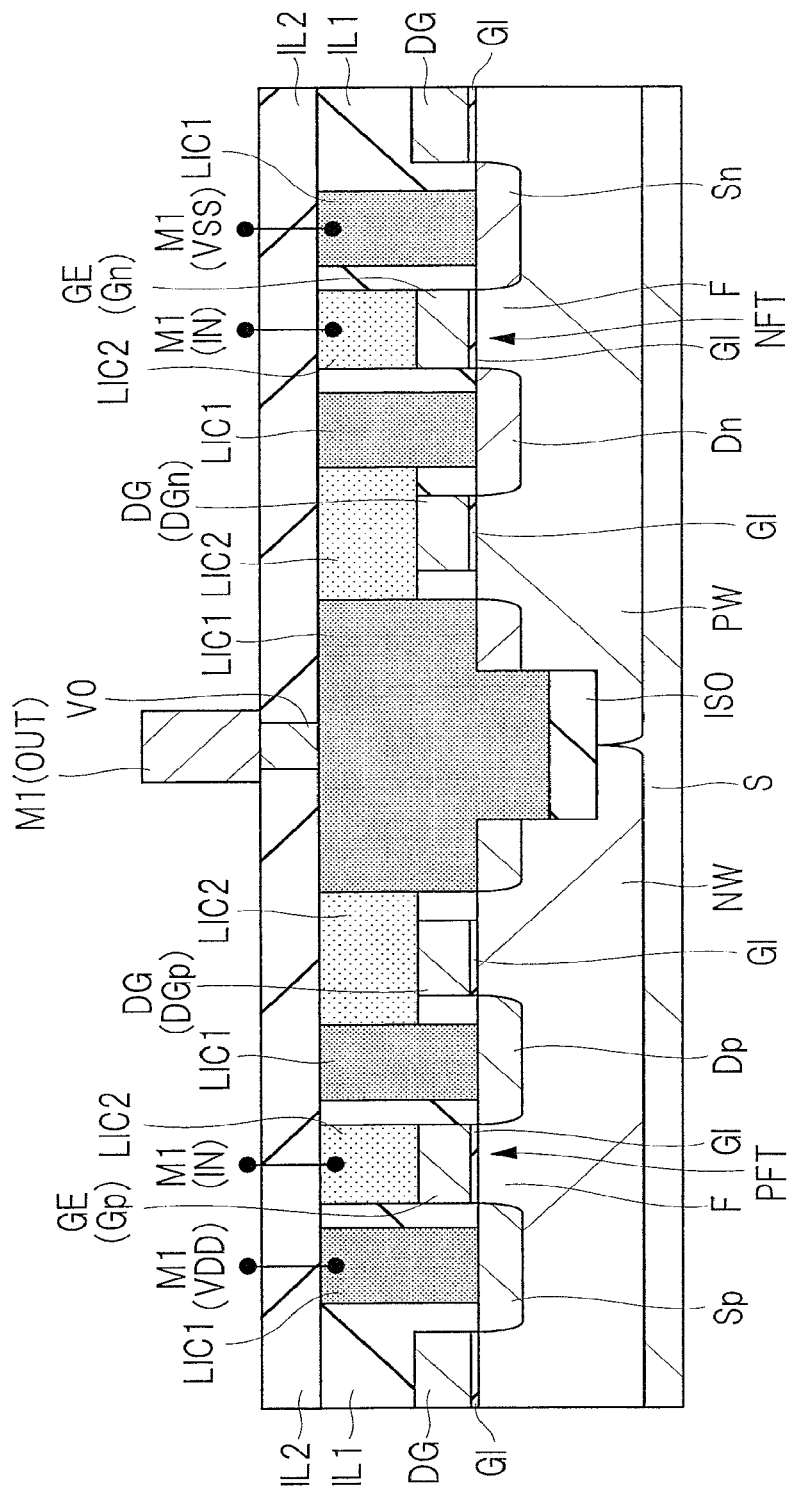
FIG. 29 is a cross-sectional view showing a configuration of the semiconductor device according to the third embodiment.
Figure 30:
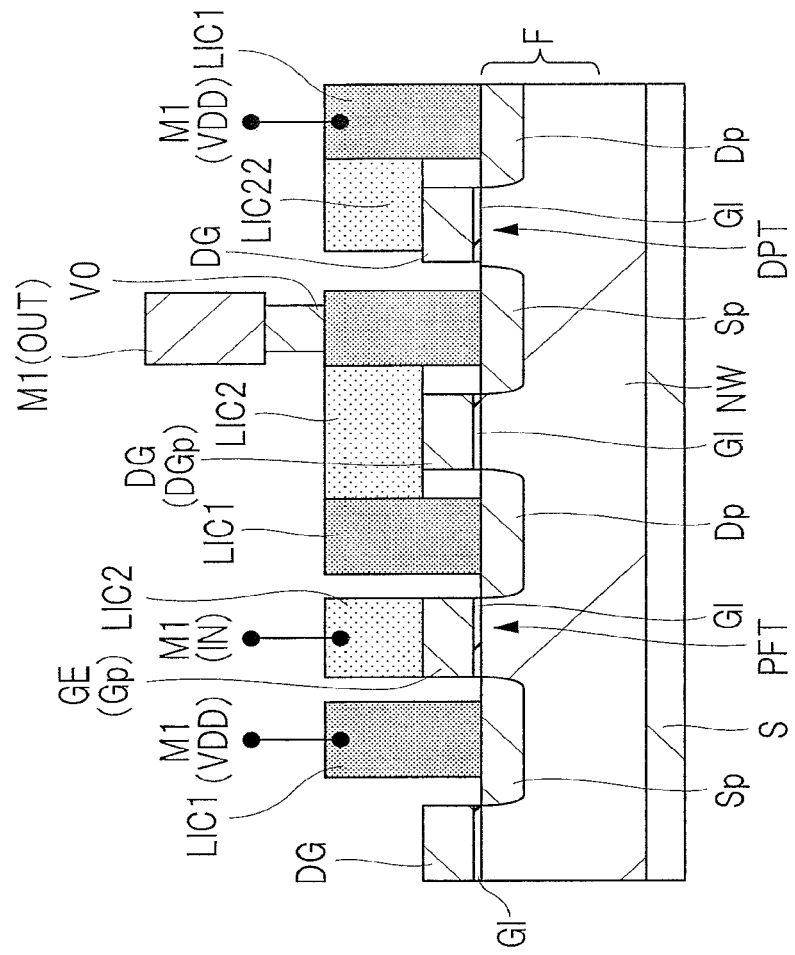
FIG. 30 is a cross-sectional view showing a configuration of the semiconductor device according to the third embodiment.
Figure 31:
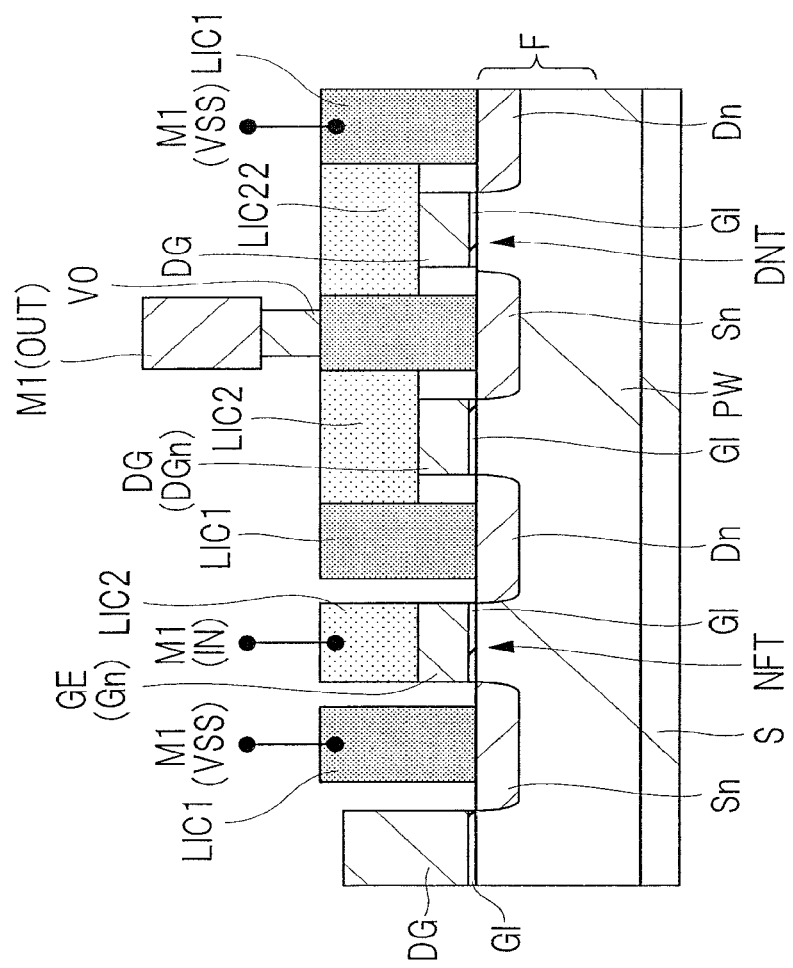
FIG. 31 is a cross-sectional view showing a configuration of the semiconductor device according to the third embodiment.
Figure 32:
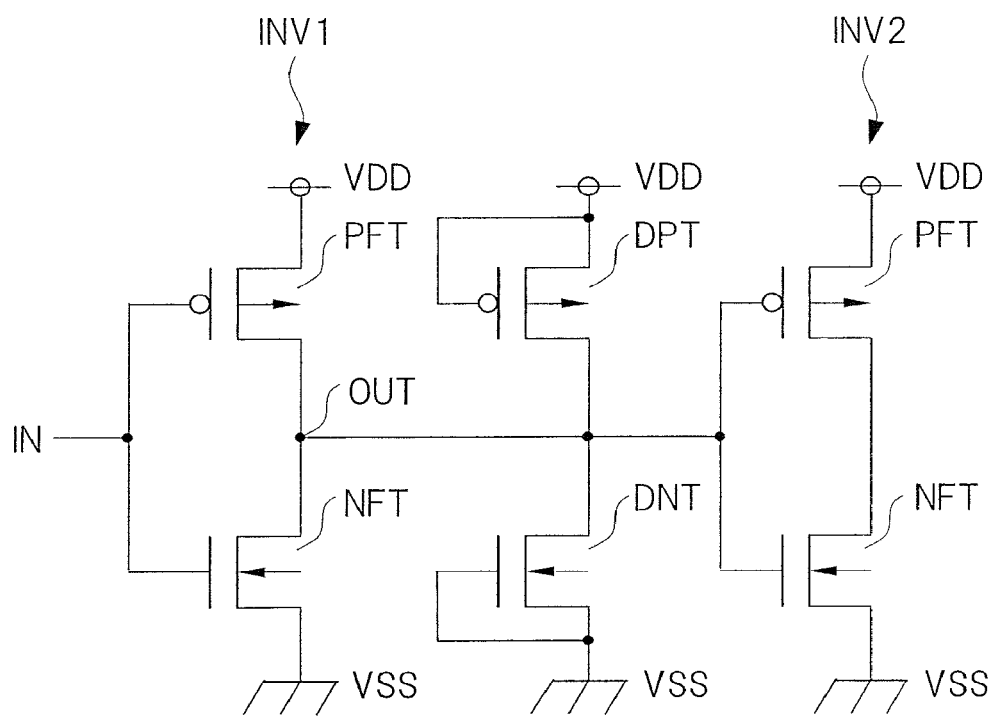
FIG. 32 is a circuit diagram showing the configuration of the semiconductor device according to the third embodiment.

FIG. 27 is a plan view showing a configuration of a semiconductor device according to the present embodiment. FIG. 28 is a plan view showing the positional relation between the fin F, gate electrode GE, and dummy gate DG. FIGS. 29 to 31 are cross-sectional views showing the configuration of the semiconductor device according to the present embodiment. The cross-sectional view of FIG. 29 corresponds to, for example, across section taken along a line A-A of the plan view of FIG. 27. The cross-sectional view of FIG. 30 corresponds to, for example, across section taken along a line A-B of the plan view of FIG. 27, and the cross-sectional view of FIG. 31 corresponds to, for example, across section taken along a line A-C of the plan view of FIG. 27. FIG. 32 is a circuit diagram showing the configuration of the semiconductor device according to the present embodiment. Note that the semiconductor device of the present embodiment has the same configuration with the semiconductor device of the first embodiment except for the configuration of the fin F, and therefore, detailed description of the semiconductor device of the present embodiment will be omitted except for the configuration of the fin F.

The semiconductor device of the present embodiment includes the FINFET formed on the main surface of the fin F as similar to the semiconductor device of the first embodiment. Here, the n-channel FINFET (NFT) and the p-channel FINFET (PFT) are formed in the left-half region of the region for forming the unit cell, and these FINFETs (NFT, PFT) make up the inverter INV1 (see FIGS. 27 and 32). The FINFETs (NFT, PFT) in the right-half region of the region for forming the unit cell make up the inverter INV2.

As shown in FIGS. 27 and 28, the planar shape of each fin F is a linear shape having a certain width (length in the X direction) (a rectangular shape with long sides extending in the Y direction). In FIGS. 27 and 28, two fins F are arranged in parallel with each other across a certain interval (pitch). The fin F located in the left-half region among two fins F shown in FIG. 27 make up the inverter INV1. And, the fin F located in the right-half region among the two fins F shown in FIG. 27 make up the inverter INV2. In the present embodiment, the fins F extend in the Y direction, from one end to the other end of the unit cell forming region (see FIG. 28). In other words, the fins F are formed so as to pass through portions below seven of the gate electrodes GE and dummy gates DG formed in the unit cell forming region.

As shown in FIGS. 27 and 28, the planar shape of each gate electrode GE is a linear shape having a certain width (length in the Y direction) (a rectangular shape with long sides extending in the X direction). As described above, the gate electrode GE extends in a direction of crossing the fins F. The dummy gates DG are arranged on both sides of the gate electrode GE. However, in FIG. 27, the dummy gate DG is divided at a boundary between the region for forming the p-channel FINFET (PFT) and the region for forming the n-channel FINFET (NFT). In other words, the dummy gate DG is formed individually in the upper-half region and lower-half region of the unit cell of FIG. 27. Note that the dummy gates DG on the same line may be connected together.

In FIGS. 27 and 28, seven of the gate electrodes GE and dummy gates DG are arranged at a certain interval (interval in the Y direction) (see FIG. 28). The left gate electrode GE of the gate electrodes GE extending in the direction of crossing the fins F is the gate electrode GE making up the inverter INV1, while the right gate electrode GE thereof is the gate electrode GE making up the inverter INV2.

Note that the gate electrode GE is made of a conductive film extending integrally in the X direction as similar to the gate electrode GE of the first embodiment. However, in the region for forming the p-channel FINFET (PET), the gate electrode GE is shown as the gate electrode Gp in this region because a p-type impurity is introduced thereto. Also, in the region for forming the n-channel FINFET (NET), the gate electrode GE is shown as the gate electrode Gn in this region because an n-type impurity is introduced thereto. The gate electrode GE is made up by these gate electrodes Gp and Gn.

Here, the above-described interval in the Y direction is the reference for determining the length of the unit cell in the Y direction. For example, when the interval in the Y direction is 0.09 µm, the length of the unit cell in the Y direction is determined to be 0.09×6=0.54 µm. Here, when the length thereof in the X direction is 0.77 µm, the cell area of the unit cell of FIG. 24 is calculated at 0.4158 µm$^2$ as similar to the cell area of the first embodiment.

And, as similar to the first embodiment, the source region Sp and the drain region Dp are formed in the fin F on both sides of the gate electrode GE (Gp), and the local interconnects (LIC1, LIC2) are arranged on the gate electrode GE (Gp), source region Sp, and drain region Dp. The shape (layout) of the local interconnect (LIC1, LIC2) is the same as that of the case of the first embodiment (FIG. 2).

Here, two dummy gates DG are arranged between the gate electrode GE making up the inverter INV1 and the gate electrode GE making up the inverter INV2. The dummy gate DG on the inverter INV1 side among these dummy gates is not turned to be ON because no potential difference (between the source and the drain) is generated in the impurity region in the fin F on both sides of the dummy gate DG, and therefore, there is no problem for circuit operations.

Also, a potential of the dummy gate DG on the inverter INV2 side among the two dummy gates is fixed by a local interconnect LIC22, and therefore, is not turned to be ON (also see FIG. 32).

That is, a dummy transistor is made up by the dummy gate DG on the inverter INV2 side and the impurity region in the fin on both sides of the dummy gate. The dummy transistor formed in the upper-half region of the unit cell of FIG. 27 among such dummy transistors is a p-channel dummy transistor (DPT). Therefore, the local interconnect LIC1 connected to the source potential (VDD) and the dummy gate DG are connected by the local interconnect LIC22, so that the potential of the dummy gate DG is fixed to the source potential (VDD) (also see FIG. 30). The dummy transistor formed in the lower-half region of the unit cell of FIG. 27 is an n-channel dummy transistor (DNT). Therefore, the local interconnect LIC1 connected to the ground potential (VSS) and the dummy gate DG are connected by a local interconnect LIC22, so that the potential of the dummy gate DG is fixed to the ground potential (VSS) (also see FIG. 31). In this manner, these dummy transistors are not turned to be ON, so that the influence on circuit operations can be avoided.

In other words, the source region (Sp) of the p-channel FINFET (PFT) making up the inverter INV2 and the dummy gate DG in contact with the source region (Sp) are connected by the local interconnect LIC22. Also, the source region (Sp) of the n-channel FINFET (NFT) making up the inverter INV2 and the dummy gate DG in contact with the source region (Sp) are connected by the local interconnect LIC22. In this manner, no channel is formed below the dummy gate DG, so that the influence on circuit operations can be avoided.

As shown in FIG. 32, also in the semiconductor device of the present embodiment, the inverter INV2 is connected at the rear stage of the inverter INV1. The inverter INV1 has the p-channel FINFET (PFT) and the n-channel FINFET (NFT) that are connected in series between the source potential VDD and the ground potential VSS, a connection point between these FINFETs becomes the output portion (OUT), and the gate electrodes of these FINFETs are connected to the input portion (IN). The inverter INV2 at the rear stage has the same configuration in which the output portion (OUT) of the inverter INV1 is connected to the input portion of the inverter INV2. In the present embodiment, the above-described p-channel dummy transistor DPT and n-channel dummy transistor DNT are connected in series between the source potential VDD and the ground potential VSS, and a connection point between these dummy transistors is connected to the output portion (OUT) of the inverter INV1 and to the input portion of the inverter INV2. However, as described above, the gate electrode of the p-channel dummy transistor DPT is connected to the source potential VDD, while the gate electrode of the n-channel dummy transistor DNT is connected to the ground potential VSS. Therefore, these dummy transistors are not turned to be ON. Therefore, these dummy transistors do not adversely affect the circuit operations.

In this manner, according to the present embodiment, as similar to the first embodiment (FIG. 2), the drain regions (Dp, Dn) are extracted by the two respective local interconnects LIC2 from the Y grid YG2 between the gate electrode GE and the dummy gate DG adjacent thereto, to the Y grid YG3 adjacent to the Y grid G2. And, these two local interconnects LIC2 are connected in the Y grid YG3 by the local interconnect LIC1 extending in the X direction (see FIGS. 27 and 29). In this manner, according to the cell layout of the present embodiment, the number of grids is increased by one so as to be larger than that of the second comparison example (FIG. 22), however, the length in the X direction is shortened to be, for example, 0.77 μm. As a result, the cell area of the unit cell can be reduced while a space between the local interconnects LIC1 and LIC2 is secured.

In this manner, according to the cell layout of the semiconductor device of the present embodiment, the forming area (cell area) of the semiconductor device can be reduced. And, the integration degree of the semiconductor element can be increased.

By largely extending the fins F in the Y direction, the mobility of carriers is improved because of a strain effect. In this manner, the ON current can be increased. As described above, by largely extending the fins F in the Y direction, the characteristics of the FINFET can be improved. In order to obtain such a strain effect, a layer (e.g., SiGe layer) having a different lattice constant from that of Si may be formed on the source region and the drain region. Also in such a case, by largely extending the fins F in the Y direction, the mobility of carriers can be improved without moderating the strain.

Note that the semiconductor device of the present embodiment can be formed by the same processes as those in the first embodiment.

Fourth Embodiment

Figure 33:
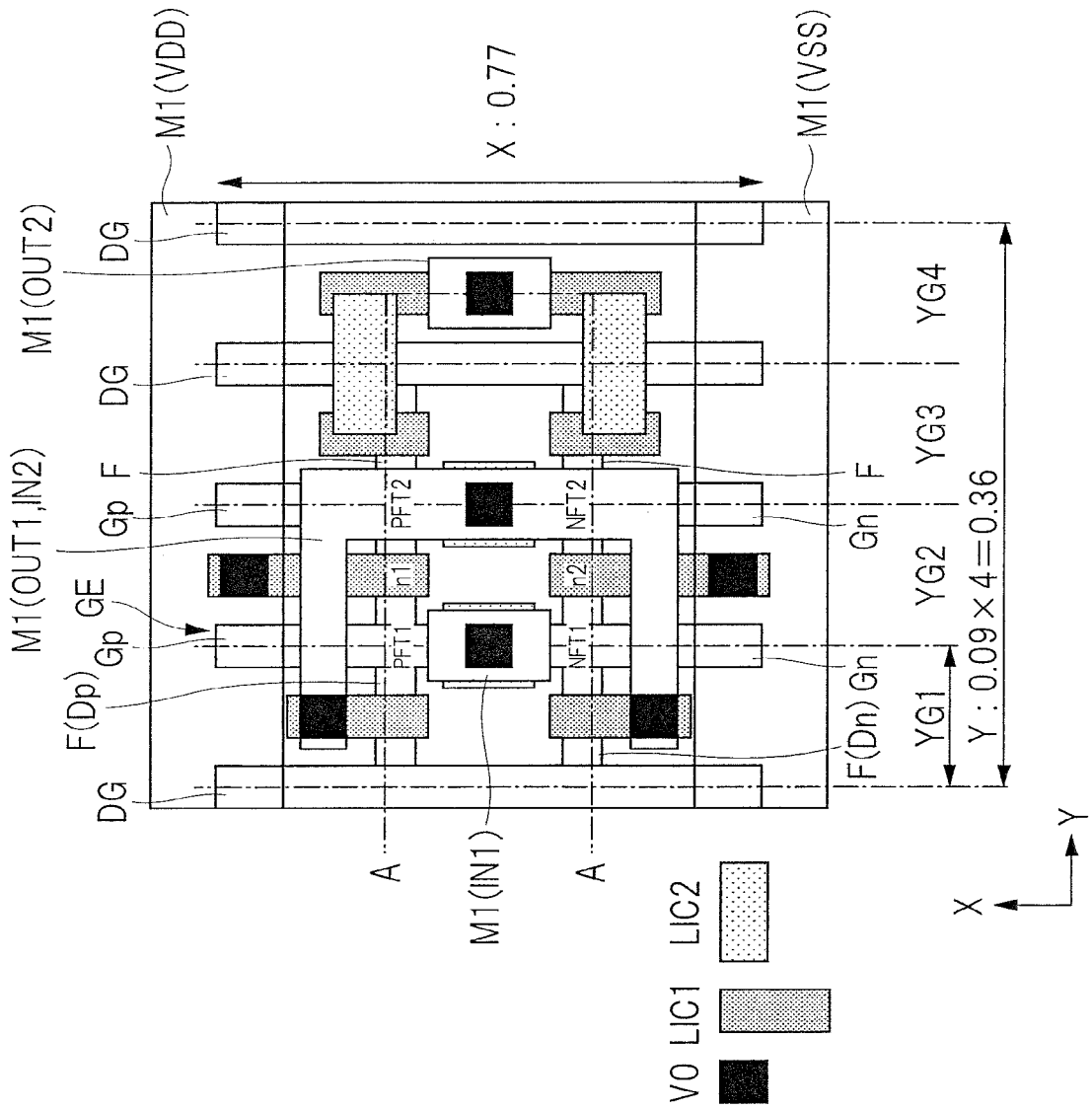
FIG. 33 is a plan view showing a configuration of a semiconductor device according to a fourth embodiment.
Figure 34:
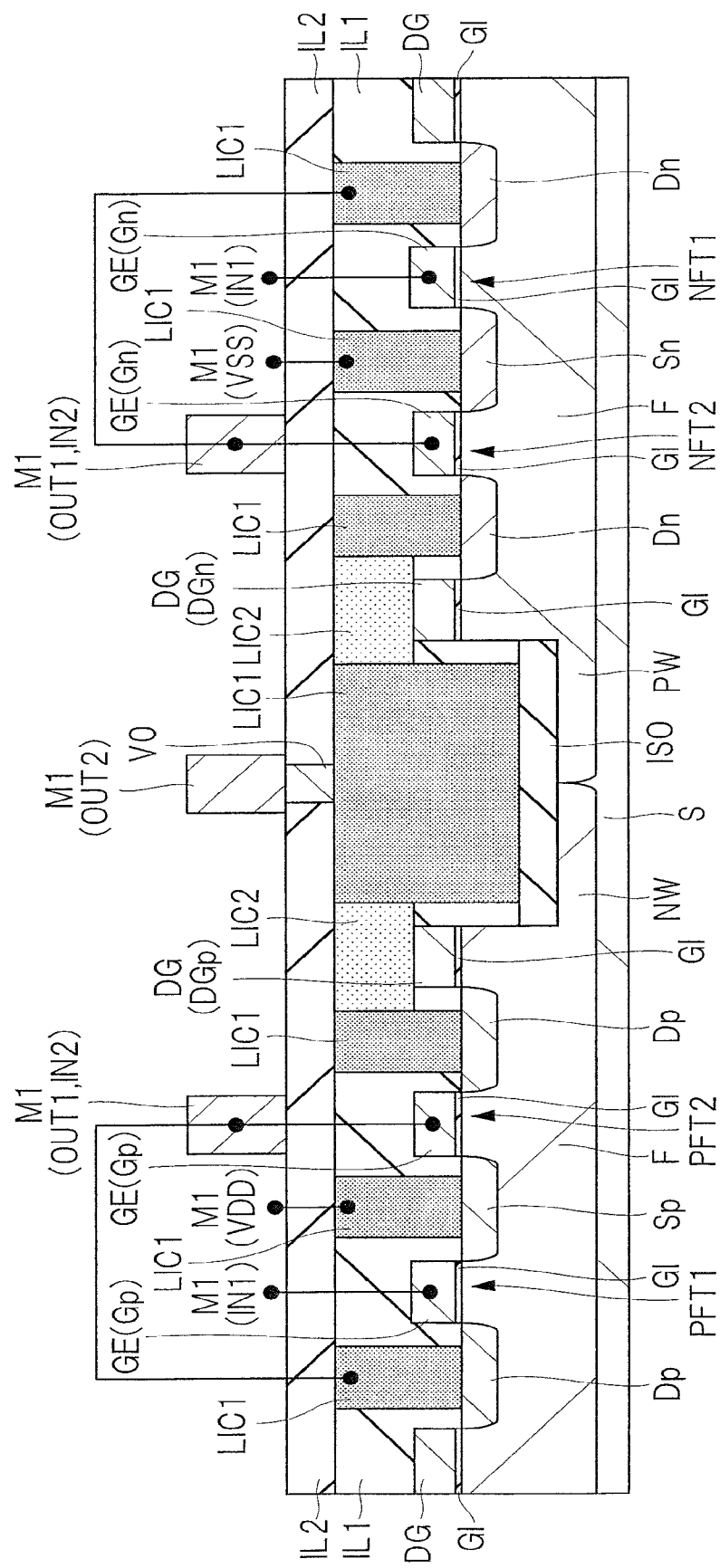
FIG. 34 is a cross-sectional view showing the configuration of the semiconductor device according to the fourth embodiment.
Figure 35:
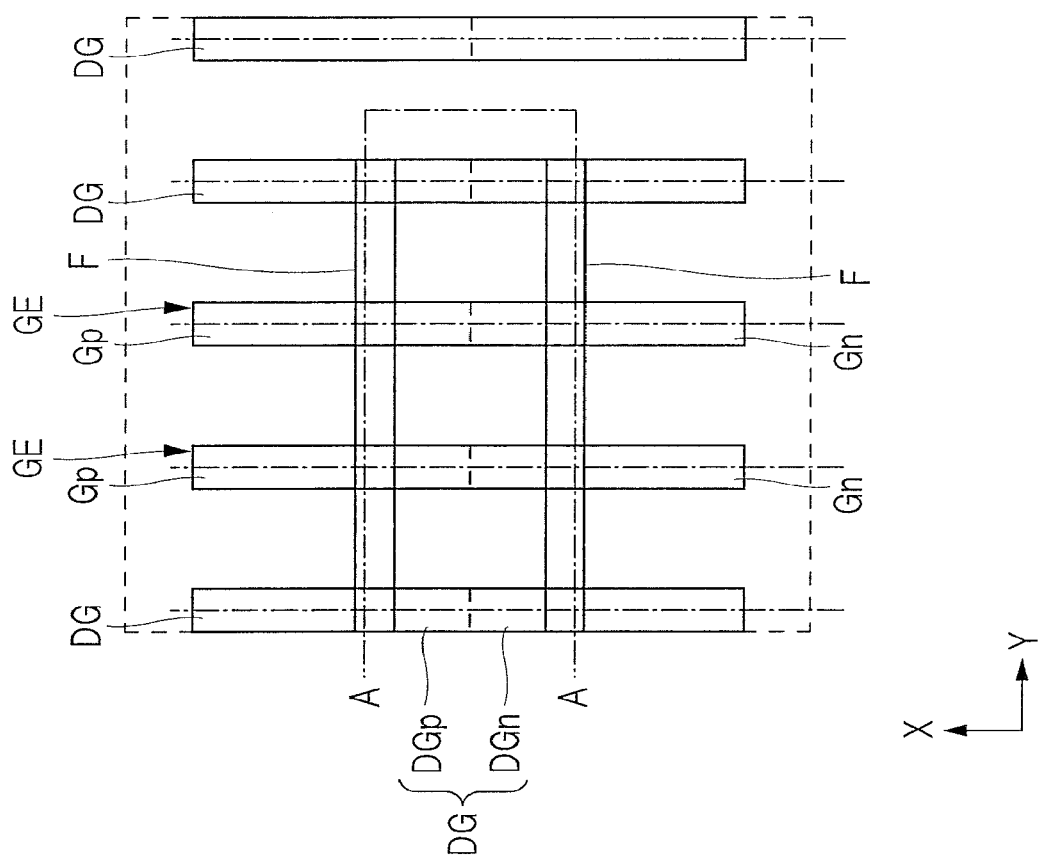
FIG. 35 is a plan view showing a layout of a gate electrode, a dummy gate, and a fin of the semiconductor device according to the fourth embodiment.
Figure 36:
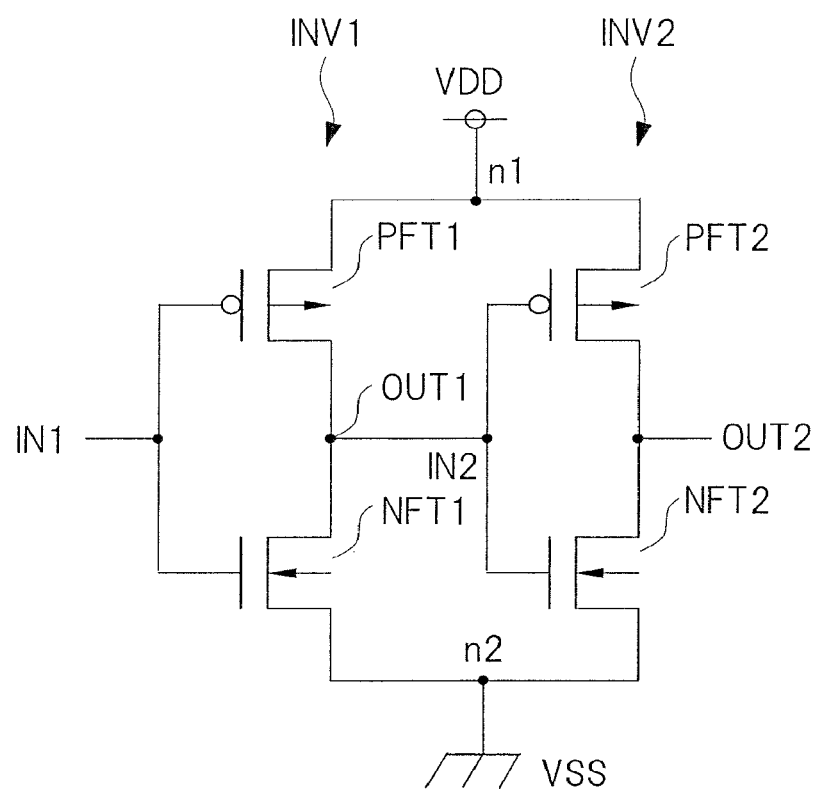
FIG. 36 is a circuit diagram showing the configuration of the semiconductor device according to the fourth embodiment.

Hereinafter, a semiconductor device according to a present embodiment will be described in detail with reference to drawings. The semiconductor device according to the present embodiment includes the FINFETs serving as semiconductor elements. FIG. 33 is a plan view showing a configuration of the semiconductor device according to the present embodiment. FIG. 34 is a cross-sectional view showing the configuration of the semiconductor device according to the present embodiment. The cross-sectional view of FIG. 34 corresponds to, for example, a cross section taken along a line A-A of the plan view of FIG. 33. FIG. 35 is a plan view showing a layout of the gate electrode, the dummy gate, and the fin of the semiconductor device according to the present embodiment. FIG. 36 is a circuit diagram showing the configuration of the semiconductor device according to the present embodiment.

The plan view of FIG. 33 shows two p-channel FINFETs (PFT1, PFT2) and two n-channel FINFETs (NFT1, NFT2) that make up two inverters. That is, this drawing shows two p-channel FINFETs (PFT1, PFT2) and two n-channel FINFETs (NFT1, NFT2) that make up the inverter INV1 at the front stage and inverter INV2 at the rear stage shown in FIG. 36. Here, the explanation will be made while a region for forming the inverters INV1 and INV2 is regarded as the unit cell.

The FINFETs (PFT1, NFT1) making up the inverter INV1 are arranged in the left region of the unit cell of the present embodiment, and the FINFETs (PFT2, NFT2) making up the inverter INV2 are arranged in the central region of the unit cell. Although the configuration of the FINFETs (PFT2, NFT2) making up the inverter INV2 is the same as the configuration of that of the first embodiment, the configuration of the FINFETs (PFT1, NFT1) making up the inverter INV1 is different from the configuration of that of the first embodiment. Specifically, while two FINFETs (PFT2, NFT2) making up the inverter INV2 are connected by the local interconnects (LIC1, LIC2) having the substantial U shape described in the first embodiment, two FINFETs (PFT1, NFT1) making up the inverter INV1 are connected by the wiring M1.

In this manner, according to the semiconductor device of the present embodiment, two FINFETs (PFT2, NFT2) making up the inverter INV2 are connected by the local interconnects LIC having the substantial U shape. Therefore, as described in detail in the first embodiment, the forming area (cell area) of the semiconductor device can be reduced. And, the integration degree of the semiconductor elements (FINFETs) can be increased.

According to the semiconductor device of the present embodiment, two FINFETs (PFT1, NFT1) making up the inverter INV1 are connected by using an interconnect layer (i.e., layer of the wiring M1) different from the local interconnects LIC, and therefore, the forming area (cell area)

of the semiconductor device can be reduced. And, the integration degree of the semiconductor element (FINFET) can be increased.

The inverter INV1 at the front stage shown in FIG. 36 has the p-channel FINFET (PFT1) and n-channel FINFET (NFT1) that are connected in series between the source potential (VDD) and the ground potential (VSS). These p-channel FINFET (PFT1) and n-channel FINFET (NFT1) are arranged on the left side in the drawing (in the left region of the unit cell). The gate electrodes (GE) of the PFT1 and NFT1 are connected to an input portion (IN1), and a connection portion between the PFT1 and NFT1 becomes an output portion (OUT1).

The inverter INV2 at the rear stage shown in FIG. 36 has the p-channel FINFET (PFT2) and n-channel FINFET (NFT2) that are connected in series between the source potential (VDD) and the ground potential (VSS). These p-channel FINFET (PFT2) and n-channel FINFET (NFT2) are arranged at the center in the drawing (in the central region of the unit cell). The gate electrodes (GE) of the PFT2 and NFT2 are connected to an input portion (IN2), and a connection portion between the PFT2 and NFT2 becomes an output portion (OUT2). The input portion (IN2) is connected to the output portion (OUT1) of the inverter INV1 at the front stage.

The planar shape (shape or cell layout in a plan view viewed from above) of each component of the semiconductor device of the present embodiment will be described with reference to FIG. 33.

As shown in FIG. 33, the planar shape of each fin F is a linear shape having a certain width (length in the X direction) (a rectangular shape with long sides extending in the Y direction). In FIG. 33, two fins F are arranged in the X direction at a certain interval (pitch) (see FIG. 35).

As shown in FIG. 33, the planar shape of each gate electrode GE is a linear shape having a certain width (length in the Y direction) (a rectangular shape with long sides extending in the X direction). In this manner, the gate electrode GE extends in a direction of crossing the fins F. Here, in addition to the gates GE extending in the direction of crossing the fins F, the dummy gates DG are also provided. Each dummy gate DG has the same configuration as that of the gate electrode GE. That is, the dummy gate DG also has a linear shape having a certain width (length in the Y direction) (a rectangular shape with long sides extending in the X direction). In FIG. 33, five of the gate electrodes GE and dummy gates DG are arranged at a certain interval (interval in the Y direction, the minimum pitch in the Y direction, a grid) (see FIG. 35). By arranging the dummy gates DG as described above, the pattern regularity can be secured, so that the variation in the manufacturing or others can be reduced.

Here, the area (Y grid) between the gate electrode GE and the dummy gate DG is denoted as "YG". In FIG. 33, for example, the Y girds YG1 to YG4 are arranged sequentially from left.

The left gate electrode GE (Gn, Gp) of the gate electrodes GE (Gn, Gp) extending in the direction of crossing the fins F is the gate electrode GE making up the inverter INV1, while the right gate electrode GE (Gn, Gp) thereof is the gate electrode GE making up the inverter INV2. Note that the gate electrode GE is made of a conductive film extending integrally in the X direction. However, in the region for forming the p-channel FINFET (PFT), the gate electrode GE in this region is shown as the gate electrode Gp because a p-type impurity is introduced thereto. Also, in the region for forming the n-channel FINFET (NFT), the gate electrode GE in this region is shown as the gate electrode Gn because an n-type impurity is introduced thereto. By these gate electrodes Gp and Gn, the gate electrode GE is made up.

Here, the above-described interval in the Y direction (width of the Y grid in the Y direction) is the reference for determining the length of the unit cell in the Y direction. For example, when the interval thereof in the Y direction is 0.09 μm, the length of the unit cell in the Y direction is determined to be 0.09×4=0.36 μm. Here, when the length thereof in the X direction is 0.77 μm, the cell area of the unit cell shown in FIG. 33 is 0.2772 μm².

The source region Sp and the drain region Dp are arranged in the fin F on both sides of the gate electrode GE (Gp). Also, the source region Sn and the drain region Dn are arranged in the fin F on both sides of the gate electrode GE (Gn). Note that the fins F and the gate electrode GE overlap with each other so as to interpose the gate insulating film (GI) therebetween (see FIG. 34). More specifically, the gate insulating film (GI) is arranged on the side surfaces and front surface of the fins F in the region where the fins F and the gate electrode GE overlap.

As shown in FIG. 33, the planar shape of each local interconnect (LIC1, LIC2) is a rectangular shape with long sides extending in the X direction or a rectangular shape with long sides extending in the Y direction. Here, in FIG. 33, the rectangular one (portion, location) with long sides extending in the X direction is denoted as "LIC1", while the rectangular one (portion, location) with long sides extending in the Y direction is denoted as "LIC2". The local interconnects (LIC1, LIC2) are formed by burying a conductive film in trenches formed in the interlayer insulating film (IL1). When these trenches are formed, a patterned photoresist film is used as a mask. When the photoresist film is processed (exposed to light), a rectangular pattern with long sides extending in the X direction and a rectangular pattern with long sides extending in the Y direction are transferred individually. By such processing, even a fine pattern can be formed with high accuracy.

The drain regions (Dp, Dn) of the p-channel FINFET (PFT2) and n-channel FINFET (NFT2) making up the inverter INV2 are connected by the local interconnects (LIC1, LIC2) (FIGS. 33 and 34).

The drain region Dp of the p-channel FINFET (PFT2) is extracted by the local interconnect LIC1. This local interconnect LIC1 is connected to a local interconnect LIC1 connected to the output portion (OUT2) through a local interconnect LIC2 crossing the dummy gate DG. The drain region (Dn) of the n-channel FINFET (NFT2) is extracted by the local interconnect LIC1. This local interconnect LIC1 is connected to a local interconnect LIC1 connected to the output portion (OUT2) through a local interconnect LIC2 crossing the dummy gate DG. In this manner, in FIG. 33, the drain regions (Dp, Dn) are connected by five local interconnects (LIC1, LIC2). These five local interconnects (LIC1, LIC2) form a substantial U shape.

Note that the drain regions (Dp, Dn) may be connected by three local interconnects (LIC1, LIC2). That is, the drain regions (Dp, Dn) may be connected directly to the local interconnects LIC2 extending in the Y direction, and the local interconnect LIC1 connected to the output portion (OUT2) is connected therebetween.

As shown in FIG. 33, a common source region (Sp, node n1) shared between the p-channel FINFET (PFT2) making up the inverter INV2 and p-channel FINFET (PFT1) making up the inverter INV1 is connected to the local interconnect LIC1. In other words, the source region Sp of the p-channel FINFET (PFT2) making up the inverter INV2 serves also as the source region Sp of the p-channel FINFET (PFT1) making up the inverter INV1, and this common source region Sp is connected to the local interconnect LIC1. This local interconnect LIC1 is connected to a wiring M1 (VDD) to which the source potential (VDD) is supplied through a via V0.

A common source region (Sn, node n2) shared between the n-channel FINFET (NFT2) making up the inverter INV2 and n-channel FINFET (NFT1) making up the inverter INV1 is connected to the local interconnect LIC1. In other words, the source region Sn of the n-channel FINFET (NFT2) making up the inverter INV2 serves also as the source region Sn of the n-channel FINFET (NFT1) making up the inverter INV1, and this common source region Sn is connected to the local interconnect LIC1. This local interconnect LIC1 is connected to a wiring M1 (VSS) connected the source potential (VSS) through a via V0.

In this manner, the local interconnect LIC1 used for supplying the source potential (VDD) is shared between two p-channel FINFETs (PFT1, PFT2). Also, the local interconnect LIC1 used for supplying the ground potential (VSS) is shared between two n-channel FINFETs (NFT1, NFT2). According to such a layout, the forming area (cell area) of the semiconductor device can be reduced. Also, the integration degree of the semiconductor element (FINFET) can be increased.

As shown in FIG. 33, the local interconnect LIC2 is arranged on the boundary between the gate electrode Gp and the gate electrode Gn that make up the inverter IN1. This local interconnect LIC2 is connected to a wiring M1 (IN1) through a via V0 (see FIG. 34).

Also, as shown in FIG. 33, the local interconnect LIC2 is arranged on the boundary between the gate electrode Gp and the gate electrode Gn that make up the inverter IN2. This local interconnect LIC2 is connected to a wiring M1 (OUT1, IN2) through a via V0 (see FIG. 34).

In the left region of the unit cell shown in FIG. 33, the FINFETs (PFT1, NFT1) making up the inverter INV1 are arranged. The drain regions (Dp, Dn) of the p-channel FINFET (PFT1) and n-channel FINFET (NFT1) making up the inverter INV1 are connected by the above-described wiring M1 (OUT1, IN2). This wiring M1 (OUT1, IN2) has a substantial U shape.

Specifically, the drain region (Dp) of the p-channel FINFET (PFT1) is extracted by the local interconnect LIC1. This local interconnect LIC1 is connected to the wiring M1 (OUT1, IN2). The drain region (Dn) of the n-channel FINFET (NFT1) is extracted by the local interconnect LIC1. This local interconnect LIC1 is also connected to the above-described wiring M1 (OUT1, IN2). And, the local interconnect LIC2 is arranged on the boundary between the gate electrodes Gp and Gn of two FINFETs (PFT2, NFT2) that make up the inverter INV2. This local interconnect LIC2 is connected to the above-described wiring M1 (OUT1, IN2) through a via V0.

The wiring M1 (OUT1, IN2) serves as the output portion of the inverter IN1 and as the input portion of the inverter INV2. And, the wiring M1 (IN1) serves as the input portion of the inverter INV1.

In this manner, according to the semiconductor device of the present embodiment, two FINFETs (PFT, NFT) making up the inverter INV1 are connected by using an interconnect layer (here, a layer of the wiring M1) different from the local interconnect LIC, and therefore, the forming area (cell area) of the semiconductor device can be reduced. And, the integration degree of the semiconductor element (FINFET) can be increased.

Note that the semiconductor device of the present embodiment is different from the semiconductor device of the first embodiment in a planar shape of each component (F, GE, DG, LIC1, LIC2, and M1). However, this can be formed by processes which are almost the same as the processes in the first embodiment.

(First Application Example)

Figure 37:
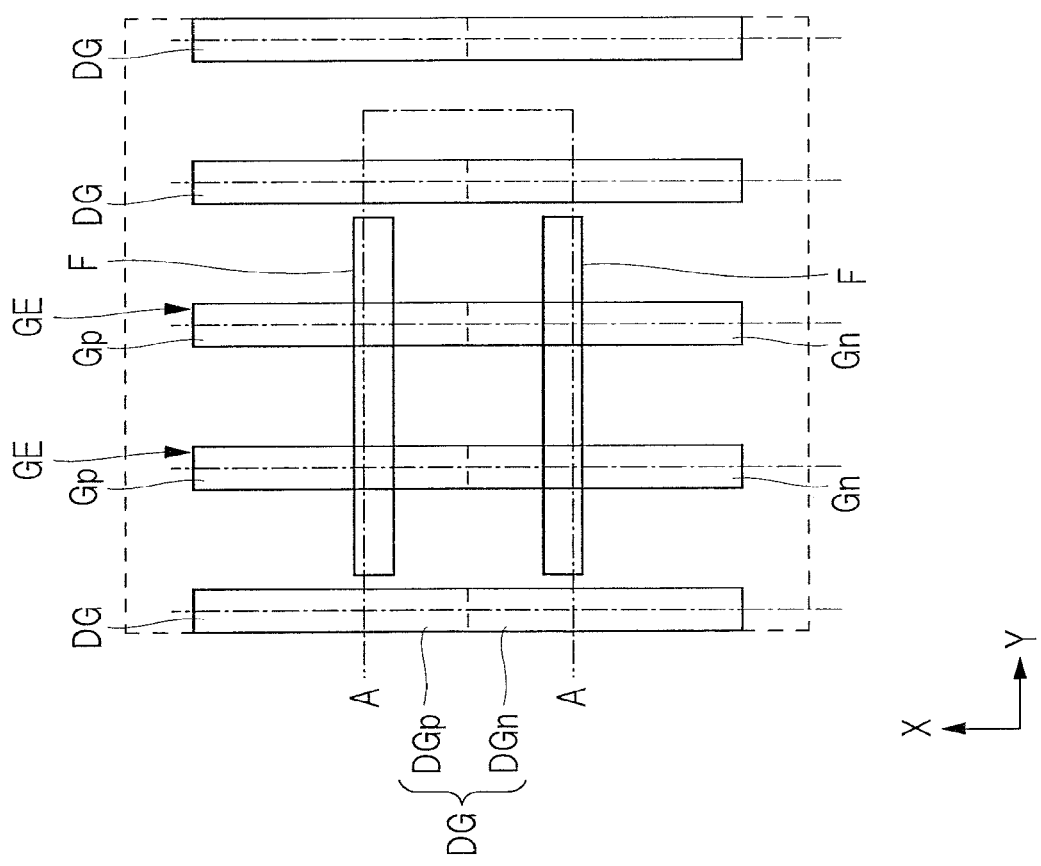
FIG. 37 is a plan view showing a layout of a gate electrode, a dummy gate, and a fin of a semiconductor device of a first application example of the fourth embodiment.

In the semiconductor device of the above-described aspect (FIGS. 33 and 35), the fins F are extended to a portion below the dummy gates DG (the first and fourth dummy gates DG counted from the left in FIGS. 33 and 35). However, as shown in FIG. 37, the fins F may be arranged so as to cross the gate electrodes GE only. FIG. 37 is a plan view showing a layout of a gate electrode, a dummy gate, and a fin of a semiconductor device of the present application example. The semiconductor device of the first application example is the same as the semiconductor device of the above-described aspect (FIG. 33) except for the configuration of the fin F, and therefore, detailed description of a configuration of the semiconductor device and a manufacturing method for the same will be omitted.

Also in the present application example, the forming area (cell area) of the semiconductor device can be reduced. And, the integration degree of the semiconductor element (FINFET) can be increased.

(Second Application Example)

Figure 38:
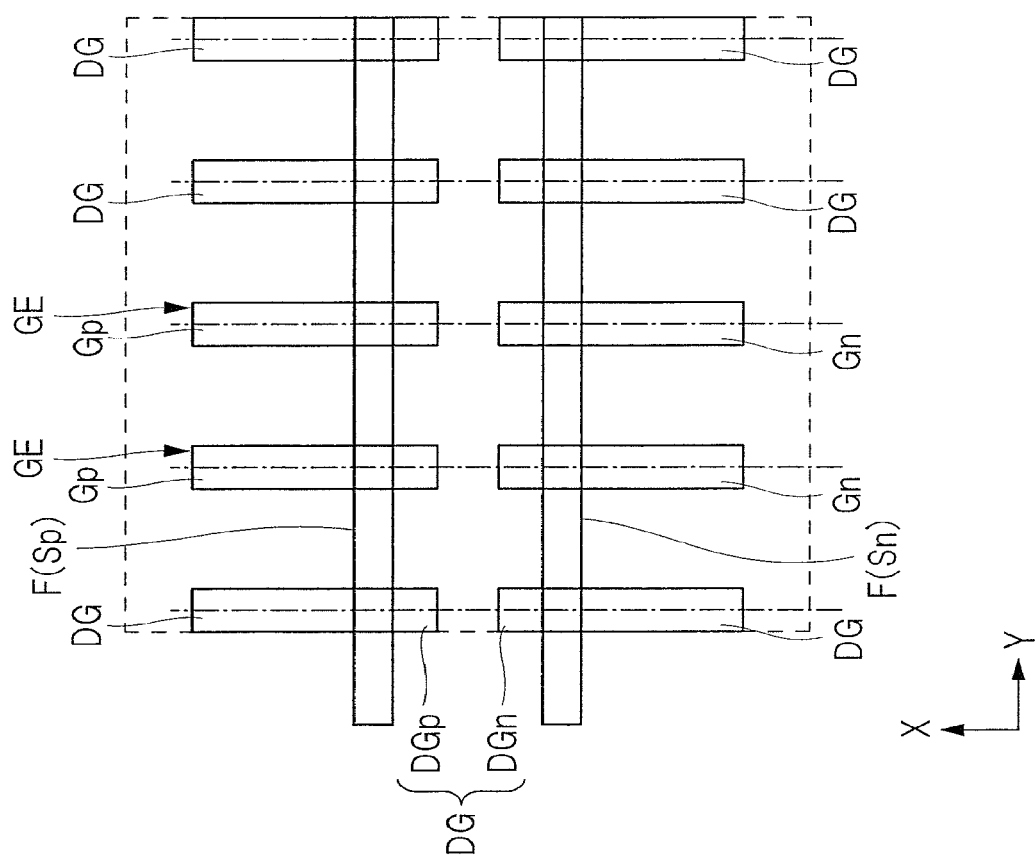
FIG. 38 is a plan view showing a layout of a gate electrode, a dummy gate, and a fin of a semiconductor device of a second application example of the fourth embodiment.
Figure 39:
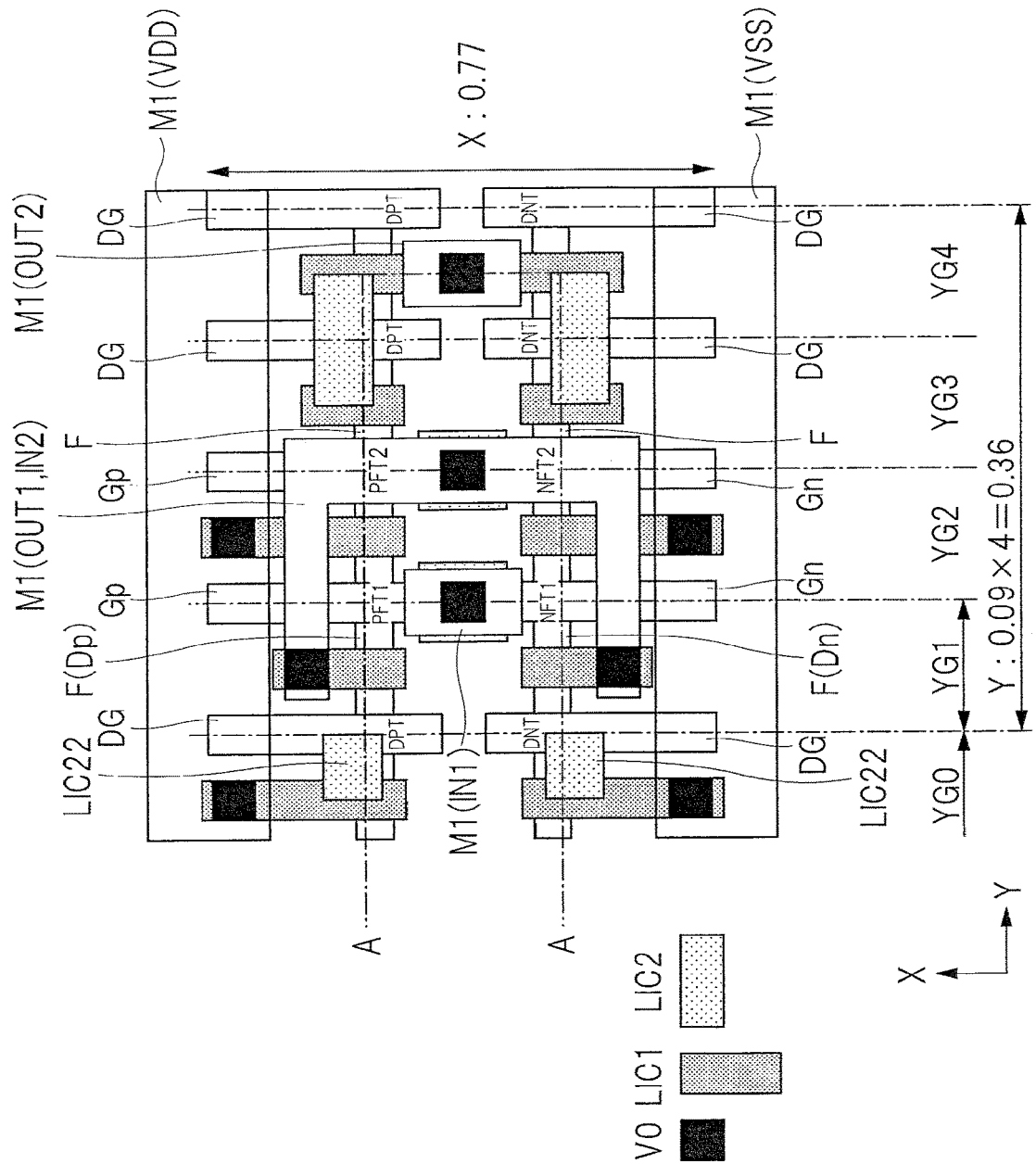
FIG. 39 is a plan view showing a layout of the semiconductor device as the second application example of the fourth embodiment.

In the semiconductor device of the above-described first application example (FIG. 37), the fins F are arranged so as to cross the gate electrodes GE only. However, the fins F may be continuously arranged in the Y direction in the region for forming the unit cell without being divided (see FIG. 38). In this case, the fin F passes through a portion below each of the dummy gates DG located on both sides of two gate electrodes GE, and extends to the adjacent Y grid (such as the first, fourth, and fifth dummy gates DG from the left in FIG. 38). FIG. 38 is a plan view showing a layout of a gate electrode, a dummy gate and a fin of the present application example. FIG. 39 is a plan view showing a layout of the semiconductor device of the present application example.

In the present application example, the dummy transistor described in the third embodiment is formed. For example, in FIG. 39, the p-channel dummy transistor (DPT) is formed in the upper-half region of the unit cell, while the n-channel dummy transistor (DNT) is formed in the lower-half region of the unit cell.

Here, in the p-channel dummy transistor (DPT), the dummy gate DG and the local interconnect LIC1 connected to the source potential (VDD) are connected to each other through the local interconnect LIC22, so that the potential of the dummy gate DG can be fixed to the source potential (VDD). Also, in the n-channel dummy transistor (DNT), the dummy gate DG and the local interconnect LIC1 connected to the ground potential (VSS) are connected to each other through the local interconnect LIC22, so that the potential of the dummy gate DG can be fixed to the ground potential (VSS). In this manner, these dummy transistors (DPT, DNT) are not turned to ON, so that the influence on the circuit operations can be avoided (see the left end of FIG. 39).

In FIG. 39, also in the p-channel dummy transistor (DPT) in a right-end upper-half region of the unit cell and the n-channel dummy transistor (DNT) in a right-end lower-half region of the unit cell, the potential of the dummy gate DG can be fixed to the source potential (VDD) or ground potential (VSS) as similar to the above-described cases although not shown in detail.

Also, in FIG. 39, the second p-channel dummy transistor (DPT) counted from the right end of the unit cell is not turned to ON because no potential difference (between the source and the drain) is generated in the impurity region in the fin F on both sides, and therefore, there is no problem on the circuit operations. Similarly, in FIG. 39, the second n-channel dummy transistor (DNT) counted from the right end of the unit cell is not turned to ON because no potential difference (between the source and the drain) is generated in the impurity region in the fin F on both sides, and therefore, there is no problem on the circuit operations.

Also in the present application example, the forming area (cell area) of the semiconductor device can be reduced. And, the integration degree of the semiconductor element (FIN-FET) can be increased.

Further, by largely extending the fins F in the Y direction, the mobility of carriers is improved because of the strain effect. Besides, the ON current can be increased by the improvement.

Note that the semiconductor device of the present embodiment is different from the case of the semiconductor device of the first embodiment in a planar shape of each component (F, GE, DG, LIC1, LIC2, and M1). However, the component can be formed by processes almost the same as the processes in the first embodiment.

Fifth Embodiment

In the first embodiment, the substantial U-shaped local interconnect LIC is used for the output portion of the inverter. However, the above-described local interconnect LIC may be used for an output portion of a two-input NAND.

Figure 40:
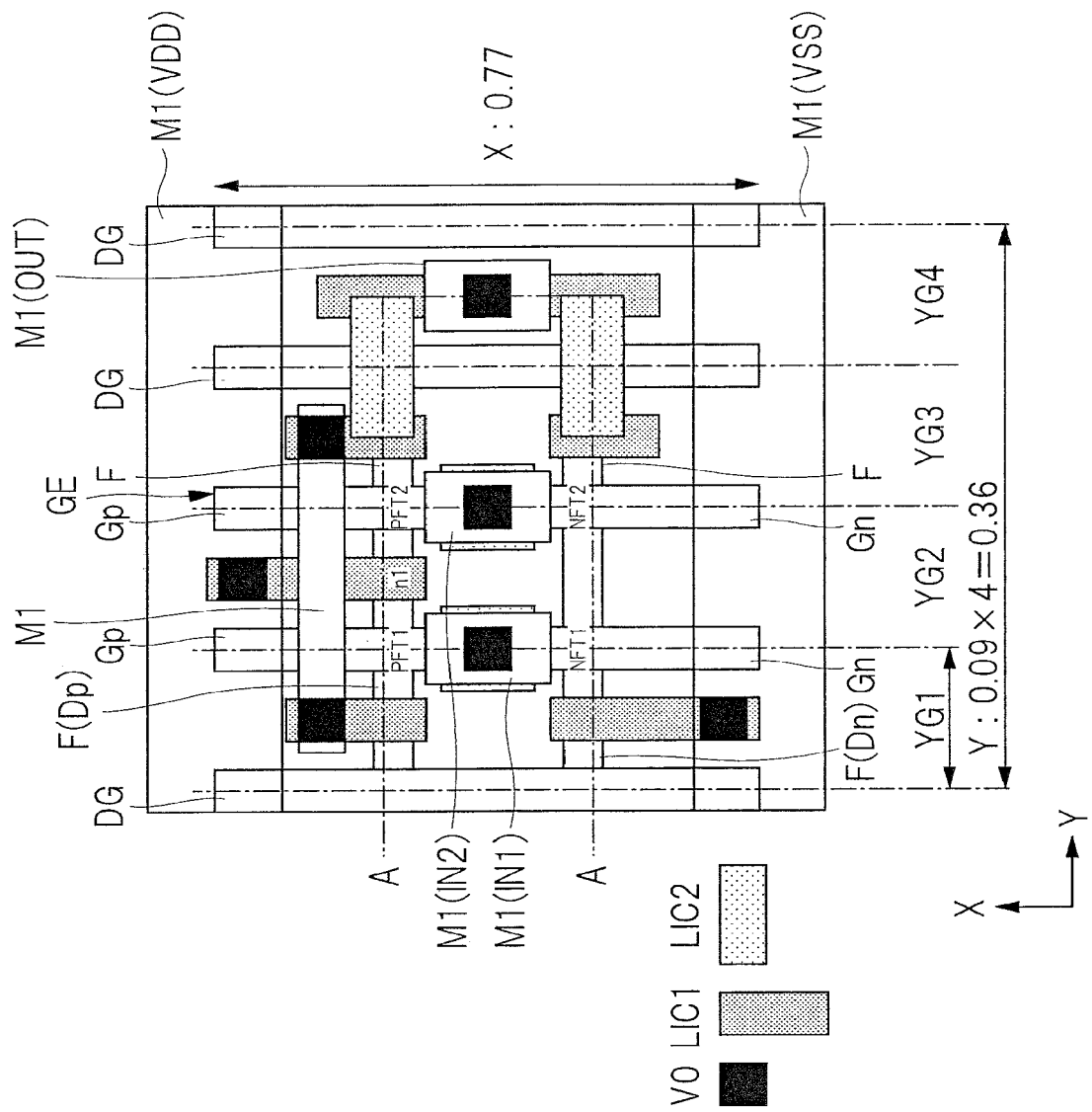
FIG. 40 is a plan view showing a configuration of a semiconductor device according to a fifth embodiment.
Figure 41:
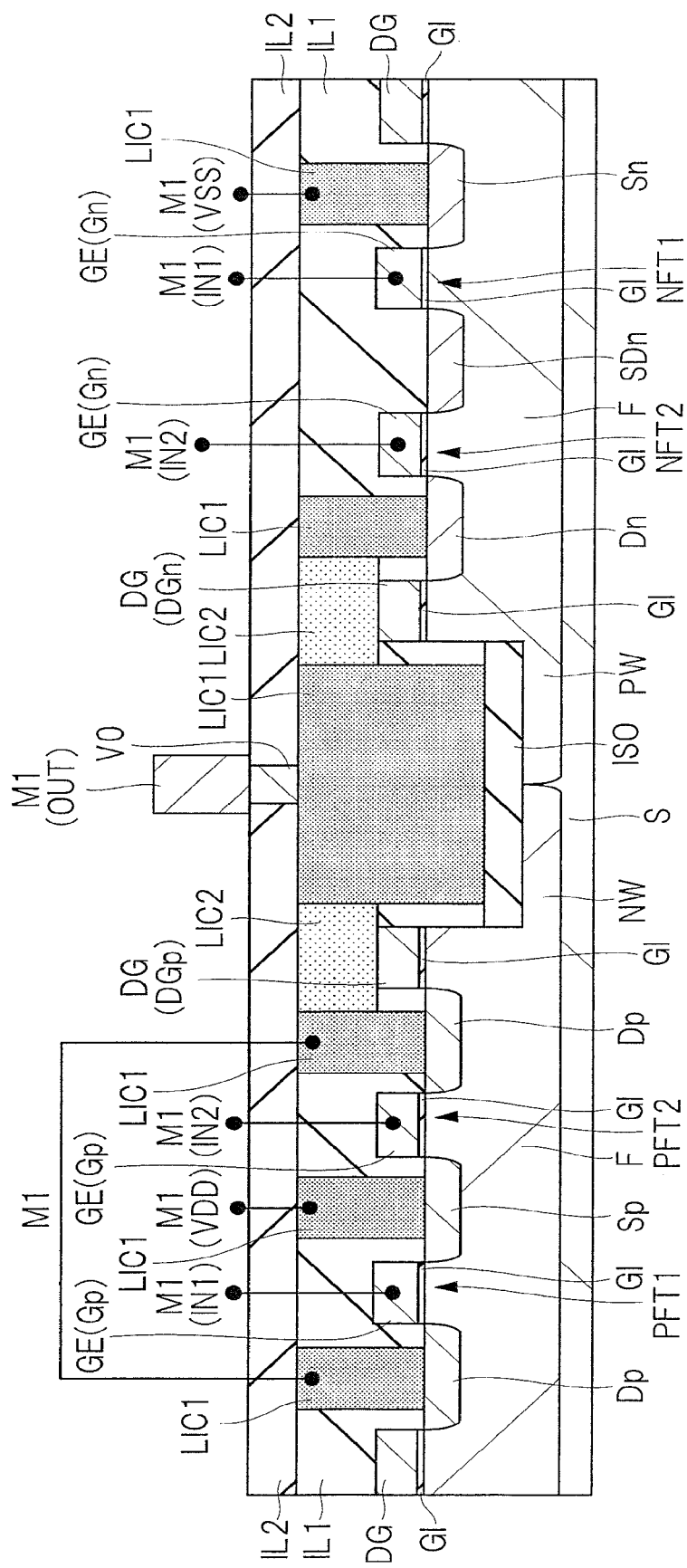
FIG. 41 is a cross-sectional view showing the configuration of the semiconductor device according to the fifth embodiment.
Figure 42:
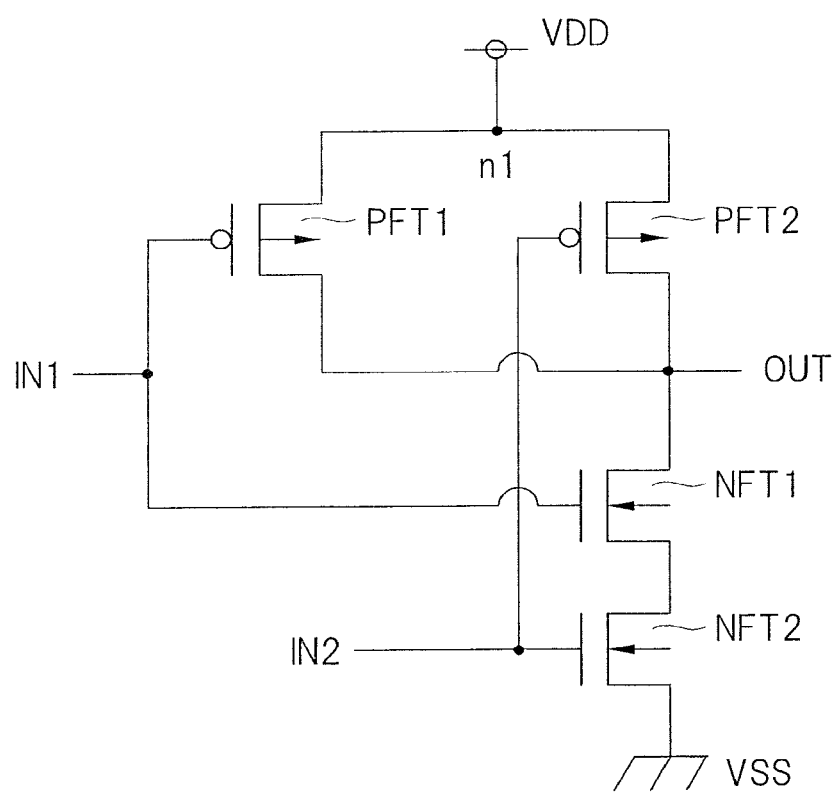
FIG. 42 is a circuit diagram showing the configuration of the semiconductor device according to the fifth embodiment.

FIG. 40 is a plan view showing a configuration of a semiconductor device according to the present embodiment. FIG. 41 is a cross-sectional view showing the configuration of the semiconductor device according to the present embodiment. The cross-sectional view of FIG. 41 corresponds to, for example, a cross section taken along a line A-A of the plan view of FIG. 40. FIG. 42 is a circuit diagram showing the configuration of the semiconductor device according to the present embodiment.

The plan view of FIG. 40 shows a plan layout of each component of two p-channel FINFETs (PFT1, PFT2) and two n-channel FINFETs (NFT1, NFT2) that make up a two-input NAND. In the present embodiment, a region for forming the two-input NAND is described as the unit cell. The cross-sectional view of FIG. 41 shows a cross section obtained by two p-channel FINFETs (PFT1, PFT2) and two n-channel FINFETs (NFT1, NFT2) that make up the two-input NAND. In the two-input NAND, as shown in FIG. 42, two p-channel FINFETs (PFT1, PFT2) are connected in parallel between the source potential (VDD) and the output portion OUT, while two n-channel FINFETs (NFT1, NFT2) are connected in series between the output portion OUT and the ground potential (VSS). The gate electrode of one pair of the p-channel FINFET (PFT1) and the n-channel FINFET (NFT1) becomes a first input portion IN1, while the gate electrode of another pair of the p-channel FINFET (PFT2) and the n-channel FINFET (NFT2) becomes a second input portion IN2.

The planar shape (shape or cell layout in a plan view from above) of each component of the semiconductor device of the present embodiment will be described with reference to FIG. 40.

As shown in FIG. 40, the planar shape of each fin F is a linear shape having a certain width (length in the X direction) (a rectangular shape with long sides extending in the Y direction). In FIG. 40, two fins F are arranged in the X direction at a certain interval (pitch).

As shown in FIG. 40, the planar shape of each gate electrode GE is a linear shape having a certain width (length in the Y direction) (a rectangular shape with long sides extending in the X direction). As described above, the gate electrode GE extends in a direction of crossing the fins F. Here, in addition to the gates GE extending in the direction of crossing the fins F, the dummy gates DG are also provided. Each dummy gate DG has the same configuration as that of the gate electrode GE. That is, the dummy gate DG has a linear shape having a certain width (length in the Y direction) (a rectangular shape with long sides extending in the X direction). In FIG. 40, five of gate electrodes GE and dummy gates DG are arranged at a certain interval (interval in the Y direction, the minimum pitch in the Y direction, a grid). By arranging the dummy gates DG as described above, the pattern regularity can be ensured, and the variation in the manufacturing or others can be reduced.

Here, the area (Y grid) between the gate electrode GE and the dummy gate DG is denoted by "YG". In FIG. 40, for example, the Y girds YG1 to YG4 are arranged sequentially from the left.

Two gate electrodes GE (Gn, Gp) extend in the direction of crossing the fins F. The gate electrode GE is made of a conductive film extending integrally in the X direction. However, in the region for forming the p-channel FINFET (PFT), the gate electrode GE in this region is shown as the gate electrode Gp because a p-type impurity is introduced thereto. Also, in the region for forming the n-channel FINFET (NFT), the gate electrode GE in this region is shown as the gate electrode Gn because an n-type impurity is introduced thereto. The gate electrode GE is made up by these gate electrodes Gp and Gn.

Here, the above-described interval in the Y direction (width in the Y direction of the Y grid) is the reference for determining the length of the unit cell in the Y direction. For example, when the interval in the Y direction is 0.09 μm, the length of the unit cell in the Y direction is determined to be 0.09×4=0.36 μm. Here, when the length thereof in the X direction is 0.77 μm, the cell area of the unit cell shown in FIG. 40 is 0.2772 μm$^2$.

The source region Sp and the drain region Dp are formed in the fin F on both sides of the gate electrode GE (Gp). Also, the source region Sn and the drain region Dn are formed in the fin F on both sides of the gate electrode GE (Gn). Note that the fin F and the gate electrode GE overlap with each other through the gate insulating film (GI) (see FIG. 41). More specifically, the gate insulating film (GI) is arranged on the side surfaces and front surface of the fin F in the overlap region between the fin F and the gate electrode GE.

As shown in FIG. 40, the planar shape of each local interconnect (LIC1, LIC2) is a rectangular shape with long sides extending in the X direction or a rectangular shape with long sides extending in the Y direction. The local interconnect (LIC1, LIC2) is formed by burying a conductive film in a trench formed in the interlayer insulating film (IL1). When these trenches are formed, a processed photoresist film is used as a mask. When the photoresist film is processed (exposed to light), a rectangular pattern with long sides extending in the X direction and a rectangular pattern with long sides extending in the Y direction are transferred individually. According to such processing, even a fine pattern can be formed with high accuracy.

The drain regions (Dp, Dn) of one pair of the p-channel FINFET (PFT2) and n-channel FINFET (NFT2) making up the two-input NAND are connected to each other through the local interconnects (LIC1, LIC2). This pair of the p-channel FINFET (PFT2) and n-channel FINFET (NFT2) has the third gate electrode GE counted from the left end of the unit cell.

The drain region (Dp) of the p-channel FINFET (PFT2) is extracted by a local interconnect LIC1. This local interconnect LIC1 is connected to a local interconnect LIC1 connected to the output portion (OUT) through a local interconnect LIC2 crossing the dummy gate DG. The drain region (Dn) of the n-channel FINFET (NFT2) is extracted by a local interconnect LIC1. This local interconnect LIC1 is connected to a local interconnect LIC1 connected to the output portion (OUT) through a local interconnect LIC2 crossing the dummy gate DG. As described above, in FIG. 40, the drain regions (Dp, Dn) are connected to each other through five local interconnects (LIC1, LIC2). These five local interconnects (LIC1, LIC2) are formed in a substantial U shape.

In FIG. 40, a common source region (Sp, node n1) shared between the two p-channel FINFETs (PFT1, PFT2) is connected to the local interconnect LIC1. This local interconnect LIC1 is connected to a wiring M1 (VDD) to which the source potential (VDD) is applied through a via V0. Each drain region Dp of the two p-channel FINFET (PFT1, PFT2) is extracted by the local interconnect LIC1. The two local interconnects LIC1 are connected to a wiring M1 through a via V0.

A source region Sn of the left n-channel FINFET (NFT1) of two n-channel FINFETs (NFT1, NFT2) shown in FIG. 40 is connected to the local interconnect LIC1. This local interconnect LIC1 is connected to a wiring M1 (VSS) connected to the ground potential (VSS) through a via V0 (see FIG. 41). Note that an impurity region (source/drain region) shared between two n-channel FINFETs (NFT1, NFT2) shown in FIGS. 40 and 41 is denoted as "SDn".

As described above, even when the local interconnect LIC is used as the output portion of the two-input NAND, the forming area (cell area) of the semiconductor device can be reduced. And, the integration degree of the semiconductor element (FINFET) can be increased.

(First Application Example)

Figure 43:
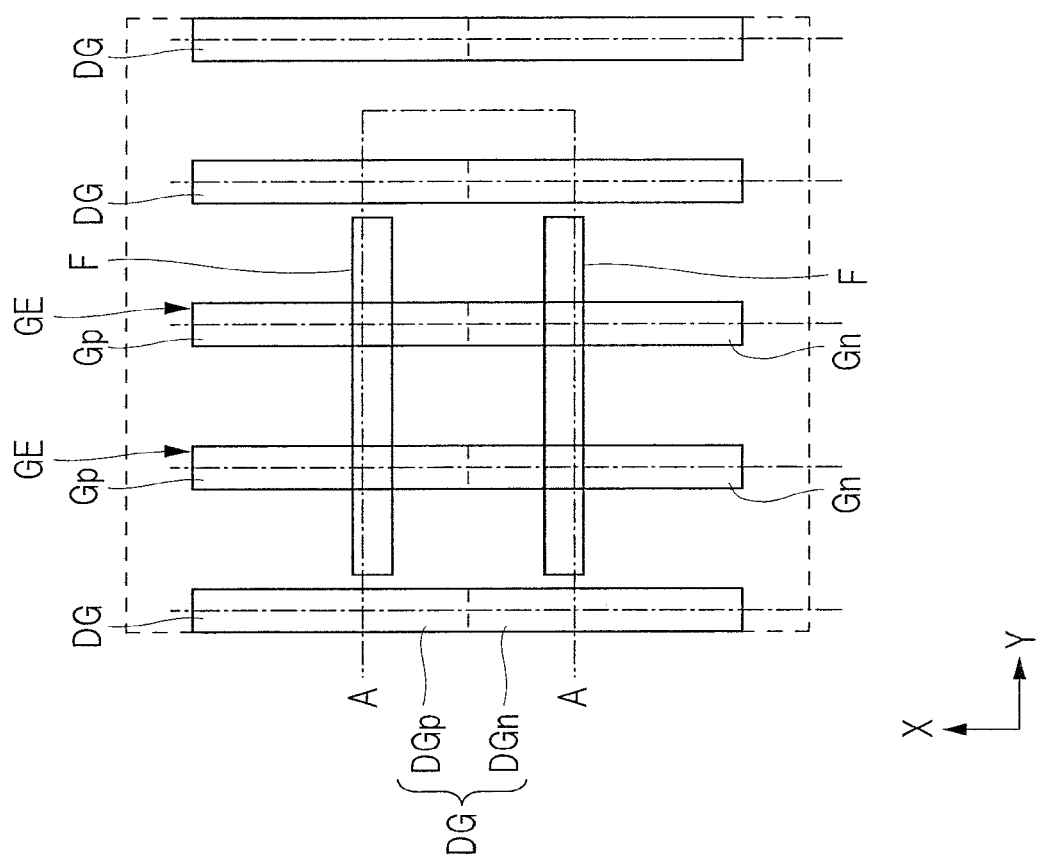
FIG. 43 is a plan view showing a layout of a gate electrode, a dummy gate, and a fin of a semiconductor device of a first application example of the fifth embodiment.

In the semiconductor device of the above-described aspect (FIG. 40), the fins F are extended to a portion below the dummy gates DG (the first and fourth dummy gates DG counted from the left in FIG. 40). However, as shown in FIG. 43, the fins F may be extended so as to cross the gate electrodes GE only. FIG. 43 is a plan view showing a layout of a gate electrode, a dummy gate, and a fin of a semiconductor device of the present application example. The semiconductor device of the present application example is the same as the semiconductor device of the above-described aspect (FIG. 40) except for the configuration of the fin F, and therefore, detailed description of a configuration of the semiconductor device and a manufacturing method for the same will be omitted.

Also in the present application example, the forming area (cell area) of the semiconductor device can be reduced. And, the integration degree of the semiconductor element (FINFET) can be increased.

(Second Application Example)

Figure 44:
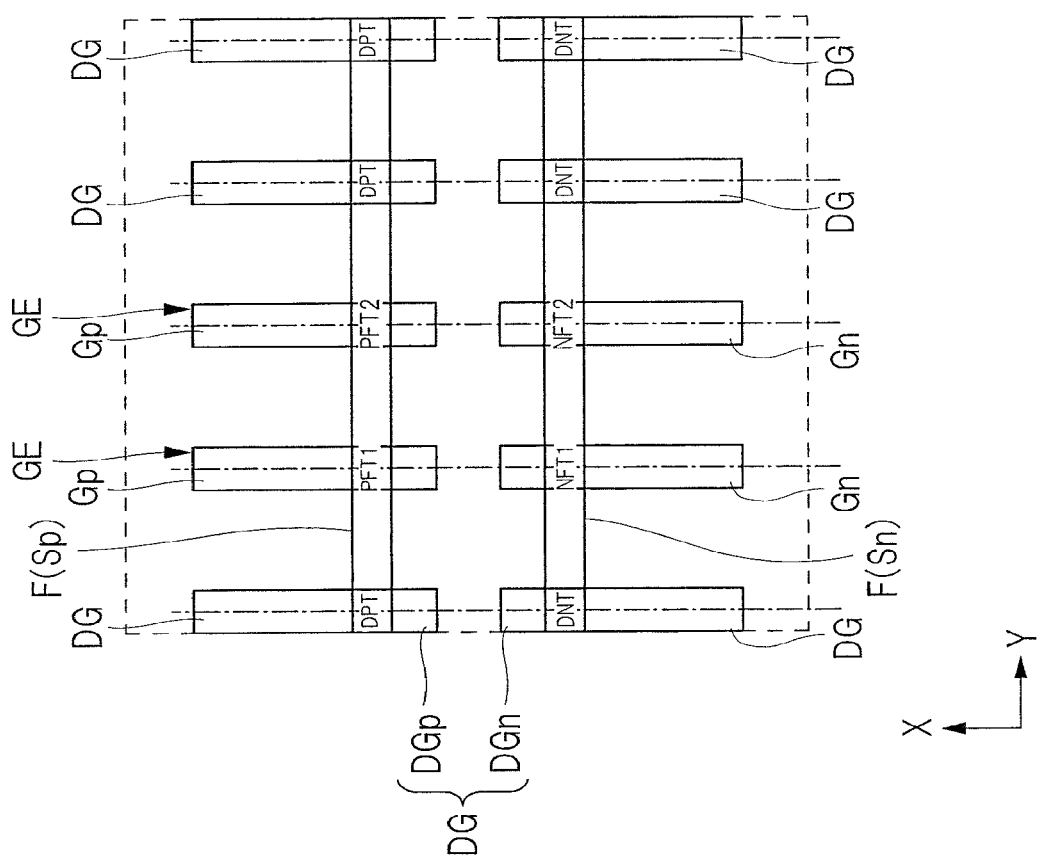
FIG. 44 is a plan view showing a layout of a gate electrode, a dummy gate, and a fin of a semiconductor device of a second application example of the fifth embodiment.
Figure 45:
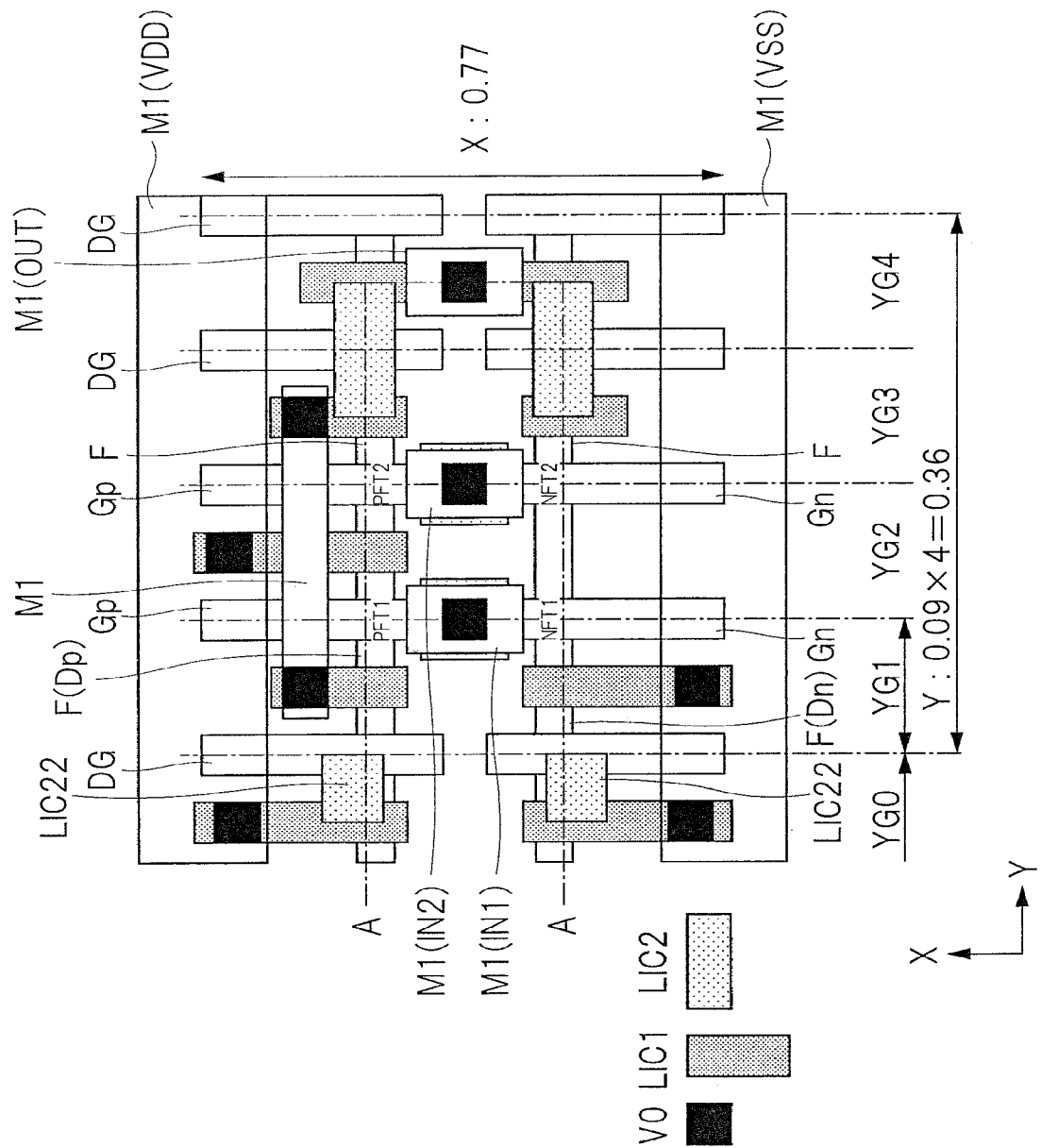
FIG. 45 is a plan view showing a layout of the semiconductor device of the second application example of the fifth embodiment.

In the semiconductor device of the present application example (FIG. 43), the fins F are arranged so as to cross the gate electrodes GE only. However, the fins F may be continuously arranged in the Y direction in the region for forming the unit cell (see FIG. 44) without being divided. In this case, the fin F passes through a portion below each of the dummy gates DG located on both sides of two gate electrodes GE, and extends to the adjacent Y grid (such as the first, fourth, and fifth dummy gates DG counted from the left in FIG. 44). FIG. 44 is a plan view showing a layout of a gate electrode, a dummy gate and a fin of the semiconductor device of the present application example. FIG. 45 is a plan view showing a layout of the semiconductor device of the present application example.

In the present application example, the dummy transistors described in the third embodiment are formed. For example, in FIG. 45, the p-channel dummy transistor (DPT) is formed in the upper-half region of the unit cell. And, the n-channel dummy transistor (DNT) is formed in the lower-half region of the unit cell (see FIG. 44).

Here, in the p-channel dummy transistor (DPT), the dummy gate DG and the local interconnect LIC1 connected to the source potential (VDD) are connected to each other through the local interconnect LIC22, so that the potential of the dummy gate DG can be fixed to the source potential (VDD). Also, in the n-channel dummy transistor (DNT), the dummy gate DG and the local interconnect LIC1 connected to the ground potential (VSS) are connected to each other through the local interconnect LIC22, so that the potential of the dummy gate DG can be fixed to the ground potential (VSS). In this manner, these dummy transistors (DPT, DNT) are not turned to ON, so that the influence on circuit operations can be avoided (see the left end of FIG. 45).

Although not shown in FIG. 45, the potential of the dummy gate DG can be fixed to the source potential (VDD) or ground potential (VSS) also in the p-channel dummy transistor (DPT) in a right-end upper-half region of the unit cell and the n-channel dummy transistor (DNT) in a right-end lower-half region of the unit cell as similar to the above-described cases.

The second p-channel dummy transistor (DPT) counted from the right end of the unit cell shown in FIGS. 44 and 45 is not turned to ON because no potential difference (between the source and the drain) is generated in the impurity region in the fin F on both sides, and therefore, there is no problem on the circuit operations. Similarly, the second n-channel dummy transistor (DNT) counted from the right end of the unit cell shown in FIGS. 44 and 45 is not turned to ON because no potential difference (between the source and the drain) is generated in the impurity region in the fin F on both sides, and therefore, there is no problem on the circuit operations.

Also in the present application example, the forming area (cell area) of the semiconductor device can be reduced. And, the integration degree of the semiconductor element (FINFET) can be increased.

Also, by largely extending the fins F in the Y direction, the mobility of carriers can be improved because of a strain effect. Also, the ON current can be increased by the improvement.

Note that the semiconductor device of the present embodiment is different from the semiconductor device of the first embodiment in the planar shape of each component (F, GE, DG, LIC1, LIC2, and M1). However, this can be formed by processes almost the same as the processes in the first embodiment.

Sixth Embodiment

In the fifth embodiment, the substantial U-shaped local interconnect LIC is used for the output portion of the two-input NAND. However, the above-described local interconnect LIC may be used for an output portion of a two-input NOR.

Figure 46:
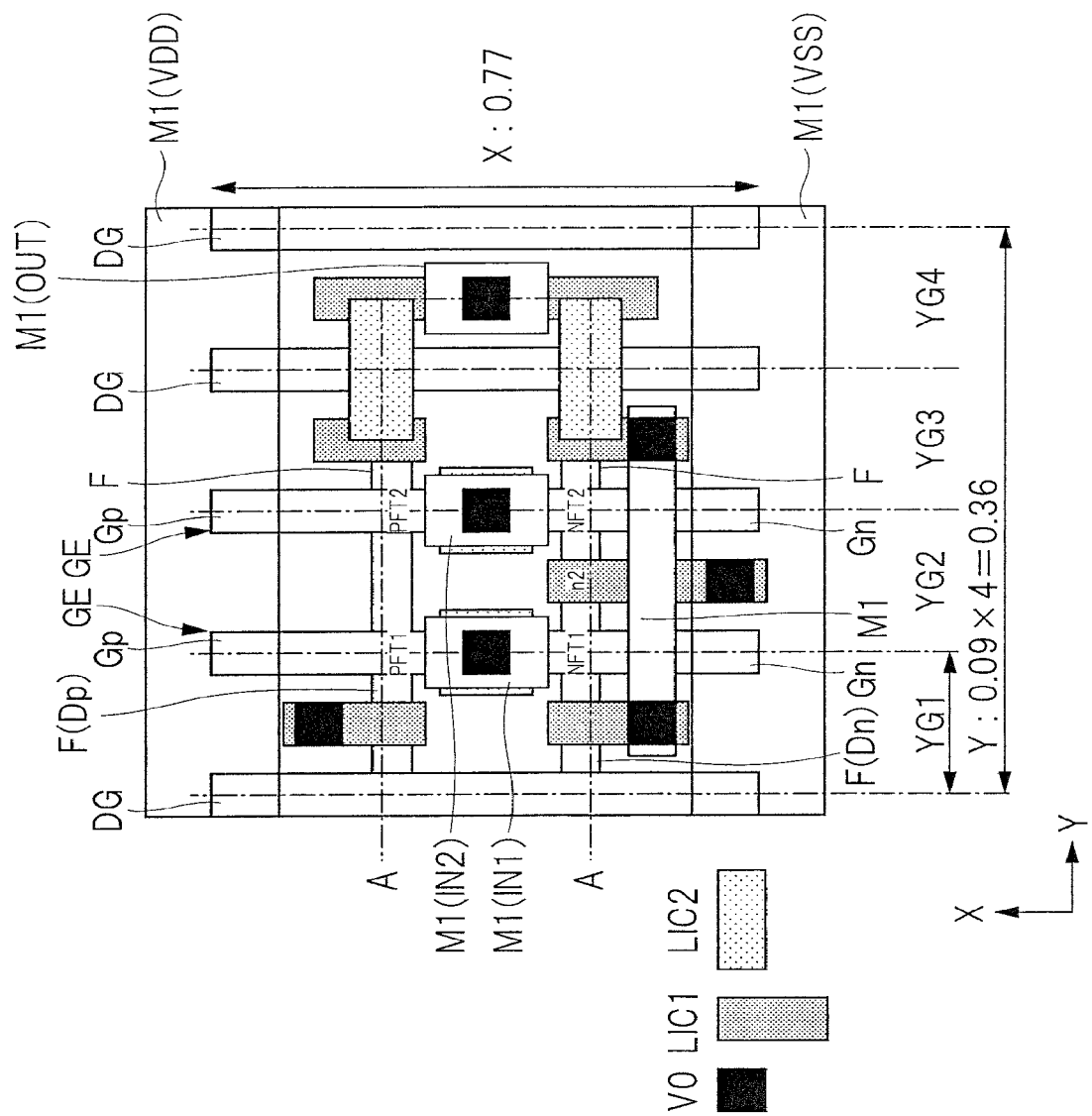
FIG. 46 is a plan view showing a configuration of a semiconductor device according to a sixth embodiment.
Figure 47:
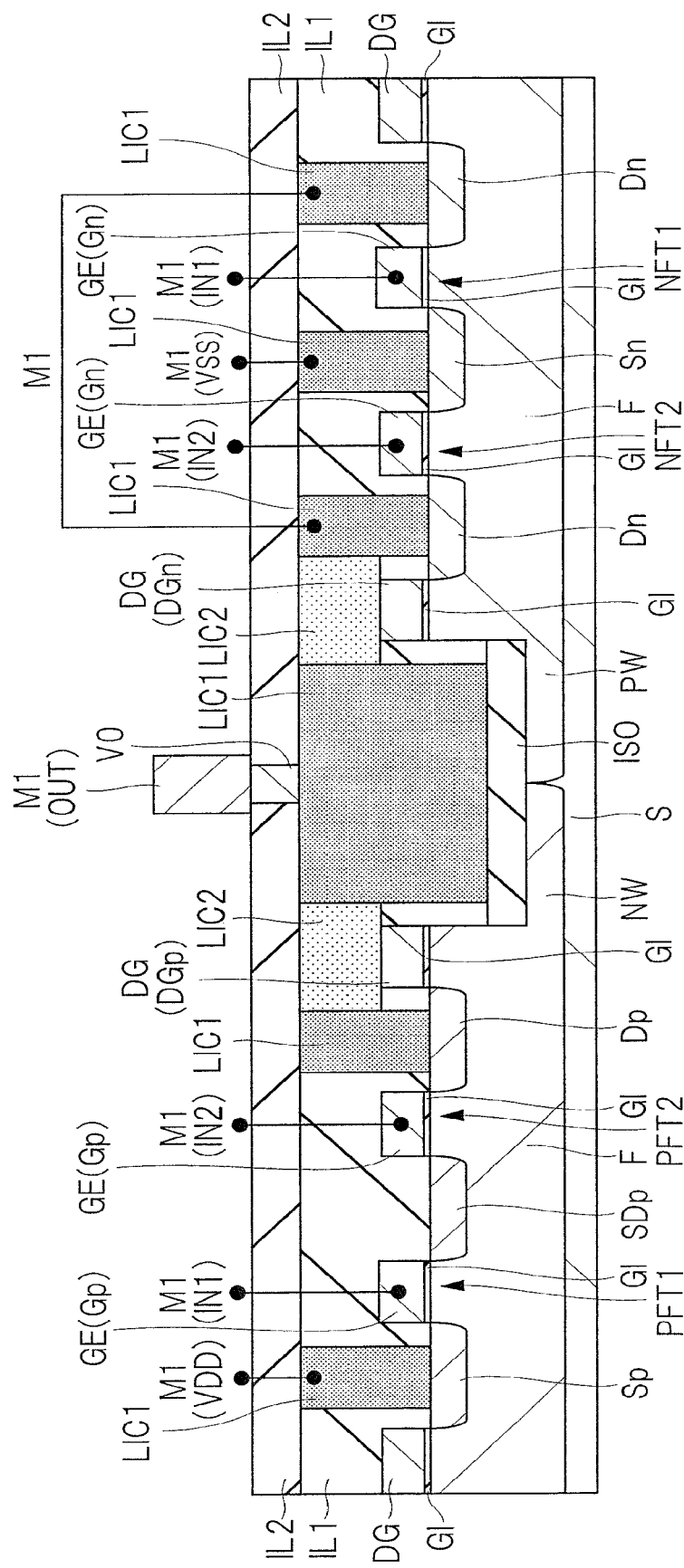
FIG. 47 is a cross-sectional view showing the configuration of the semiconductor device according to the sixth embodiment.
Figure 48:
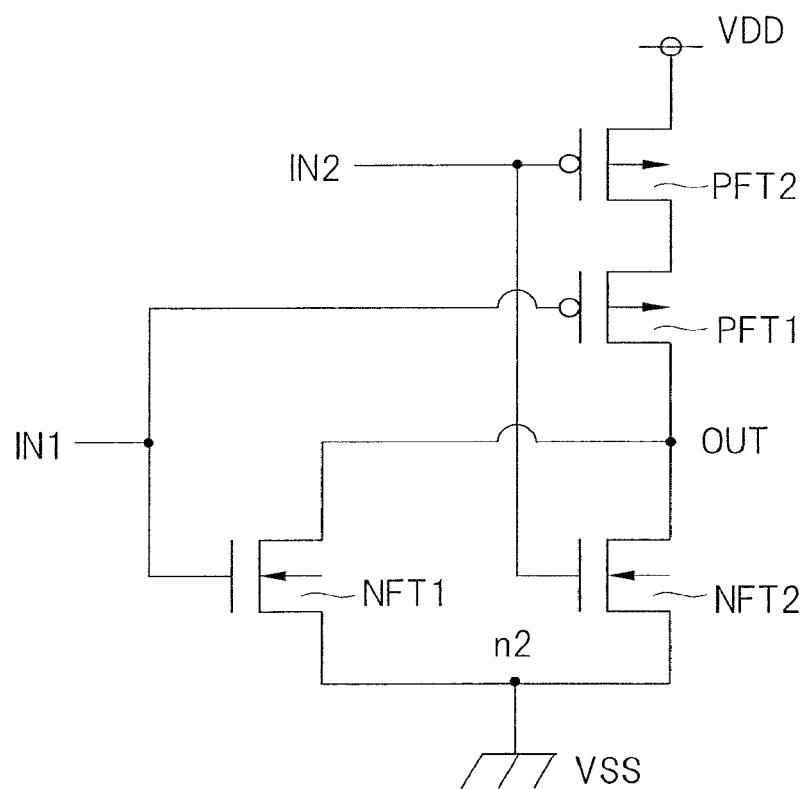
FIG. 48 is a circuit diagram showing the configuration of the semiconductor device according to the sixth embodiment.

FIG. 46 is a plan view showing a configuration of a semiconductor device according to the present embodiment. FIG. 47 is a cross-sectional view showing the configuration of the semiconductor device according to the present embodiment. The cross-sectional view of FIG. 47 corresponds to, for example, across section taken along a line A-A of the plan view of FIG. 46. FIG. 48 is a circuit diagram showing the configuration of the semiconductor device according to the present embodiment.

The plan view of FIG. 46 shows a plan layout of each component of two p-channel FINFETs (PFT1, PFT2) and two n-channel FINFETs (NFT1, NFT2) that make up a two-input NOR. In the present embodiment, a region for forming the two-input NOR is described as the unit cell. The cross-sectional view of FIG. 47 shows a cross section formed by two p-channel FINFETs (PFT1, PFT2) and two n-channel FINFETs (NFT1, NFT2) that make up the two-input NOR. In the two-input NOR, as shown in FIG. 48, two p-channel FINFETs (PFT1, PFT2) are connected in series between the source potential (VDD) and the output portion OUT, while two n-channel FINFETs (NFT1, NFT2) are connected in parallel between the ground potential (VSS) and the output portion OUT. And, the gate electrode of one pair of the p-channel FINFET (PFT1) and the n-channel FINFET (NFT1) becomes the first input portion IN1, while the gate electrode of another pair of the p-channel FINFET (PFT2) and the n-channel FINFET (NFT2) becomes the second input portion IN2.

First, the planar shape (shape or cell layout in a plan view from above) of each component of the semiconductor device of the present embodiment will be described with reference to FIG. 46.

As shown in FIG. 46, the planar shape of each fin F is a linear shape having a certain width (length in the X direction) (a rectangular shape with long sides extending in the Y direction). In FIG. 46, two fins F are arranged in the X direction at a certain interval (pitch).

As shown in FIG. 46, the planar shape of each gate electrode GE is a linear shape having a certain width (length in the Y direction) (a rectangular shape with long sides extending in the X direction). As described above, the gate electrode GE thus extends in a direction of crossing the fins F. Here, in addition to the gates GE extending in the direction of crossing the fins F, the dummy gates DG are also provided. Each dummy gate DG has the same configuration as that of the gate electrode GE. That is, the dummy gate DG also has a linear shape having a certain width (length in the Y direction) (a rectangular shape with long sides extending in the X direction). In FIG. 46, five of gate electrodes GE and dummy gates DG are arranged at a certain interval (interval in the Y direction, the minimum pitch in the Y direction, a grid). By arranging the dummy gates DG as described above, the pattern regularity can be secured, and the variation in the manufacturing or others can be reduced.

Here, the area (Y grid) between the gate electrode GE and the dummy gate DG is denoted as "YG". In FIG. 46, for example, the Y girds YG1 to YG4 are arranged sequentially from left.

Two gate electrodes GE (Gn, Gp) extend in the direction of crossing the fins F. The gate electrode GE is made of a conductive film extending integrally in the X direction. However, in the region for forming the p-channel FINFET (PFT), the gate electrode GE in this region is shown as the gate electrode Gp because a p-type impurity is introduced thereto. Also, in the region for forming the n-channel FINFET (NFT), the gate electrode GE in this region is shown as the gate electrode Gn because an n-type impurity is introduced thereto. The gate electrode GE is made up by these gate electrodes Gp and Gn.

Here, the above-described interval in the Y direction (width in the Y direction of the Y grid) is the reference for determining the length of the unit cell in the Y direction. For example, when the interval in the Y direction is 0.09 µm, the length of the unit cell in the Y direction is determined to be 0.09×4=0.36 µm. Here, when the length thereof in the X direction is 0.77 µm, the cell area of the unit cell of FIG. 46 is 0.2772 µm$^2$.

The source region Sp and the drain region Dp are formed in the fin F on both sides of the gate electrode GE (Gp). Also, the source region Sn and the drain region Dn are formed in the fin F on both sides of the gate electrode GE (Gn). Note that the fin F and the gate electrode GE overlap with each other through the gate insulating film (GI) (see FIG. 47). More specifically, the gate insulating film (GI) is arranged on the side surfaces and the front surface of the fin F in the overlap region between the fin F and the gate electrode GE.

As shown in FIG. 46, the planar shape of each local interconnect (LIC1, LIC2) is a rectangular shape with long sides extending in the X direction or a rectangular shape with long sides extending in the Y direction. The local interconnect (LIC1, LIC2) is formed by burying a conductive film in a trench formed in the interlayer insulating film (IL1). When the trench is formed, a processed photoresist film is used as a mask. When the photoresist film is processed (exposed to light), a rectangular pattern with long sides extending in the X direction and a rectangular pattern with long sides extending in the Y direction are transferred individually. According to such processing, even a fine pattern can be formed with high accuracy.

The drain regions (Dp, Dn) of one pair of the p-channel FINFET (PFT2) and n-channel FINFET (NFT2) making up the two-input NOR are connected through the local interconnects (LIC1, LIC2). This pair of the p-channel FINFET (PFT2) and n-channel FINFET (NFT2) has the third gate electrode GE counted from the left end of the unit cell.

The drain region (Dp) of the p-channel FINFET (PFT2) is extracted by a local interconnect LIC1. This local interconnect LIC1 is connected to a local interconnect LIC1 connected to the output portion (OUT), through a local interconnect LIC2 crossing the dummy gate DG. The drain region (Dn) of the n-channel FINFET (PFT2) is extracted by a local interconnect LIC1. This local interconnect LIC1 is connected to a local interconnect LIC1 connected to the output portion (OUT), through a local interconnect LIC2 crossing the dummy gate DG. As described above, in FIG. 46, the drain regions (Dp, Dn) are connected through five local interconnects (LIC1, LIC2). These five local interconnects (LIC1, LIC2) are formed in a substantial U shape.

And, a common source region Sn (node n2) shared between two n-channel FINFETs (NFT1, NFT2) shown in FIG. 46 is connected to a local interconnect LIC1. This local interconnect LIC1 is connected to a wiring M1 (VSS) to which the ground potential (VSS) is applied through a via V0. The drain region Dp of each of the two n-channel FINFETs (NFT1, NFT2) is extracted by the local interconnect LIC1. These two local interconnects LIC1 are connected by a wiring M1 through a via V0.

A source region Sp of the left p-channel FINFET (PFT) of two p-channel FINFETs (PFT1, PFT2) shown in FIG. 46 is connected to a local interconnect LIC1. This local interconnect LIC1 is connected to a wiring M1 (VDD) connected to the source potential (VDD), through a via V0 (see FIG. 47). Note that an impurity region (source/drain region) shared between two p-channel FINFETs (PFT1, PFT2), which impurity region is shown in FIGS. 46 and 47 is denoted as "SDp".

As described above, also when the local interconnect LIC is used as the output portion of the two-input NOR, the forming area (cell area) of the semiconductor device can be reduced. And, the integration degree of the semiconductor element (FINFET) can be increased.

First Application Example

In the semiconductor device of the above-described aspect (FIG. 46), the fins F are extended to a portion below the dummy gates DG (the first and fourth dummy gates DG counted from the left in FIG. 46). However, as similar to the first application example of the fifth embodiment (FIG. 43), the fins F may be arranged so as to cross the gate electrodes GE only. The semiconductor device of the present application example is the same as the semiconductor device of the above-described aspect (FIG. 46) except for the configuration of the fin F, and therefore, detailed description of a configuration of the semiconductor device and a method of manufacturing the same will be omitted.

Also in the present application example, the forming area (cell area) of the semiconductor device can be reduced. And, the integration degree of the semiconductor element (FINFET) can be increased.

Second Application Example

Figure 49:
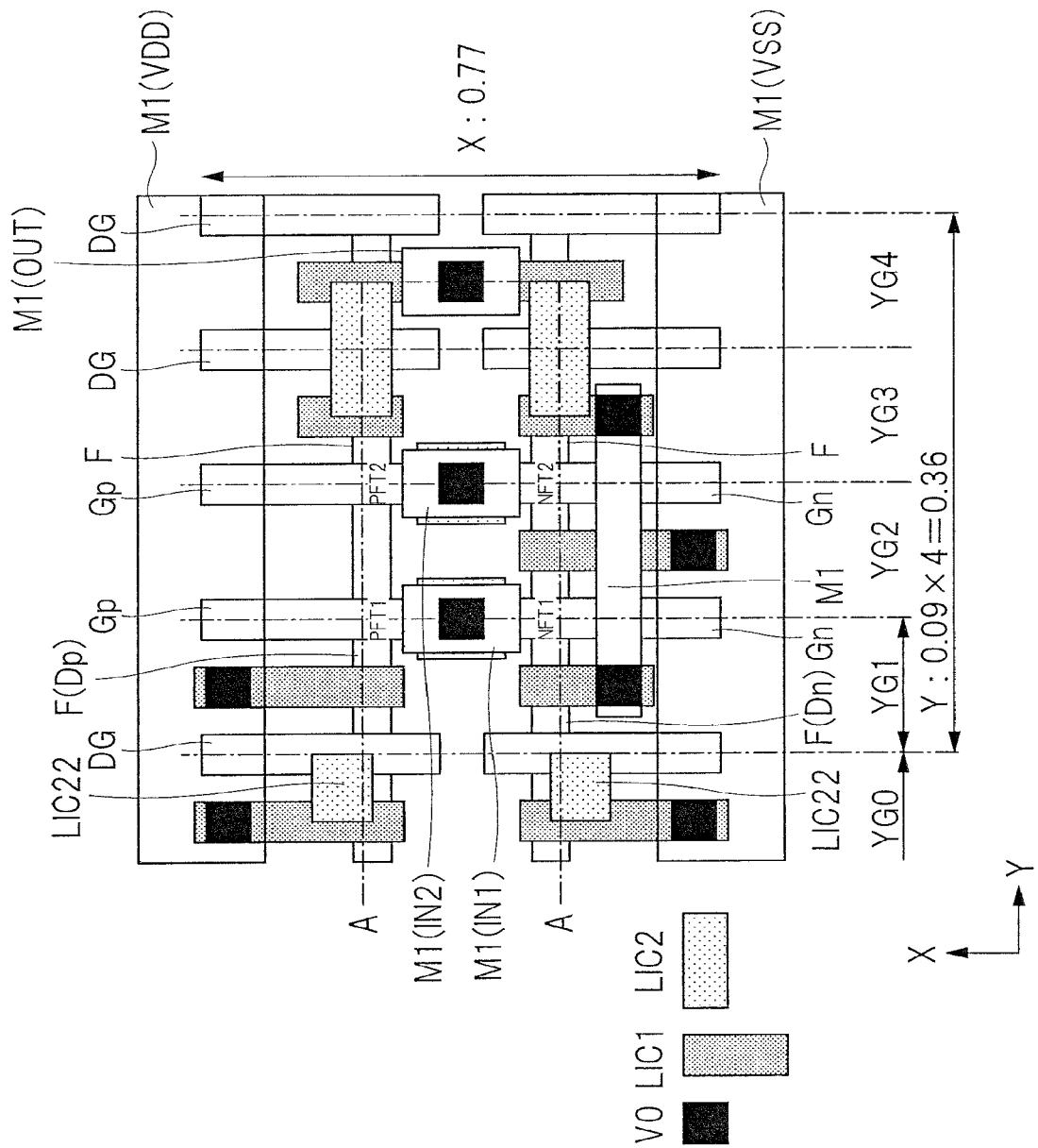
FIG. 49 is a plan view showing a layout of a semiconductor device of a second application example of the sixth embodiment.

In the semiconductor device of the first application example, the fins F are arranged so as to cross the gate electrodes GE only (see FIG. 43). However, the fins F may be continuously arranged in the Y direction in the region for forming the unit cell without being divided (see FIG. 49). In this case, the fin F passes through a portion below each of the dummy gates DG located on both sides of two gate electrodes GE, and extends to the adjacent Y grid (such as the first, fourth, and fifth dummy gates DG counted from the left in FIG. 49). FIG. 49 is a plan view showing a layout of the semiconductor device of the present application example.

In the present application example, the dummy transistors described in the third embodiment are formed. For example, in FIG. 49, the p-channel dummy transistor (DPT) is formed in a left-end upper-half region of the unit cell. And, the n-channel dummy transistor (DNT) is formed in a left-end lower-half region of the unit cell.

Also in the present application example, as similar to the second application example of the fifth embodiment, the potential of the dummy gate DG of the dummy transistor is fixed to the source potential (VDD) or ground potential (VSS) (see FIG. 44).

That is, in the p-channel dummy transistor (DPT), the dummy gate DG and the local interconnect LIC1 connected to the source potential (VDD) are connected through the local interconnect LIC22, so that the potential of the dummy gate DG can be fixed to the source potential (VDD). Also, in the n-channel dummy transistor (DNT), the dummy gate DG and the local interconnect LIC1 connected to the ground potential (VSS) are connected through the local interconnect LIC22, so that the potential of the dummy gate DG can be fixed to the ground potential (VSS). In this manner, these dummy transistors (DPT, DNT) are not turned to ON, and the influence on the circuit operations can be avoided (see the left end of FIG. 49).

Although not shown in FIG. 49, the potential of the dummy gate DG can be fixed to the source potential (VDD) or the ground potential (VSS) also in the p-channel dummy transistor (DPT) in a right-end upper-half region of the unit cell and the n-channel dummy transistor (DNT) in a right-end lower-half region of the unit cell as similar to the above-described cases.

The second p-channel dummy transistor (DPT) counted from the right end of the unit cell shown in FIG. 49 is not turned to ON because no potential difference (between the source and the drain) is generated in the impurity region in the fin F on both sides, and therefore, there is no problem on the circuit operations. Similarly, the second n-channel dummy transistor (DNT) counted from the right end of the unit cell shown in FIG. 49 is not turned to ON because no potential difference (between the source and the drain) is generated in the impurity region in the fin F on both sides, and therefore, there is no problem on the circuit operations.

Also in the present application example, the forming area (cell area) of the semiconductor device can be reduced. And, the integration degree of the semiconductor element (FINFET) can be increased.

By largely extending the fins F in the Y direction, the mobility of carriers is improved because of a strain effect. Also, the ON current can be increased by the improvement.

Note that the semiconductor device of the present embodiment is different from the semiconductor device of the first embodiment in the planar shape of each component (F, GE, DG, LIC1, LIC2, and M1). However, this can be manufactured by processes almost the same as the processes in the first embodiment.

Seventh Embodiment

In the fifth embodiment, the substantial U-shaped local interconnect LIC is used as the output portion of the two-input NAND. However, the above-described local interconnect LIC may be used as an output portion of a four-input NAND.

Figure 50:
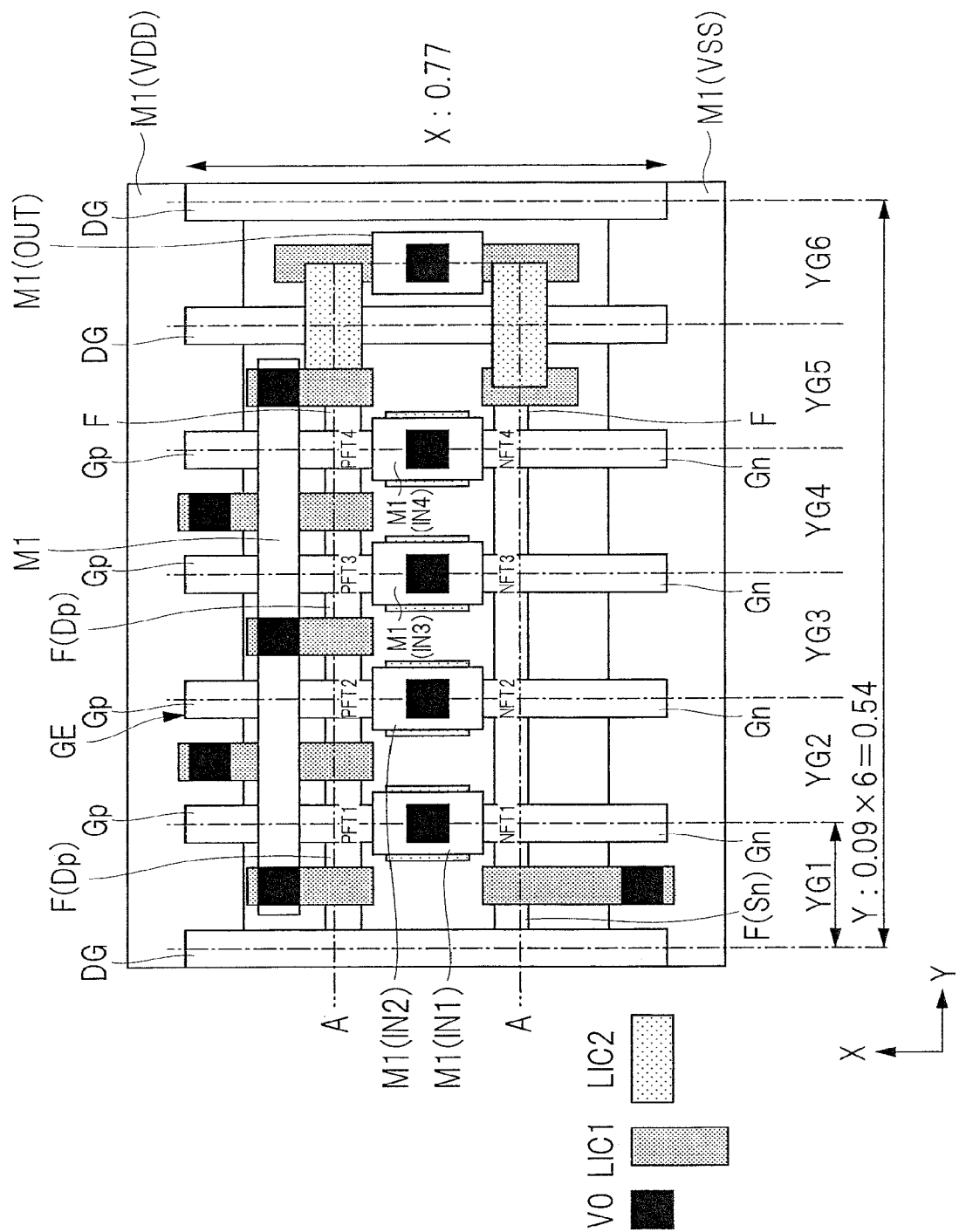
FIG. 50 is a plan view showing a configuration of a semiconductor device according to a seventh embodiment.
Figure 51:
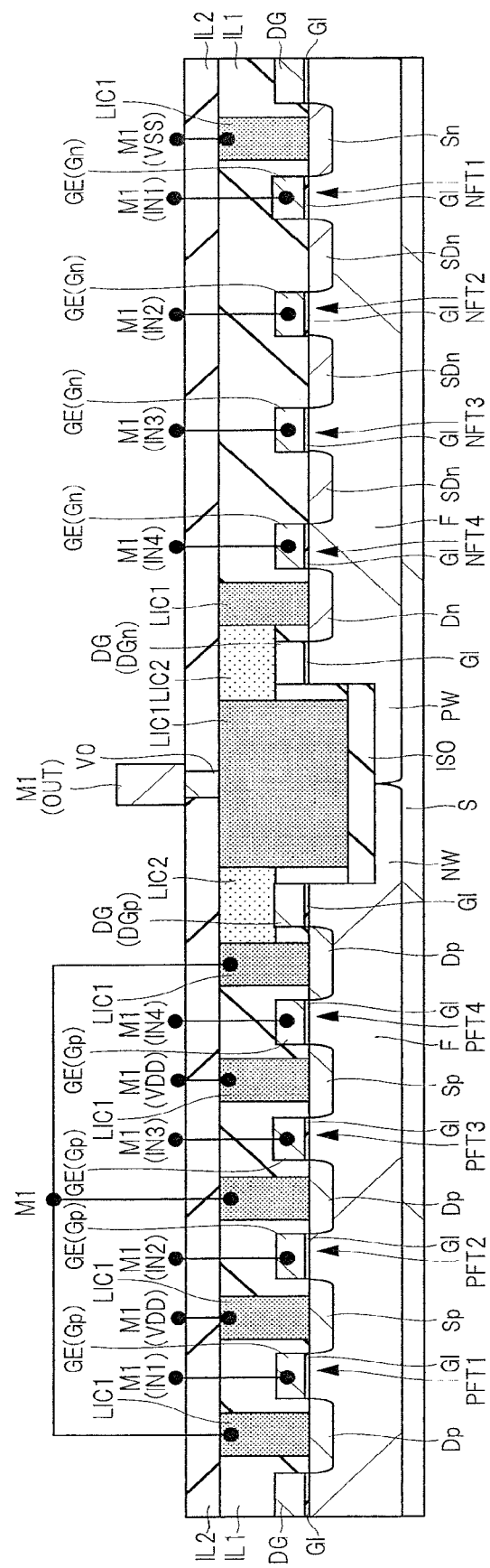
FIG. 51 is a cross-sectional view showing the configuration of the semiconductor device according to the seventh embodiment.
Figure 52:
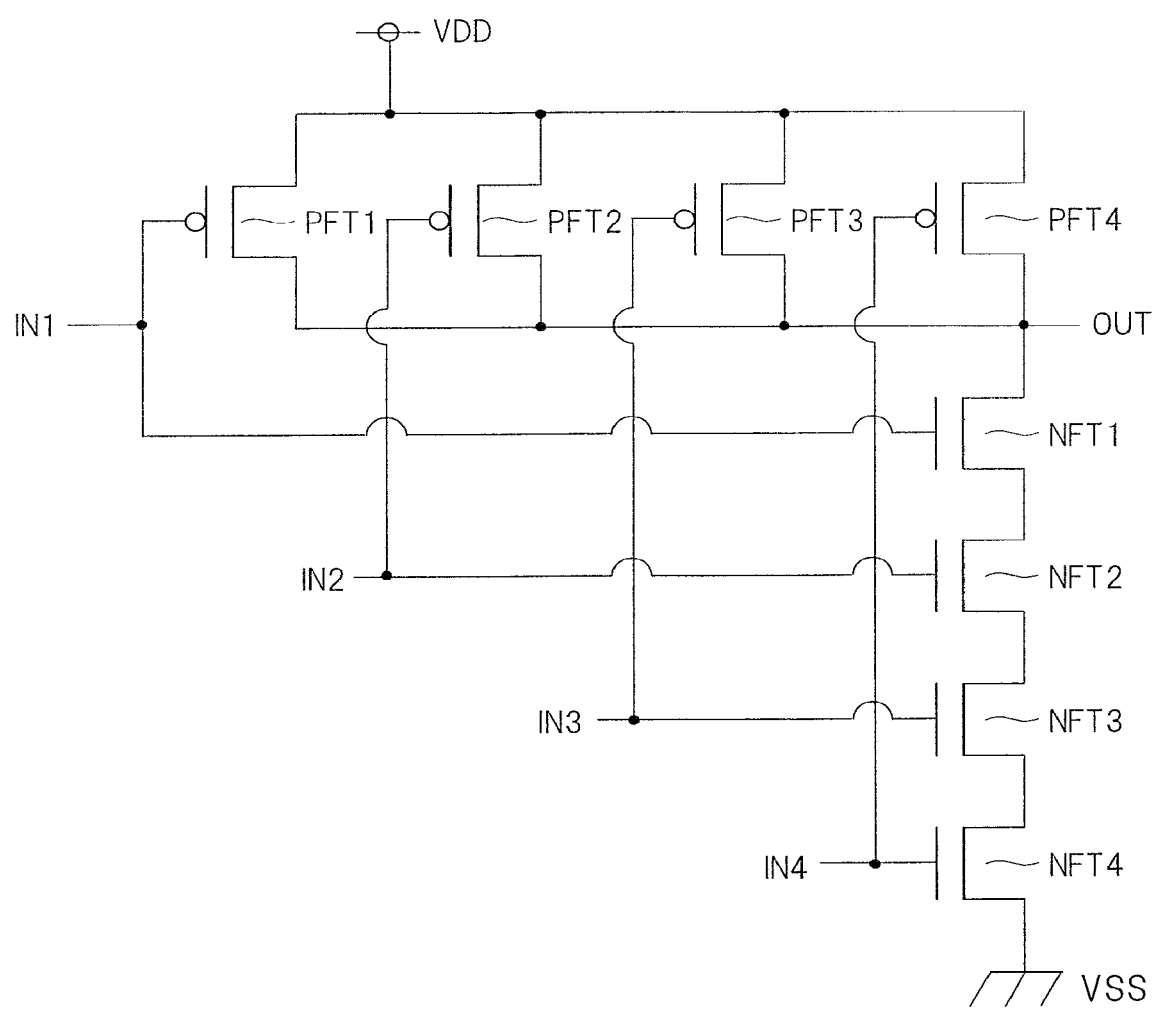
FIG. 52 is a circuit diagram showing the configuration of the semiconductor device according to the seventh embodiment.

FIG. 50 is a plan view showing a configuration of a semiconductor device according to the present embodiment. FIG. 51 is a cross-sectional view showing the configuration of the semiconductor device according to the present embodiment. The cross-sectional view of FIG. 51 corresponds to, for example, across section taken along a line A-A of the plan view of FIG. 50. FIG. 52 is a circuit diagram showing the configuration of the semiconductor device according to the present embodiment.

The plan view of FIG. 50 shows a plan layout of each component of four p-channel FINFETs (PFT1 to PFT4) and four n-channel FINFETs (NFT1 to NFT4) that make up a four-input NAND. In the present embodiment, a region for forming the four-input NAND is described as the unit cell. The cross-sectional view of FIG. 51 shows a cross section formed by the four p-channel FINFETs (PFT1 to PFT4) and the four n-channel FINFETs (NFT1 to NFT4) that make up the four-input NAND. In the four-input NAND, as shown in FIG. 52, the four p-channel FINFETs (PFT1 to PFT4) are connected in parallel between the source potential (VDD) and the output portion OUT, while the four n-channel FINFETs (NFT1 to NFT4) are connected in series between the ground potential (VSS) and the output portion OUT. And, a gate electrode of a pair of the p-channel FINFET (PFT1) and the n-channel FINFET (NFT1) becomes an input portion (IN1), and a gate electrode of a pair of the p-channel FINFET (PFT2) and the n-channel FINFET (NFT2) becomes an input portion (IN2). Similarly, a gate electrode of a pair of the p-channel FINFET (PFT3) and the n-channel FINFET (NFT3) becomes an input portion (IN3), and a gate electrode of a pair of the p-channel FINFET (PFT4) and the n-channel FINFET (NFT4) becomes an input portion (IN4).

The planar shape (shape or cell layout in a plan view from above) of each component of the semiconductor device of the present embodiment will be described with reference to FIG. 50.

As shown in FIG. 50, the planar shape of each fin F is a linear shape having a certain width (length in the X direction) (a rectangular shape with long sides extending in the Y direction). In FIG. 50, two fins F are arranged in the X direction at a certain interval (pitch).

As shown in FIG. 50, the planar shape of each gate electrode GE is a linear shape having a certain width (length in the Y direction) (a rectangular shape with long sides extending in the X direction). As described above, the gate electrode GE extends in a direction of crossing the fins F. Here, in addition to the gates GE extending in the direction of crossing the fins F, the dummy gates DG are also provided. Each dummy gate DG has the same configuration as that of the gate electrode GE. That is, the dummy gate DG also has a linear shape having a certain width (length in the Y direction) (a rectangular shape with long sides extending in the X direction). In FIG. 50, seven of gate electrodes GE and dummy gates DG are arranged at a certain interval (interval in the Y direction, the minimum pitch in the Y direction, a grid). By arranging the dummy gates DG as described above, the pattern regularity can be secured, and the variation in the manufacturing or others can be reduced.

Here, the area (Y grid) between the gate electrode GE and the dummy gate DG is denoted as "YG". For example, in FIG. 50, the Y girds YG1 to YG6 are arranged sequentially from left.

Four gate electrodes GE (Gn, Gp) extend in the direction of crossing the fins F. The gate electrode GE is made of a conductive film extending integrally in the X direction. However, in the region for forming the p-channel FINFET (PFT), the gate electrode GE in this region is denoted as the gate electrode Gp because a p-type impurity is introduced thereto. Also, in the region for forming the n-channel FINFET (NFT), the gate electrode GE in this region is denoted as the gate electrode Gn because an n-type impurity is introduced thereto. The gate electrode GE is made up by these gate electrodes Gp and Gn.

Here, the above-described interval in the Y direction (width in the Y direction of the Y grid) is the reference for determining the length of the unit cell in the Y direction. For example, when the interval in the Y direction is 0.09 μm, the length of the unit cell in the Y direction is determined to be 0.09×6=0.54 μm. Here, when the length thereof in the X direction is 0.77 μm, the cell area of the unit cell shown in FIG. 50 is 0.4158 μm².

The source region Sp and the drain region Dp are formed in the fin F on both sides of the gate electrode GE (Gp). Also, the source region Sn and the drain region Dn are formed in the fin F on both sides of the gate electrode GE (Gn). Note that the fin F and the gate electrode GE overlap with each other through the gate insulating film (GI) (see FIG. 51). More specifically, the gate insulating film (GI) is arranged on the side surfaces and front surface of the fin F in the overlap region between the fin F and the gate electrode GE.

As shown in FIG. 50, the planar shape of each local interconnect (LIC1, LIC2) is a rectangular shape with long sides extending in the X direction or a rectangular shape with long sides extending in the Y direction. The local interconnect (LIC1, LIC2) is formed by burying a conductive film in a trench formed in the interlayer insulating film (IL1). When the trench is formed, a processed photoresist film is used as a mask. When the photoresist film is processed (exposed to light), a rectangular pattern with long sides extending in the X direction and a rectangular pattern with long sides extending in the Y direction are transferred individually. According to such processing, even a fine pattern can be formed with high accuracy.

The drain regions (Dp, Dn) of one pair of the p-channel FINFET (PFT4) and n-channel FINFET (NFT4) making up the four-input NAND are connected by the local interconnect (LIC1, LIC2). This pair of the p-channel FINFET (PFT4) and n-channel FINFET (NFT4) has the fifth gate electrode GE counted from the left end of the unit cell.

The drain region (Dp) of the p-channel FINFET (PFT4) is extracted by the local interconnect LIC1. This local interconnect LIC1 is connected to a local interconnect LIC1 connected to the output portion (OUT) through a local interconnect LIC2 crossing the dummy gate DG. The drain region (Dn) of the n-channel FINFET (NFT4) is extracted by the local interconnect LIC1. This local interconnect LIC1 is connected to a local interconnect LIC1 connected to the output portion (OUT) through a local interconnect LIC2 crossing the dummy gate DG. As described above, in FIG. 50, the drain regions (Dp, Dn) are connected by five local interconnects (LIC1, LIC2). These five local interconnects (LIC1, LIC2) form a substantial U shape.

Common source regions Sp shared among the four p-channel FINFETs (PFT1 to PFT4) shown in FIG. 50 are connected to local interconnects LIC1. These interconnects LIC1 are connected to a wiring M1 (VDD) to which the source potential (VDD) is applied through vias V0. Each of the drain regions Dp of the four p-channel FINFETs (PFT1 to PFT4) is extracted by the local interconnect LIC1. These three local interconnects LIC1 are connected by a wiring M1 through vias V0.

A source region Sn of the left-end n-channel FINFET (NFT1) of four n-channel FINFETs (NFT1 to NFT4) shown in FIG. 50 is connected to a local interconnect LIC1. This local interconnect LIC1 is connected to a wiring M1 (VSS) connected to the ground potential (VSS) through a via V0 (see FIG. 51). Note that common source/drain regions shared between the n-channel FINFETs shown in FIGS. 50 and 51 are denoted as "SDn".

As described above, even when the local interconnect LIC is used as the output portion of the four-input NAND, the forming area (cell area) of the semiconductor device can be reduced. And, the integration degree of the semiconductor element (FINFET) can be increased.

In the semiconductor device of the present aspect (FIG. 50), the fins F may be arranged so as to cross the gate electrodes GE only as similar to the first application example of the fifth embodiment. Also in the semiconductor device of the present aspect (FIG. 50), the fins F may be continuously arranged in the Y direction in the region for forming the unit cell without being divided. In this case, as similar to the second application example of the fifth embodiment, the potential of the dummy gate DG of the p-channel dummy transistor (DPT) and n-channel dummy transistor (DNT) may be fixed to the source potential (VDD) or the ground potential (VSS). In this manner, the influence of these dummy transistors (DPT, DNT) on the circuit operations can be avoided.

Eighth Embodiment

In the sixth embodiment, the substantial U-shaped local interconnect LIC is used as the output portion of the two-input NOR. However, the above-described local interconnect LIC may be used as an output portion of a four-input NOR.

Figure 53:
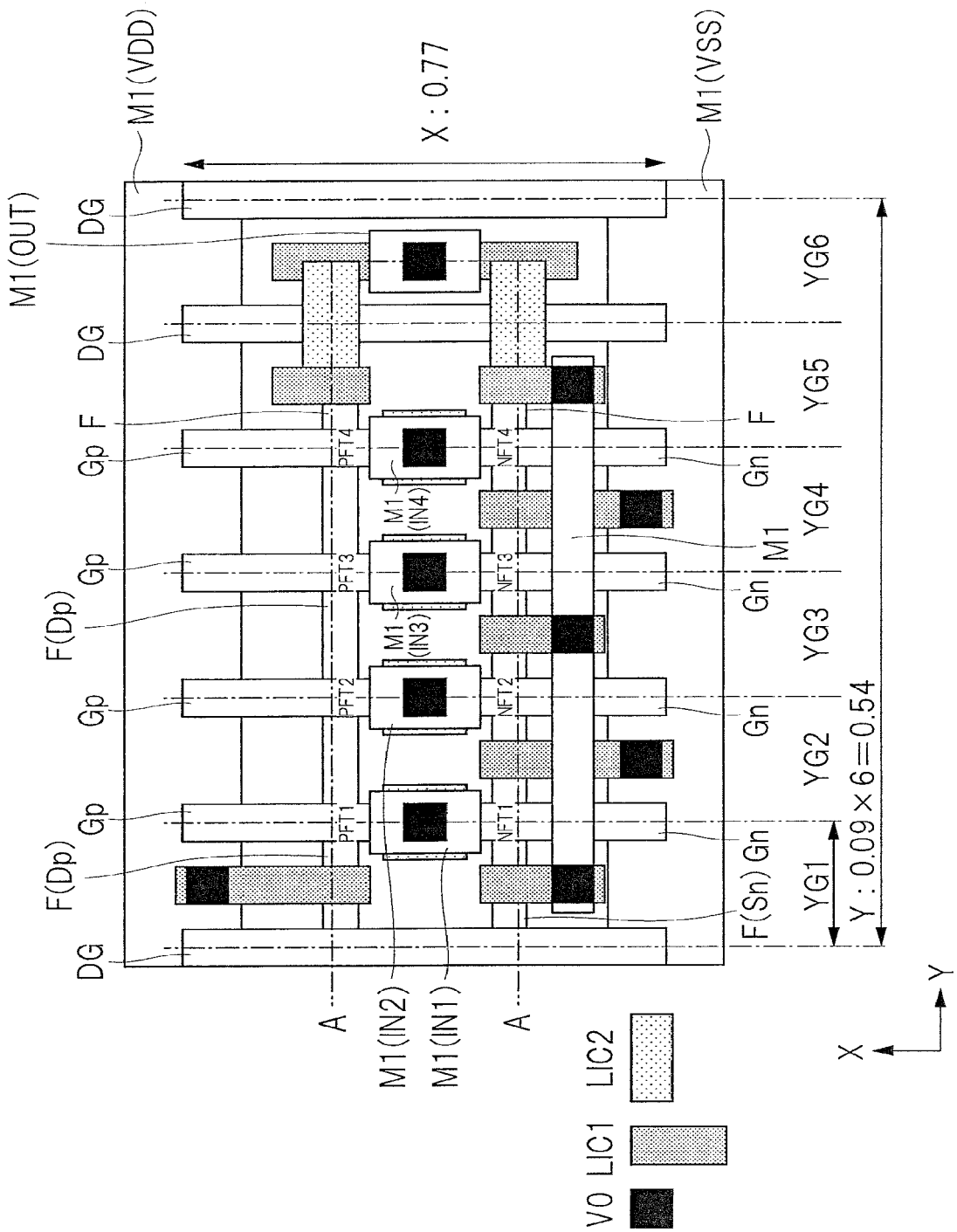
FIG. 53 is a plan view showing a configuration of a semiconductor device according to an eighth embodiment.
Figure 54:
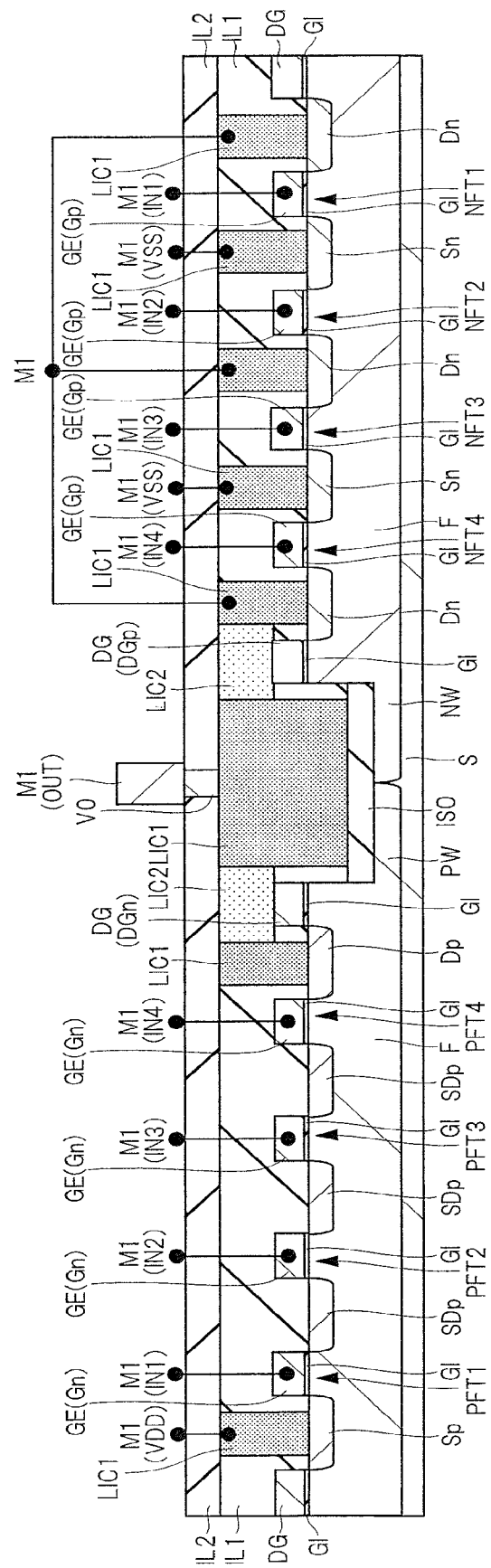
FIG. 54 is a cross-sectional view showing the configuration of the semiconductor device according to the eighth embodiment.
Figure 55:
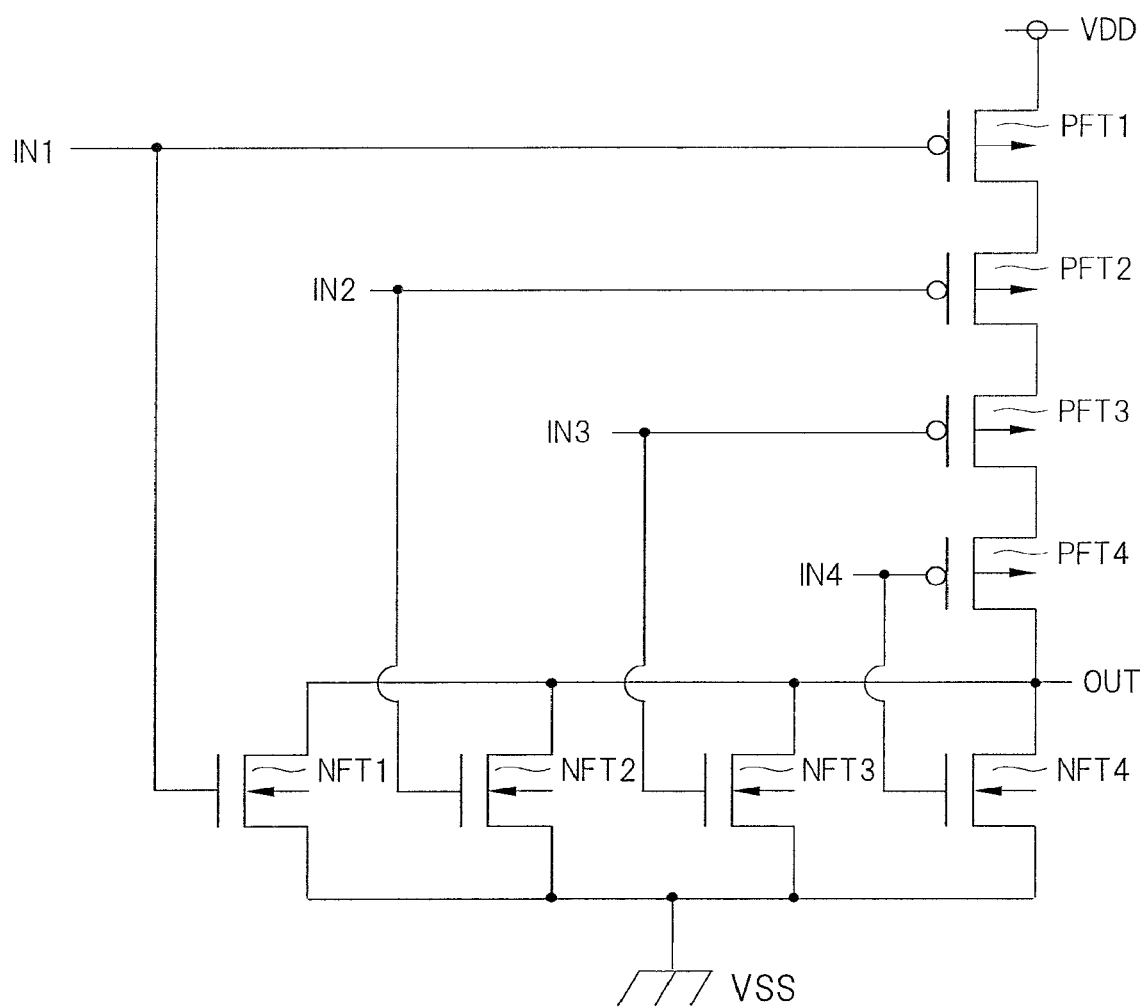
FIG. 55 is a circuit diagram showing the configuration of the semiconductor device according to the eighth embodiment.

FIG. 53 is a plan view showing a configuration of a semiconductor device according to the present embodiment. FIG. 54 is a cross-sectional view showing the configuration of the semiconductor device according to the present embodiment. The cross-sectional view of FIG. 54 corresponds to, for example, a cross section taken along a line A-A of the plan view of FIG. 53. FIG. 55 is a circuit diagram showing the configuration of the semiconductor device according to the present embodiment.

The plan view of FIG. 53 shows a plan layout of each component of four p-channel FINFETs (PFT1 to PFT4) and four n-channel FINFETs (NFT1 to NFT4) that make up a four-input NOR. In the present embodiment, a region for forming the four-input NOR is described as the unit cell. The cross-sectional view of FIG. 54 shows a section formed by the four p-channel FINFETs (PFT1 to PFT4) and four n-channel FINFETs (NFT1 to NFT4) that make up the four-input NOR. As shown in FIG. 55, in the four-input NOR, the four p-channel FINFETs (PFT1 to PFT4) are connected in series between the source potential (VDD) and the output portion OUT, while the four n-channel FINFETs (NFT1 to NFT4) are connected in parallel between the ground potential (VSS) and the output portion OUT. A gate electrode of a pair of the p-channel FINFET (PFT1) and the n-channel FINFET (NFT1) becomes the input portion (IN1), and a gate electrode of a pair of the p-channel FINFET (PFT2) and the n-channel FINFET (NFT2) becomes the input portion (IN2). Similarly, a gate electrode of a pair of the p-channel FINFET (PFT3) and the n-channel FINFET (NFT3) becomes the input portion (IN3), and a gate electrode of a pair of the p-channel FINFET (PFT4) and the n-channel FINFET (NFT4) becomes the input portion (IN4).

The planar shape (shape or cell layout in a plan view from above) of each component of the semiconductor device of the present embodiment will be described with reference to FIG. 53.

As shown in FIG. 53, the planar shape of each fin F is a linear shape having a certain width (length in the X direction) (a rectangular shape with long sides extending in the Y direction). In FIG. 53, two fins F are arranged in the X direction at a certain interval (pitch).

As shown in FIG. 53, the planar shape of each gate electrode GE is a linear shape having a certain width (length in the Y direction) (a rectangular shape with long sides extending in the X direction). In this manner, the gate electrode GE extends in a direction of crossing the fins F. Here, in addition to the gate electrodes GE extending in the direction of crossing the fins F, the dummy gates DG are also provided. Each dummy gate DG has the same configuration as that of the gate electrode GE. That is, the dummy gate DG also has a linear shape having a certain width (length in the Y direction) (a rectangular shape with long sides extending in the X direction). In FIG. 53, seven of the gate electrodes GE and dummy gates DG are arranged at a certain interval (interval in the Y direction, the minimum pitch in the Y direction, a grid). By arranging the dummy gates DG as described above, the pattern regularity can be secured, and the variation in the manufacturing or others can be reduced.

Here, the area (Y grid) between the gate electrode GE and the dummy gate DG is denoted as "YG". In FIG. 53, for example, the Y girds YG1 to YG6 are arranged sequentially from left.

Two gate electrodes GE (Gn, Gp) extend in the direction of crossing the fins F. The gate electrode GE is made of a conductive film extending integrally in the X direction. However, in the region for forming the p-channel FINFET (PFT), the gate electrode GE in this region is denoted as the gate electrode Gp because a p-type impurity is introduced thereto. Also, in the region for forming the n-channel FINFET (NFT), the gate electrode GE in this region is denoted as the gate electrode Gn because an n-type impurity is introduced thereto. The gate electrode GE is made up by the gate electrodes Gp and Gn.

Here, the above-described interval in the Y direction (width in the Y direction of the Y grid) is the reference for determining the length of the unit cell in the Y direction. For example, when the interval in the Y direction is 0.09 μm, the length of the unit cell in the Y direction is determined to be 0.09×6=0.54 μm. Here, when the length thereof in the X direction is 0.77 μm, the cell area of the unit cell of FIG. 53 is 0.4158 μm$^2$.

The source region Sp and the drain region Dp are formed in the fin F on both sides of the gate electrode GE (Gp). Also, the source region Sn and the drain region Dn are formed in the fin F on both sides of the gate electrode GE (Gn). Note that the fin F and the gate electrode GE overlap with each other through the gate insulating film (GI) (see FIG. 54). More specifically, the gate insulating film (GI) is arranged on the side surfaces and the front surface of the fin F in the overlap region between the fin F and the gate electrode GE.

As shown in FIG. 53, the planar shape of each local interconnect (LIC1, LIC2) is a rectangular shape with long sides extending in the X direction or a rectangular shape with long sides extending in the Y direction. The local interconnect (LIC1, LIC2) is formed by burying a conductive film in a trench formed in the interlayer insulating film (IL1). When the trench is formed, a processed photoresist film is used as a mask. When the photoresist film is processed (exposed to light), a rectangular pattern with long sides extending in the X direction and a rectangular pattern with long sides extending in the Y direction are transferred individually. According to such processing, even a fine pattern can be formed with high accuracy.

The drain regions (Dp, Dn) of one pair of the p-channel FINFET (PFT4) and n-channel FINFET (NFT4) making up the four-input NOR are connected by the local interconnect (LIC1, LIC2). This pair of the p-channel FINFET (PFT4) and n-channel FINFET (NFT4) has the fifth gate electrode GE counted from the left end of the unit cell.

The drain region (Dp) of the p-channel FINFET (PFT4) is extracted by a local interconnect LIC1. This local interconnect LIC1 is connected to a local interconnect LIC1 connected to the output portion (OUT) through a local interconnect LIC2 crossing the dummy gate DG. Also, the drain region (Dn) of the n-channel FINFET (NFT4) is extracted by a local interconnect LIC1. This local interconnect LIC1 is connected to the above local interconnect LIC1 connected to the output portion (OUT) through a local interconnect LIC2 crossing the dummy gate DG. As described above, in FIG. 54, the drain regions (Dp, Dn) are connected by five local interconnects (LIC1, LIC2). These five local interconnects (LIC1, LIC2) form a substantial U shape.

Common source regions Sn shared between four n-channel FINFETs (NFT1 to NFT4) shown in FIG. 53 are connected to local interconnects LIC1. These interconnect LIC1 are connected to a wiring M1 (VSS) to which the ground potential (VSS) is applied through vias V0. Each drain region Dn of the four n-channel FINFETs (NFT1 to NFT4) are extracted by the local interconnect LIC1. These three local interconnects LIC1 are connected by a wiring M1 through vias V0.

A source region Sp of the left-end p-channel FINFET (PFT1) of four p-channel FINFETs (PFT1 to PFT4) shown in FIG. 53 is connected to a local interconnect LIC1. This local interconnect LIC1 is connected to a wiring M1 (VDD) connected to the source potential (VDD) through a via V0 (see FIG. 54). Note that common source/drain regions shared among four p-channel FINFETs (PFT1 to PFT4) shown in FIGS. 53 and 54 are denoted as "SDp".

Also, even when the local interconnect LIC is used as the output portion of the four-input NOR, the forming area (cell area) of the semiconductor device can be reduced. And, the integration degree of the semiconductor element (FINFET) can be increased.

In the semiconductor device of the present aspect (FIG. 53), the fins F may be arranged so as to cross the gate electrodes GE only as similar to the first application example of the sixth embodiment. In the semiconductor device of the present aspect (FIG. 53), the fins F may be continuously arranged in the Y direction in the region for forming the unit cell without being divided. In this case, as similar to the second application example of the sixth embodiment, the potential of the dummy gate DG of the p-channel dummy transistor (DPT) and n-channel dummy transistor (DNT) may be fixed to the source potential (VDD) or the ground potential (VSS). In this manner, the influence of these dummy transistors (DPT, DNT) on the circuit operations can be avoided.

In the above-described embodiments, the impurity regions in the fin are described as the drain region, the source region and others. However, these regions may be treated as one end (first electrode, electrode) of a transistor and the other end thereof (second electrode, electrode).

Also, as described above, the dummy gate described above in the embodiments is an electrode that is not turned to ON. In other words, the dummy gate is an electrode that cannot be turned to ON and OFF. In still other words, the dummy gate is an electrode not having a channel formed therebelow.

In the foregoing, the invention made by the present inventors has been concretely described based on the embodiments. However, it is needless to say that the present invention is not limited to the foregoing embodiments and various modifications and alterations can be made within the scope of the present invention.

For example, in the fourth embodiment, the circuit having two inverters (such as a flip-flop circuit) has been exemplified. However, a substantial U-shaped local interconnect or a substantial U-shaped wiring may be applied to a circuit having three or more inverters. In the fifth to eighth embodiments, the two-input and four-input circuits (NAND and NOR) have been exemplified. However, the number of inputs is not limited, and the substantial U-shaped local interconnect may be applied to an output portion of a circuit having the different number in the inputs. Also, it is needless to say that the above-described local interconnect, etc., can be applied to other logic circuits within the scope of the present invention.

[Additional Note 1]

A semiconductor device includes: a rectangular parallelepiped first fin extending in a first direction; a rectangular parallelepiped second fin arranged to be separated from the first fin and extending in the first direction; a gate electrode arranged on the first and second fins through a gate insulating film and extending in a second direction crossing the first direction; a first electrode of a first transistor formed in the first fin positioned on one side of the gate electrode; a second electrode of the first transistor formed in the first fin positioned on the other side of the gate electrode; a first electrode of a second transistor formed in the second fin positioned on the one side of the gate electrode; a second electrode of the second transistor formed in the second fin positioned on the other side of the gate electrode; and a first local wiring for connecting the first electrode of the first transistor and the first electrode of the second transistor. The first local wiring is made of a conductive film buried in an interlayer insulating film covering the gate electrode.

[Additional Note 2]

In the semiconductor device described in the additional note 1, the semiconductor device further includes a third transistor and a fourth transistor. A first electrode of the third transistor and a first electrode of the fourth transistor are connected by a wiring formed in a wiring layer different from that of the local wiring, and the second electrode of the first transistor serves also as a second electrode of the third transistor, and the second electrode of the first transistor is connected to a wiring to which a source potential is applied.

[Additional Note 3]

In the semiconductor device described in the additional note 2, the second electrode of the second transistor serves also as a second electrode of the fourth transistor, and the second electrode of the second transistor is connected to a wiring to which a ground potential is applied.

[Additional Note 4]

In the semiconductor device described in the additional note 1, the semiconductor device further includes a third transistor and a fourth transistor, the second electrode of the first transistor is connected to one electrode of the third transistor, and the second electrode of the second transistor is connected to one electrode of the fourth transistor.

[Additional Note 5]

In the semiconductor device described in the additional note 1, the semiconductor device further includes a third transistor and a fourth transistor, a first electrode of the third transistor is connected to the local wiring, and the second electrode of the first transistor is connected to a wiring to which a source potential is applied.

[Additional Note 6]

In the semiconductor device described in the additional note 5, a second electrode of the fourth transistor is connected to a wiring to which a ground potential is applied.

[Additional Note 7]

In the semiconductor device described in the sixth additional note, the second electrode of the first transistor serves also as a second electrode of the third transistor, and the second electrode of the second transistor serves also as a first electrode of the fourth transistor.

[Additional Note 8]

In the semiconductor device described in the additional note 1, the semiconductor device further includes a third transistor and a fourth transistor, the first electrode of the fourth transistor is connected to the local wiring, and the second electrode of the second transistor is connected to a wiring to which a source potential is applied.

[Additional Note 9]

In the semiconductor device described in the additional note 8, a second electrode of the third transistor is connected to a wiring to which a source potential is applied.

[Additional Note 10]

In the semiconductor device described in the ninth additional note, the second electrode of the second transistor serves also as a second electrode of the fourth transistor, and the second electrode of the first transistor serves also as a first electrode of the third transistor.

What is claimed is:

1. A semiconductor device comprising:
    a rectangular parallelepiped first fin extending in a first direction;
    a rectangular parallelepiped second fin arranged to be separated from the first fin and extending in the first direction;
    a gate electrode arranged on the first fin and the second fin through a gate insulating film and extending in a second direction crossing the first direction;
    a first electrode of a first transistor formed in the first fin positioned on one side of the gate electrode;
    a second electrode of the first transistor formed in the first fin positioned on the other side of the gate electrode;
    a first electrode of a second transistor formed in the second fin positioned on one side of the gate electrode;
    a second electrode of the second transistor formed in the second fin positioned on the other side of the gate electrode;
    a first local wiring for connecting the first electrode of the first transistor and the first electrode of the second transistor; and
    a dummy gate separate from the gate electrode and extending in the second direction,
    wherein the first local wiring is made of a conductive film buried in an interlayer insulating film covering the gate electrode,
    wherein the first local wiring includes:
        a first portion extending in the first direction and electrically connected to the first electrode of the first transistor;
        a second portion extending in the first direction and electrically connected to the first electrode of the second transistor; and
        a third portion extending in the second direction and connecting the first portion and the second portion,
    wherein the dummy gate is positioned below the first portion and the second portion,
    wherein the gate electrode, the first electrode of the first transistor, and the second electrode of the first transistor which are formed in the first fin, and constitute the first transistor,
    wherein the gate electrode, the first electrode of the second transistor, and the second electrode of the second transistor which are formed in the second fin, and constitute the second transistor,
    wherein the first transistor and the second transistor constitute an inverter,
    wherein the gate electrode is an input portion of the inverter, and the third portion is an output portion of the inverter, and
    wherein the output portion of the inverter is connected to an output wiring formed on the interlayer insulating film through a via penetrating the interlayer insulating film.

2. The semiconductor device according to claim 1, further comprising a first wiring formed above the interlayer insulating film,
    wherein the first local wiring is positioned in a lower layer than the first wiring.

3. The semiconductor device according to claim 1,
    wherein the first local wiring includes:
        a fourth portion extending in the second direction and connected between the first electrode of the first transistor and the first portion, wherein the electrical connection between the first portion and the first electrode of the first transistor is made through the fourth portion; and
        a fifth portion extending in the second direction and connected between the first electrode of the second transistor and the second portion, wherein the electrical connection between the second portion and the first electrode of the second transistor is made through the fifth portion.

4. The semiconductor device according to claim 1, further comprising:
    a first grid which is a region between the gate electrode and the dummy gate; and
    a second grid which is a region positioned to be on the opposite side of the dummy gate from the gate electrode,
    wherein the third portion is arranged in the second grid.

5. The semiconductor device according to claim 1, further comprising a second local wiring extending in the second direction and connected to the second electrode (Sp) of the first transistor (PFT),
    wherein the second local wiring is connected to a wiring configured to be connected to a source potential (VSS).

6. The semiconductor device according to claim 5, further comprising a third local wiring extending in the second direction and connected to the second electrode (Sn) of the second transistor (NFT),
    wherein the third local wiring is connected to a wiring configured to be connected to a reference potential (VDD).

7. The semiconductor device according to claim 4,
    wherein the first fin and the second fin are arranged on the first grid but are not arranged below the dummy gate (DG).

8. The semiconductor device according to claim 4,
    wherein the first fin and the second fin are arranged so as to extend to a portion below the dummy gate (DG) but are not formed on the second grid.

9. The semiconductor device according to claim 4,
    wherein the first fin and the second fin passes through a portion below the dummy gate (DG) so as to be arranged also on the second grid.

10. The semiconductor device according to claim 4, further comprising:
    a rectangular parallelepiped third fin extending in the first direction;
    a different gate electrode arranged on the third fin through a gate insulating film and extending in the second direction;
    a first electrode of a third transistor, the first electrode being formed in the third fin positioned on one side of the different gate electrode; and
    a second electrode of the third transistor, the second electrode being formed in the third fin positioned on the other side of the different gate electrode.

11. The semiconductor device according to claim 10, further comprising:

a rectangular parallelepiped fourth fin arranged to be separated from the third fin and extending in the first direction;

the different gate electrode arranged on the third fin and the fourth fin through a gate insulating film and extending in the second direction;

a first electrode of a fourth transistor, the first electrode being formed in the fourth fin positioned on one side of the different gate electrode; and a second electrode of the fourth transistor, the second electrode being formed in the fourth fin positioned on the other side of the different gate electrode.

12. The semiconductor device according to claim 11, wherein the second electrode of the third transistor is connected to a wiring configured to be connected to a source potential, and the second electrode of the fourth transistor is connected to a wiring configured to be connected to a reference potential.

13. The semiconductor device according to claim 9, further comprising:

a different gate electrode arranged to be separated from the dummy gate and extending in the second direction, the different gate electrode being arranged on the first fin and the second fin through a gate insulating film;

a first electrode of a third transistor, the first electrode being formed in the first fin positioned on one side of the different gate electrode;

a second electrode of the third transistor, the second electrode being formed in the first fin positioned on the other side of the different gate electrode;

a first electrode of a fourth transistor, the first electrode being formed in the second fin positioned on the one side of the different gate electrode; and a second electrode of the fourth transistor, the second electrode being formed in the second fin positioned on the other side of the different gate electrode.

14. The semiconductor device according to claim 13, further comprising:

a fourth local wiring extending in the second direction and connected to the second electrode of the third transistor; and a fifth local wiring extending in the second direction and connected to the second electrode of the fourth transistor, wherein the fourth local wiring is connected to a wiring configured to be connected to a source potential, and the fifth local wiring is connected to a wiring configured to be connected to a reference potential.

15. The semiconductor device according to claim 14, further comprising:

a different dummy gate extending in the second direction between the dummy gate and the different gate electrode;

a sixth local wiring connecting a source region of the third transistor and the different dummy gate; and a seventh local wiring connecting the source region of the third transistor and the different dummy gate.

* * * * *